(12) United States Patent
Shiratori et al.

(10) Patent No.: US 12,161,043 B2
(45) Date of Patent: Dec. 3, 2024

(54) LIGHT EMITTING DEVICE

(71) Applicant: Sumitomo Chemical Company, Limited, Tokyo (JP)

(72) Inventors: Mio Shiratori, Tsukuba (JP); Nobuhiko Akino, Koshigaya (JP); Daisuke Fukushima, Tsukuba (JP)

(73) Assignee: SUMITOMO CHEMICAL COMPANY, Tokyo (JP)

( * ) Notice: Subject to any disclaimer, the term of this patent is extended or adjusted under 35 U.S.C. 154(b) by 743 days.

(21) Appl. No.: 17/431,932

(22) PCT Filed: Dec. 19, 2019

(86) PCT No.: PCT/JP2019/049783
§ 371 (c)(1),
(2) Date: Aug. 18, 2021

(87) PCT Pub. No.: WO2020/174837
PCT Pub. Date: Sep. 3, 2020

(65) Prior Publication Data
US 2021/0391542 A1    Dec. 16, 2021

(30) Foreign Application Priority Data

Feb. 26, 2019 (JP) .................................. 2019-033281

(51) Int. Cl.
*H01L 51/50* (2006.01)
*H10K 85/10* (2023.01)
(Continued)

(52) U.S. Cl.
CPC ......... *H10K 85/111* (2023.02); *H10K 85/342* (2023.02); *H10K 50/11* (2023.02); *H10K 71/00* (2023.02); *H10K 2101/10* (2023.02)

(58) Field of Classification Search
None
See application file for complete search history.

(56) References Cited

U.S. PATENT DOCUMENTS

| 2013/0001541 A1 | 1/2013 | Hayashi |
| 2018/0240978 A1 | 8/2018 | Sasada et al. |

FOREIGN PATENT DOCUMENTS

| EP | 2492276 A1 | 8/2012 |
| EP | 3115395 A1 | 1/2017 |

(Continued)

OTHER PUBLICATIONS

Kido et al., Thermally cross-linkable host materials for enabling solution processed multilayer stacks in organic light-emitting devices, 2013, Organic Electronics 14 (2013) 1614-1620 (Year: 2015).*

(Continued)

*Primary Examiner* — Gregory D Clark
(74) *Attorney, Agent, or Firm* — Panitch Schwarze Belisario & Nadel LLP

(57) ABSTRACT

A light emitting device having excellent light emission efficiency contains a cathode, a first organic layer containing a compound having a cross-linkable group and a phosphorescent transition metal complex, a second organic layer containing a crosslinked body of the same compound as the compound having a cross-linkable group, and an anode in this order. The ratio of the compound having a cross-linkable group contained in the first organic layer is 2 to 10% by mass with respect to the total mass of the first organic layer. The compound having a cross-linkable group may be a compound having at least one cross-linkable group selected from cross-linkable groups represented by the formula (XL-1) to the formula (XL-19).

7 Claims, 1 Drawing Sheet

(51) Int. Cl.
  *H10K 85/30* (2023.01)
  *H10K 50/11* (2023.01)
  *H10K 71/00* (2023.01)
  *H10K 101/10* (2023.01)

(56) References Cited

FOREIGN PATENT DOCUMENTS

| JP | 2010103317 | A | 5/2007 |
|----|------------|---|--------|
| JP | 2007180020 | A | 7/2007 |
| JP | 200860034 | A | 3/2008 |
| JP | 2011105701 | A | 6/2011 |
| JP | 2011211174 | A | 10/2011 |
| JP | 2016111355 | A | 6/2016 |
| JP | 2018104674 | A | 7/2018 |
| JP | 6600110 | B1 | 10/2019 |
| WO | 2011049226 | A1 | 4/2011 |
| WO | 2015133437 | A1 | 9/2015 |
| WO | 2017061332 | A1 | 4/2017 |

OTHER PUBLICATIONS

International Preliminary Report on Patentability issued Sep. 10, 2021 in International Application No. PCT/JP2019/049783.
International Search Report issued Jan. 28, 2020 in International Application No. PCT/JP2019/049783.
Written Opinion issued Jan. 28, 2020 in International Application No. PCT/JP2019/049783.
Decision to Grant issued Sep. 3, 2019 in JP Application No. 2019033281.

* cited by examiner

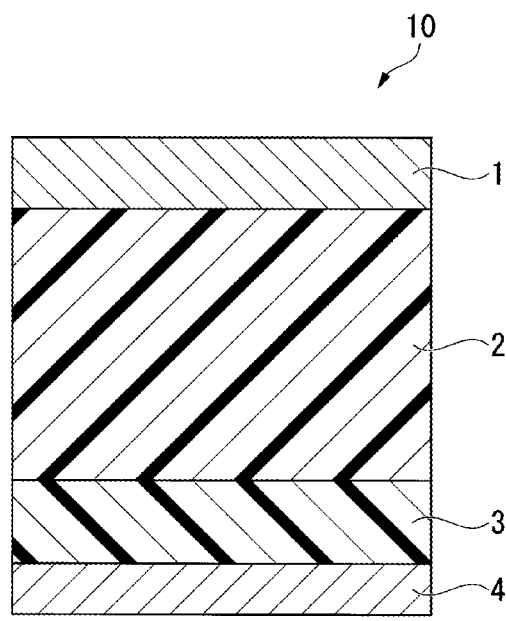

LIGHT EMITTING DEVICE

CROSS-REFERENCE TO RELATED APPLICATIONS

This application is a Section 371 of International Application No. PCT/JP2019/049783, filed Dec. 19, 2019, which was published in the Japanese language on Sep. 3, 2020 under International Publication No. WO 2020/174837 A1, which claims priority under 35 U.S.C. § 119 (b) to Japanese Application No. 2019-033281, filed on Feb. 26, 2019, the disclosures of which are incorporated herein by reference in their entireties.

TECHNICAL FIELD

The present invention relates to a light emitting device.

BACKGROUND ART

Light emitting devices such as an organic electroluminescent device and the like can be suitably used for applications of display and illumination, and have been actively under study in recent years. As the light emitting device, for example, a light emitting device having a hole transporting layer containing a crosslinked body of a polymer compound having a cross-linkable group and a light emitting layer containing a host material and an iridium complex is known (Patent Document 1).

PRIOR ART DOCUMENT

Patent Document

[Patent Document 1] Japanese Unexamined Patent Application Publication (JP-A) No. 2011-105701

SUMMARY OF THE INVENTION

Problem to be Solved by the Invention

However, the above-described light emitting device is not necessarily sufficient in light emission efficiency.

Then, the present invention has an object of providing a light emitting device excellent in light emission efficiency.

Means for Solving the Problem

The present invention provides the following [1] to [7].

[1] A light emitting device comprising a cathode, a first organic layer containing a compound having a cross-linkable group and a phosphorescent transition metal complex, a second organic layer containing a crosslinked body of the same compound as the above-described compound having a cross-linkable group, and an anode in this order, wherein the ratio of the above-described compound having a cross-linkable group contained in the above-described first organic layer is 2 to 10% by mass with respect to the total mass of the above-described first organic layer.

[2] The light emitting device according to [1], wherein the above-described compound having a cross-linkable group is a compound having at least one cross-linkable group selected from Group of cross-linkable group consisting of the formula (XL-1) to the formula (XL-19):

[Chemical Formula 1]

(XL-1)

(XL-2)

(XL-3)

(XL-4)

(XL-5)

(XL-6)

(XL-7)

(XL-8)

(XL-9)

(XL-10)

(XL-11)

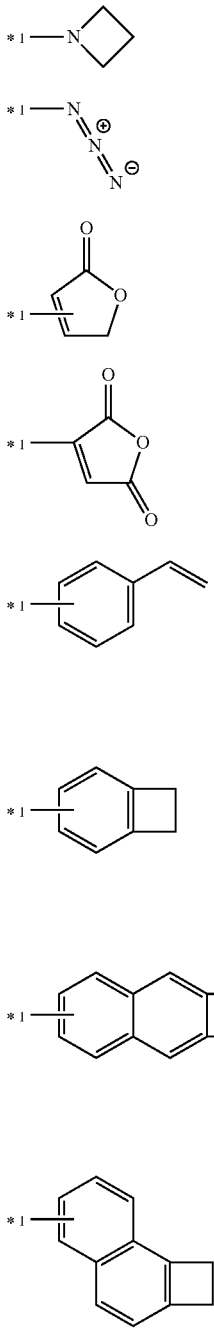

(XL-12)
(XL-13)
(XL-14)
(Xl-15)
(XL-16)
(XL-17)
(XL-18)
(XL-19)

[in the formula (XL-1) to the formula (XL-19), $R^{XL}$ represents a methylene group, an oxygen atom or a sulfur atom, and $n^{XL}$ represents an integer of 0 to 5. When a plurality of $R^{XL}$ are present, they may be the same or different. When a plurality of $n^{XL}$ are present, they may be the same or different.

*1 represents a binding position.

These cross-linkable groups optionally have a substituent, and when a plurality of the above-described substituents are present, the plurality of the substituents may be combined together to form a ring together with carbon atoms to which they are attached.].

[3] The light emitting device according to [2], wherein the above-described compound having a cross-linkable group is a polymer compound having a constitutional unit represented by the formula (1) or the formula (1'):

[Chemical Formula 2]

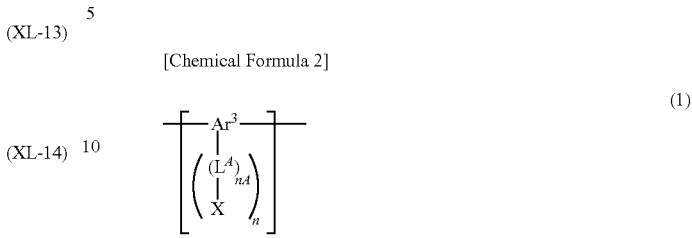

(1)

[in the formula (1), nA represents an integer of 0 to 5, and n represents 1 or 2. When a plurality of nA are present, they may be the same or different.

$Ar^3$ represents an aromatic hydrocarbon group or a hetero ring group, and these groups optionally have a substituent.

$L^A$ represents an alkylene group, a cycloalkylene group, an arylene group, a divalent hetero ring group, a group represented by —NR'—, an oxygen atom or a sulfur atom, and these groups other than an oxygen atom and a sulfur atom optionally have a substituent. R' represents a hydrogen atom, an alkyl group, a cycloalkyl group, an aryl group or a monovalent hetero ring group, and these groups other than a hydrogen atom optionally have a substituent. When a plurality of $L^A$ are present, they may be the same or different.

X represents a cross-linkable group selected from the above-described Group of cross-linkable group. When a plurality of X are present, they may be the same or different.]

[Chemical Formula 3]

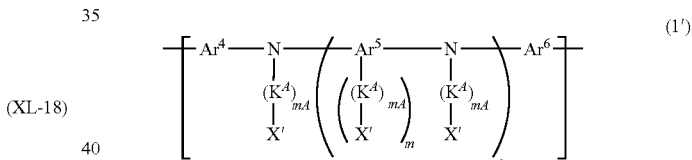

(1')

[in the formula (1'), mA represents an integer of 0 to 5, m represents an integer of 1 to 4, and c represents an integer of 0 or 1. When a plurality of mA are present, they may be the same or different.

$Ar^5$ represents an aromatic hydrocarbon group, a hetero ring group, or a group in which an aromatic hydrocarbon ring and a hetero ring are bonded directly, and these groups optionally have a substituent.

$Ar^4$ and $Ar^6$ each independently represent an arylene group or a divalent hetero ring group, and these groups optionally have a substituent.

$Ar^4$, $Ar^5$ and $Ar^6$ each may be bonded directly or via an oxygen atom or a sulfur atom to a group other than the above-described groups, bonded to a nitrogen atom to which the above-described groups are attached, to form a ring.

$K^A$ represents an alkylene group, a cycloalkylene group, an arylene group, a divalent hetero ring group, a group represented by —NR"—, an oxygen atom or a sulfur atom, and these groups other than an oxygen atom and a sulfur atom optionally have a substituent. R" represents a hydrogen atom, an alkyl group, a cycloalkyl group, an aryl group or a monovalent hetero ring group, and these groups other than a hydrogen atom optionally have a substituent. When a plurality of $K^A$ are present, they may be the same or different.

X' represents a cross-linkable group selected from the above-described Group of cross-linkable group, a hydrogen atom, an alkyl group, a cycloalkyl group, an aryl group or a monovalent hetero ring group, and these groups other than a hydrogen atom optionally have a substituent. At least one X' is a cross-linkable group selected from the above-described Group of cross-linkable group.].

The light emitting device according to any one of [1] to [3], wherein the above-described phosphorescent transition metal complex is a metal complex represented by the formula (1-A):

[Chemical Formula 4]

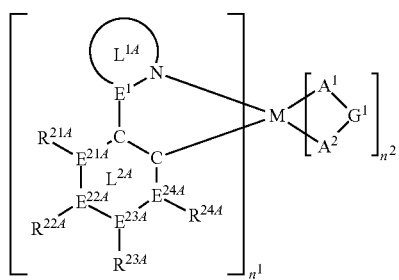

(1-A)

[in the formula (1-A), M represents a ruthenium atom, a rhodium atom, a palladium atom, an iridium atom or a platinum atom.

$n^1$ represents an integer of 1 or more, and $n^2$ represents an integer of 0 or more. $n^1+n^2$ is 3 when M is a ruthenium atom, a rhodium atom or an iridium atom, while $n^1+n^2$ is 2 when M is a palladium atom or a platinum atom.

$E^1$ represents a carbon atom or a nitrogen atom. When a plurality of $E^1$ are present, they may be the same or different.

Ring $L^{1A}$ represents a pyridine ring, a diazabenzene ring, an azanaphthalene ring, a diazanaphthalene ring, a triazole ring or a diazole ring, and these rings optionally have a substituent. When a plurality of the above-described substituents are present, the plurality of the substituents may be combined together to form a ring together with atoms to which they are attached. When a plurality of Ring $L^{1A}$ are present, they may be the same or different.

$E^{21A}$, $E^{22A}$, $E^{23A}$ and $E^{24A}$ each independently represent a nitrogen atom or a carbon atom. Ring $L^{2A}$ represents a benzene ring, a pyridine ring or a diazabenzene ring. When $E^{21A}$ is a nitrogen atom, $R^{21A}$ is not present. When $E^{22A}$ is a nitrogen atom, $R^{22A}$ is not present. When $E^{23A}$ is a nitrogen atom, $R^{23A}$ is not present. When $E^{24A}$ is a nitrogen atom, $R^{24A}$ is not present. When a plurality of $E^{21A}$, $E^{22A}$, $E^{23A}$ and $E^{24A}$ are present, they may be the same or different at each occurrence.

$R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and these groups other than a hydrogen atom optionally have a substituent. When a plurality of $R^{21A}$, $R^{22A}$, $R^{23A}$ and $R^{24A}$ are present, they may be the same or different at each occurrence. $R^{21A}$ and $R^{22A}$, $R^{22A}$ and $R^{23A}$, $R^{23A}$ and $R^{24A}$, and a substituent which Ring $L^{1A}$ optionally has and $R^{21A}$ each may be combined together to form a ring.

$A^1$-$G^1$-$A^2$ represents an anionic bidentate ligand. $A^1$ and $A^2$ each independently represent a carbon atom, an oxygen atom or a nitrogen atom, these atoms may be ring-constituent atoms. $G^1$ represents a single bond or an atomic group constituting a bidentate ligand together with $A^1$ and $A^2$. When a plurality of $A^1$-$G^1$-$A^2$ are present, they may be the same or different.].

The light emitting device according to [4], wherein the above-described metal complex represented by the formula (1-A) is a metal complex represented by the formula (1-B1), the formula (1-B2), the formula (1-B3), the formula (1-B4) or the formula (1-B5):

[Chemical Formula 5]

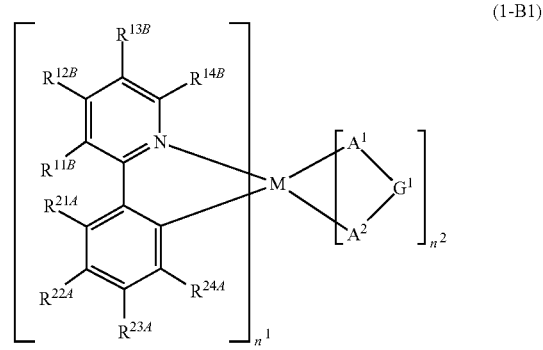

(1-B1)

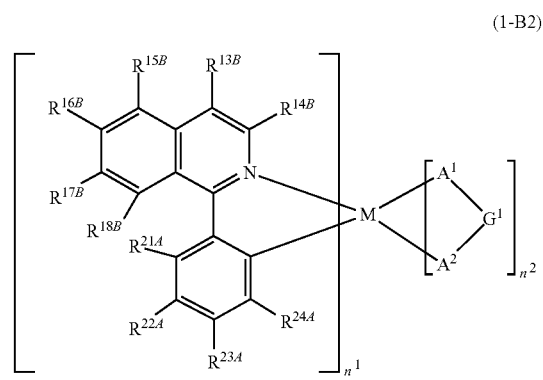

(1-B2)

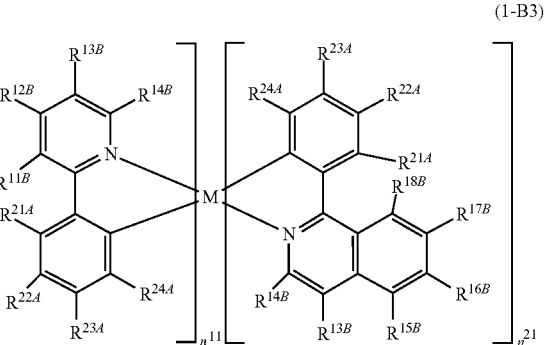

(1-B3)

-continued (1-B4)

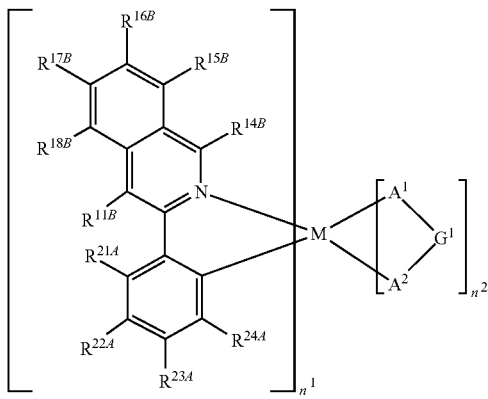

(1-B5)

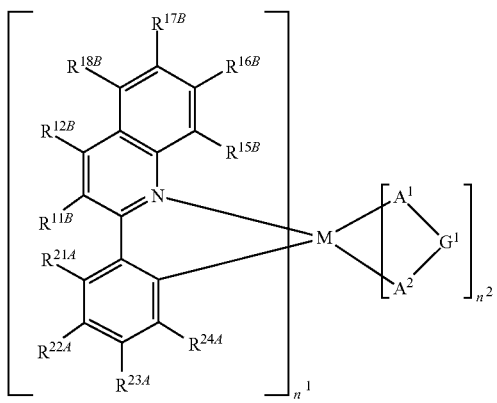

[in the formula (1-B1) to the formula (1-B5), M, $n^1$, $n^2$, $R^{21A}$, $R^{22A}$, $R^{23A}$, $R^{24A}$ and $A^1$-$G^1$-$A^2$ represent the same meaning as described above.

$n^{11}$ and $n^{12}$ each independently represent 1 or 2. $n^{11}+n^{12}$ is 3 when M is a ruthenium atom, a rhodium atom or an iridium atom, while $n^{11}+n^{12}$ is 2 when M is a palladium atom or a platinum atom.

$R^{11B}$, $R^{12B}$, $R^{13B}$, $R^{14B}$, $R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and these groups other than a hydrogen atom optionally have a substituent. When a plurality of $R^{11B}$, $R^{12B}$, $R^{13B}$, $R^{14B}$, $R^{15B}$, $R^{16B}$, $R^{17B}$ and $R^{18B}$ are present, they may be the same or different at each occurrence.

In the formula (1-B1), $R^{11B}$ and $R^{12B}$, $R^{12B}$ and $R^{13B}$, $R^{13B}$ and $R^{14B}$, and $R^{11B}$ and $R^{21A}$ each may be combined together to form a ring.

In the formula (1-B2), $R^{13B}$ and $R^{14B}$, $R^{13B}$ and $R^{11B}$, $R^{15B}$ and $R^{16B}$, $R^{16B}$ and $R^{17B}$, $R^{17B}$ and $R^{18B}$, and $R^{18B}$ and $R^{21A}$ each may be combined together to form a ring.

In the formula (1-B3), $R^{11B}$ and $R^{12B}$, $R^{12B}$ and $R^{13B}$, $R^{13B}$ and $R^{14B}$, $R^{11B}$ and $R^{21A}$, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21A}$ each may be combined together to form a ring.

In the formula (1-B4), $R^{11B}$ and $R^{18B}$, $R^{14B}$ and $R^{15B}$, $R^{15B}$ and $R^{16B}$, $R^{16B}$ and $R^{17B}$, $R^{17B}$ and $R^{18B}$, and $R^{11B}$ and $R^{21A}$ each may be combined together to form a ring.

In the formula (1-B5), $R^{11B}$ and $R^{12B}$, $R^{12B}$ and $R^{18B}$, $R^{15B}$ and $R^{16B}$, $R^{16B}$ and $R^{17B}$, $R^{17B}$ and R18e, and $R^{11B}$ and $R^{21A}$ each may be combined together to form a ring.].

[6] The light emitting device according to any one of [1] to [5], wherein the above-described first organic layer and the above-described second organic layer are adjacent.

[7] A method for producing a light emitting device comprising a cathode, a first organic layer containing a compound having a cross-linkable group and a phosphorescent transition metal complex, a second organic layer containing a crosslinked body of the same compound as the above-described compound having a cross-linkable group, and an anode in this order, wherein the ratio of the above-described compound having a cross-linkable group contained in the above-described first organic layer is 2 to 10% by mass with respect to the total mass of the above-described first organic layer, wherein the above-described first organic layer and the above-described second organic layer are formed by an application method.

Effect of the Invention

According to the present invention, it is possible to provide a light emitting device excellent in light emission efficiency.

BRIEF EXPLANATION OF DRAWINGS

FIG. 1 is a schematic view showing an example of the light emitting device according to one embodiment of the present invention.

MODES FOR CARRYING OUT THE INVENTION

Suitable embodiments of the present invention will be illustrated in detail below.

Explanation of Common Terms

Terms commonly used in the present specification have the following meanings unless otherwise stated.

Me represents a methyl group, Et represents an ethyl group, Bu represents a butyl group, i-Pr represents an isopropyl group and t-Bu represents a tert-butyl group.

A hydrogen atom may be a heavy hydrogen atom or a light hydrogen atom.

In the formula representing a metal complex, the solid line representing a bond between a ligand and the central metal means a covalent bond or a coordination bond.

"The polymer compound" means a polymer having molecular weight distribution and having a polystyrene-equivalent number-average molecular weight of $1 \times 10^3$ to $1 \times 10^8$.

"The low molecular weight compound" means a compound having no molecular weight distribution and having a molecular weight of $1 \times 10^4$ or less.

"The constitutional unit" means a unit occurring once or more times in a polymer compound. The constitutional unit occurring twice or more times in a polymer compound is usually called "repeating unit".

"The alkyl group" may be any of linear and branched. The number of carbon atoms of the linear alkyl group, not including the number of carbon atoms of the substituent, is usually 1 to 50, preferably 3 to 30, and more preferably 4 to 20. The number of carbon atoms of the branched alkyl group, not including the number of carbon atoms of the substituent, is usually 3 to 50, preferably 3 to 30, and more preferably 4 to 20.

The alkyl group optionally has a substituent and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom and the like (for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group, a 6-ethyloxyhexyl group).

The number of carbon atoms of "the cycloalkyl group", not including the number of carbon atoms of the substituent, is usually 3 to 50, preferably 3 to 30, and more preferably 4 to 20.

The cycloalkyl group optionally has a substituent and examples thereof include a cyclohexyl group, a methylcyclohexyl group and an ethylcyclohexyl group.

"The aryl group" means an atomic group remaining after removing from an aromatic hydrocarbon one hydrogen atom bonding directly to a carbon atom constituting the ring. The number of carbon atoms of the aryl group, not including the number of carbon atoms of the substituent, is usually 6 to 60, preferably 6 to 20, and more preferably 6 to 10.

The aryl group optionally has a substituent and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"The alkoxy group" may be any of linear and branched. The number of carbon atoms of the linear alkoxy group, not including the number of carbon atoms of the substituent, is usually 1 to 40, and preferably 4 to 10. The number of carbon atoms of the branched alkoxy group, not including the number of carbon atoms of the substituent, is usually 3 to 40, and preferably 4 to 10.

The alkoxy group optionally has a substituent and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of "the cycloalkoxy group", not including the number of carbon atoms of the substituent, is usually 3 to 40, and preferably 4 to 10.

The cycloalkoxy group optionally has a substituent and examples thereof include a cyclohexyloxy group, and groups obtained by substituting a hydrogen atom in a cyclohexyloxy group with a cycloalkyl group, an alkoxy group, a cycloalkoxy group, an aryl group, a fluorine atom or the like.

The number of carbon atoms of "the aryloxy group", not including the number of carbon atoms of the substituent, is usually 6 to 60, and preferably 6 to 48.

The aryloxy group optionally has a substituent and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom in these groups with an alkyl group, a cycloalkyl group, an alkoxy group, a cycloalkoxy group, a fluorine atom or the like.

"The p-valent hetero ring group" (p represents an integer of 1 or more) means an atomic group remaining after removing from a heterocyclic compound p hydrogen atoms among hydrogen atoms bonding directly to carbon atoms or hetero atoms constituting the ring. Of the p-valent hetero ring groups, "p-valent aromatic hetero ring group" which is an atomic group remaining after removing from an aromatic heterocyclic compound p hydrogen atoms among hydrogen atoms bonding directly to carbon atoms or hetero atoms constituting the ring is preferable.

"The aromatic heterocyclic compound" means a compound in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and a compound in which an aromatic ring is condensed to the hetero ring even if the hetero ring itself shows no aromaticity such as phenoxazine, phenothiazine, dibenzoborole, dibenzosilole, benzopyran and the like.

The number of carbon atoms of the monovalent hetero ring group, not including the number of carbon atoms of the substituent, is usually 2 to 60, and preferably 4 to 20.

The monovalent hetero ring group optionally has a substituent and examples thereof include a thienyl group, a pyrrolyl group, a furyl group, a pyridyl group, a piperidinyl group, a quinolinyl group, an isoquinolinyl group, a pyrimidinyl group and a triazinyl group, and groups obtained by substituting a hydrogen atom in these groups with an alkyl group, a cycloalkyl group, an alkoxy group, a cycloalkoxy group or the like.

"The halogen atom" denotes a fluorine atom, a chlorine atom, a bromine atom or an iodine atom.

"The amino group" optionally has a substituent, and a substituted amino group is preferred. The substituent which the amino group has is preferably an alkyl group, a cycloalkyl group, an aryl group or a monovalent hetero ring group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"The alkenyl group" may be any of linear and branched. The number of carbon atoms of the linear alkenyl group, not including the number of carbon atoms of the substituent, is usually 2 to 30, and preferably 3 to 20. The number of carbon atoms of the branched alkenyl group, not including the number of carbon atoms of the substituent, is usually 3 to 30, and preferably 4 to 20.

The number of carbon atoms of the "cycloalkenyl group", not including the number of carbon atoms of the substituent, is usually 3 to 30, and preferably 4 to 20.

The alkenyl group and the cycloalkenyl group optionally have a substituent and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, a 1-cyclopentyl-1-yl group and a 1-cyclohexyl-1-yl group, and these groups having a substituent described later.

"The alkynyl group" may be any of linear and branched. The number of carbon atoms of the alkynyl group, not including carbon atoms of the substituent, is usually 2 to 20, and preferably 3 to 20. The number of carbon atoms of the branched alkynyl group, not including carbon atoms of the substituent, is usually 4 to 30, and preferably 4 to 20.

The alkynyl group optionally has a substituent and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent described later.

"The arylene group" means an atomic group remaining after removing from an aromatic hydrocarbon two hydrogen atoms bonding directly to carbon atoms constituting the ring. The number of carbon atoms of the arylene group, not including the number of carbon atoms of the substituent, is usually 6 to 60, preferably 6 to 30, and more preferably 6 to 18.

The arylene group optionally has a substituent and examples thereof include a phenylene group, a biphenyldiyl group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent described later, and groups represented by the formula (A-1) to the formula (A-21) are preferable. The arylene group includes groups obtained by bonding a plurality of these groups.

[Chemical Formula 6]

(A-1)

(A-2)

(A-3)

-continued

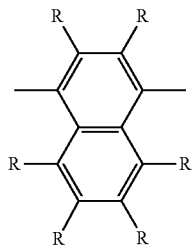

(A-4)

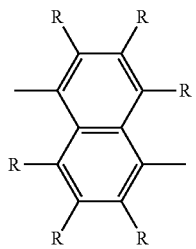

(A-5)

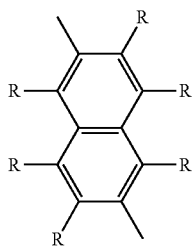

(A-6)

[Chemical Formula 7]

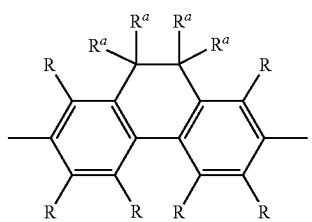

(A-7)

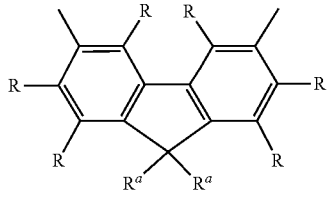

(A-8)

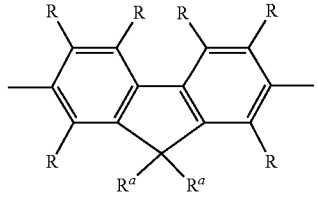

(A-9)

(A-10)

-continued
[Chemical Formula 8]
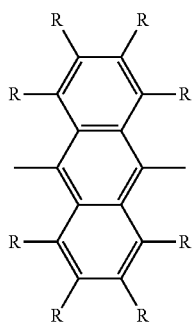 (A-11)
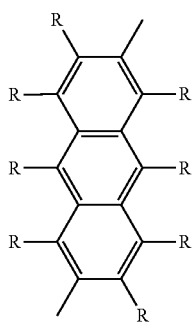 (A-12)
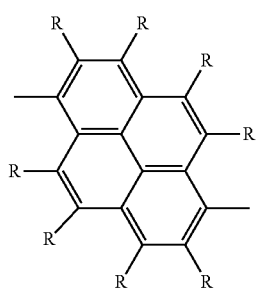 (A-13)
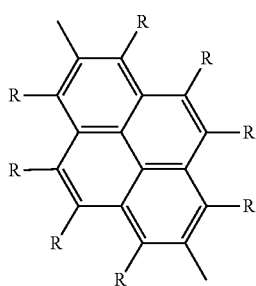 (A-14)
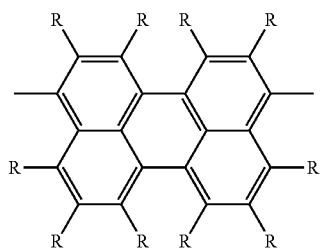 (A-15)
-continued
[Chemical Formula 9]
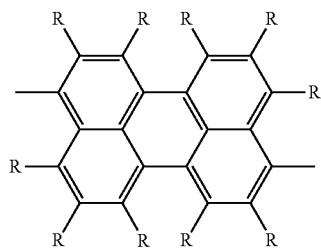 (A-16)
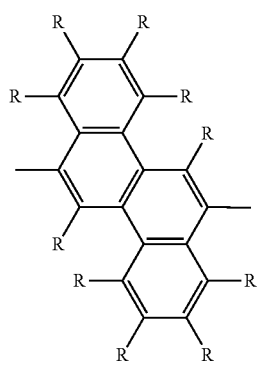 (A-17)
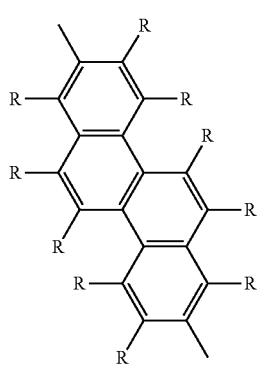 (A-18)
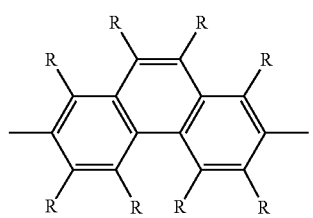 (A-19)
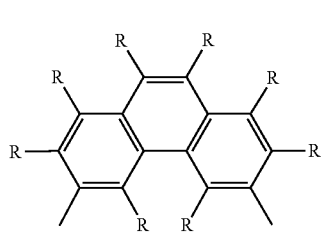 (A-20)

[Chemical Formula 10]

(A-21)

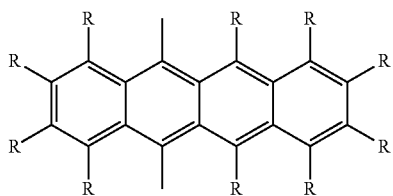

[wherein, R and $R^a$ each independently represent a hydrogen atom, an alkyl group, a cycloalkyl group, an aryl group or a monovalent hetero ring group. A plurality of R and $R^a$ each may be the same or different, and the plurality of $R^a$ may be combined together to form a ring together with atoms to which they are attached.]

The number of carbon atoms of the divalent hetero ring group, not including the number of carbon atoms of the substituent, is usually 2 to 60, preferably 3 to 20, and more preferably 4 to 15.

The divalent hetero ring group optionally has a substituent and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole, triazole, 5,7,12,14-tetrahydroquino[2,3-b]acridine, oxazole, 1,3,4-oxadiazole, thiazole or 1,3,4-thiadiazole two hydrogen atoms among hydrogen atoms bonding directly to carbon atoms or hetero atoms constituting the ring, and groups represented by the formula (AA-1) to the formula (AA-36) are preferable. The divalent hetero ring group includes groups obtained by bonding a plurality of these groups.

[Chemical Formula 11]

(AA-1)

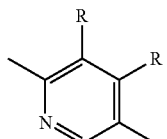

(AA-2)

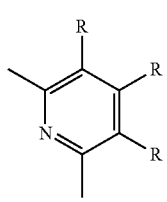

(AA-3)

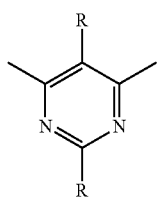

(AA-4)

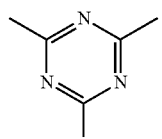

(AA-5)

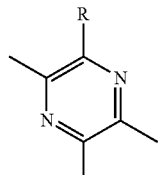

(AA-6)

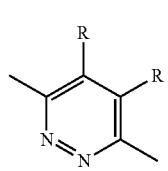

(AA-7)

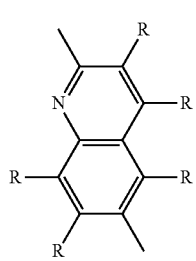

[Chemical Formula 12]

(AA-8)

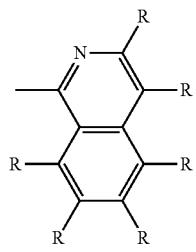

(AA-9)

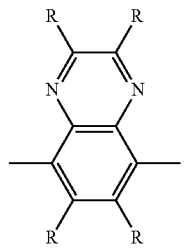

(AA-10)

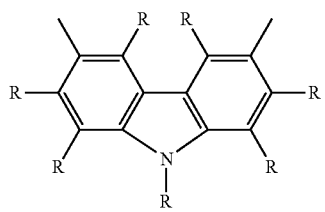

[Chemical Formula 13]
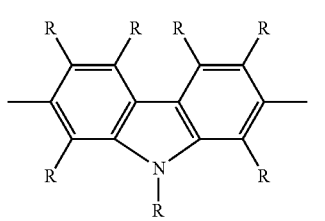
(AA-11)
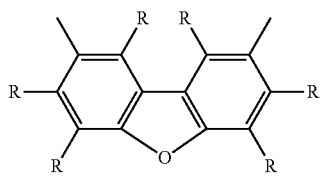
(AA-12)
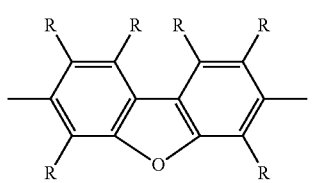
(AA-13)
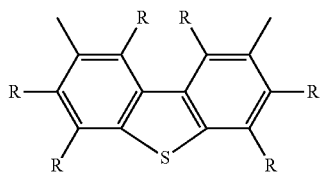
(AA-14)
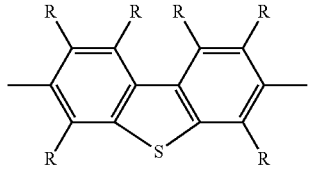
(AA-15)
[Chemical Formula 14]
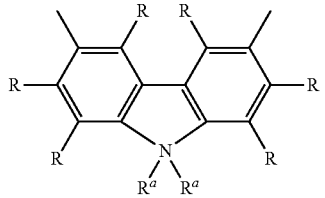
(AA-16)
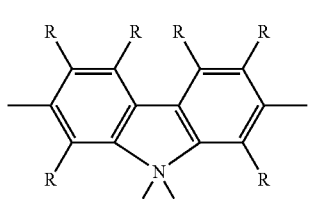
(AA-17)
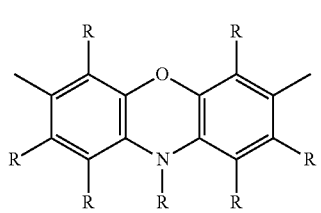
(AA-18)
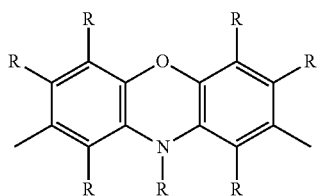
(AA-19)
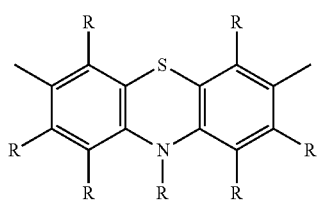
(AA-20)
[Chemical Formula 15]
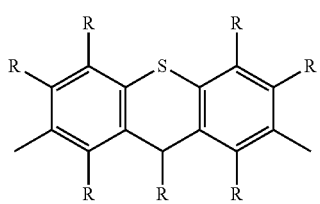
(AA-21)
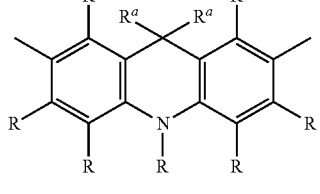
(AA-22)
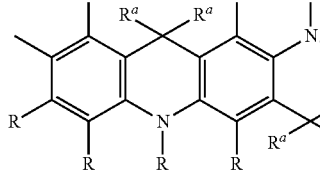
(AA-23)
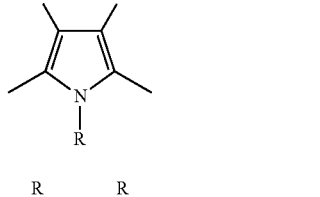
(AA-24)
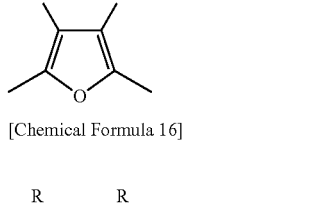
(AA-25)
[Chemical Formula 16]
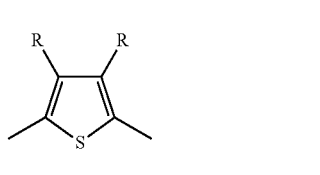
(AA-26)

-continued (AA-27) 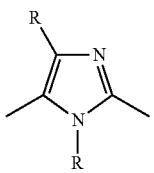

(AA-28) 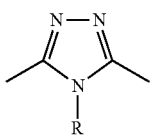

(AA-29) 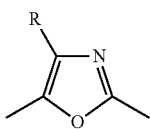

(AA-30) 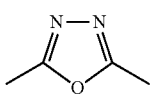

(AA-31) 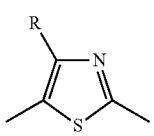

(AA-32) 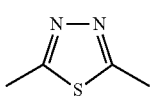

[Chemical Formula 17]

(AA-33) 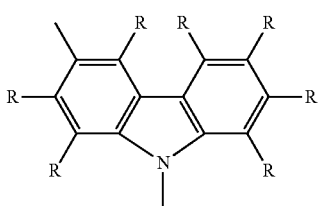

(AA-34) 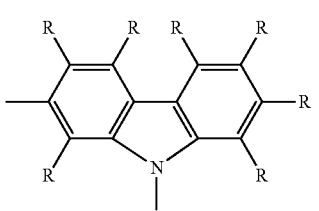

(AA-35) 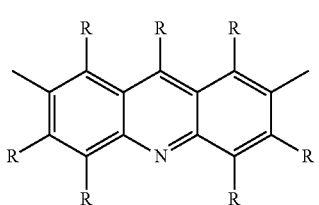

(AA-36) 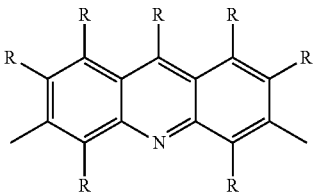

[wherein, R and $R^a$ represent the same meaning as described above.]

"The cross-linkable group" refers to a group capable of generating a new bond by being subjected to a heating treatment, an ultraviolet irradiation treatment, a near-ultraviolet irradiation treatment, a visible light irradiation treatment, an infrared irradiation treatment, a radical reaction and the like, and preferably includes cross-linkable groups represented by the formula (XL-1) to the formula (XL-19) in the above-described Group of cross-linkable group.

"The substituent" denotes, for example, a halogen atom, a cyano group, an alkyl group, a cycloalkyl group, an aryl group, a monovalent hetero ring group, an alkoxy group, a cycloalkoxy group, an aryloxy group, an amino group, a substituted amino group, an alkenyl group, a cycloalkenyl group or an alkynyl group. The substituent may also be a cross-linkable group. In the present specification, when it is expressed that a group optionally has a substituent, it means that the group may have at least one group listed as the substituent.

<Light Emitting Device>

Next, the light emitting device according to the present embodiment will be explained.

The light emitting device according to the present embodiment is a light emitting device comprising a cathode, a first organic layer containing a compound having a cross-linkable group and a phosphorescent transition metal complex, a second organic layer containing a crosslinked body of the same compound as the above-described compound having a cross-linkable group, and an anode in this order, wherein the amount of the above-described compound having a cross-linkable group contained in the above-described first organic layer is 2 to 10% by mass with respect to the total mass of the first organic layer.

The method for forming the first organic layer and the second organic layer includes, for example, dry methods such as a vacuum vapor deposition method and the like and wet methods such as a spin coat method, an inkjet printing method and the like, and wet methods are preferable.

When the first organic layer is formed by a wet method, it is preferable to use a first ink described later.

When the second organic layer is formed by a wet method, it is preferable to use a second ink described later. After forming the second organic layer, the compound having a cross-linkable group contained in the second organic layer can be crosslinked by heating or light irradiation. As the method for crosslinking the compound having a cross-linkable group contained in the second organic layer, heating is preferable. The second organic layer contains a crosslinked body of the compound having a cross-linkable group.

The temperature of heating for causing crosslinking is usually 50° C. to 300° C., preferably 50° C. to 260° C., more preferably 130° C. to 230° C., and further preferably 180° C. to 210° C.

The time of heating is usually 0.1 minutes to 1000 minutes, preferably 0.5 minutes to 500 minutes, more preferably 1 minute to 120 minutes, and further preferably 10 minutes to 60 minutes.

The kind of the light used for irradiation includes, for example, ultraviolet, near-ultraviolet and visible light.

<First Organic Layer>

The first organic layer according to one embodiment of the present invention contains a compound having a cross-linkable group and a phosphorescent transition metal complex, in which the ratio of the above-described compound having a cross-linkable group contained in the first organic layer is 2 to 10% by mass with respect to the total mass of the first organic layer.

The method for analyzing components contained in the first organic layer includes, for example, chemical separation and analysis methods such as extraction and the like, instrumental analysis methods such as infrared spectroscopy (also referred to as IR), nuclear magnetic resonance spectroscopy (also referred to as NMR), mass spectrometry (also referred to as MS) and the like, and analysis methods combining chemical separation and analysis methods with instrumental analysis methods.

For example, when the first organic layer is formed by a wet method, the method for quantifying a compound having a cross-linkable group contained in the first organic layer includes the following method.

First, a first organic layer is separated from a laminate consisting of a cathode, a first organic layer, a second organic layer and an anode. As the method for separating the first organic layer, there is a method of dissolving components of the first organic layer in a solvent such as toluene, xylene, chloroform or tetrahydrofuran. Next, the mass of the separated first organic layer is measured. Then, the compound having a cross-linkable group contained in the separated first organic layer is quantified by nuclear magnetic resonance spectroscopy or mass spectrometry.

<Compound Having Cross-Linkable Group>

The compound having a cross-linkable group contained in the first organic layer will be explained.

The compound having a cross-linkable group of first organic layer may be contained singly or in combination of two or more in the first organic layer.

"The compound having a cross-linkable group" is preferably a compound having at least one cross-linkable group selected from the above-described Group of cross-linkable group consisting of the formula (XL-1) to the formula (XL-19), since the light emitting device is more excellent in light emission efficiency.

[Chemical Formula 18]

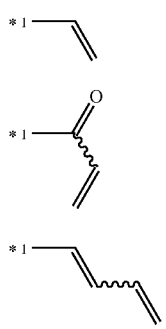

(XL-1)

(XL-2)

(XL-3)

(XL-4)

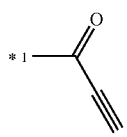

(XL-5)

(XL-6)

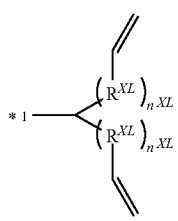

(XL-7)

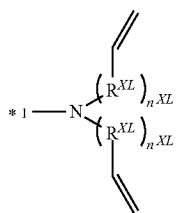

(XL-8)

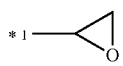

(XL-9)

(XL-10)

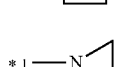

(XL-11)

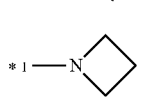

(XL-12)

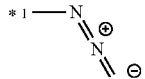

(XL-13)

(XL-14)

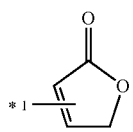

(Xl-15)

-continued

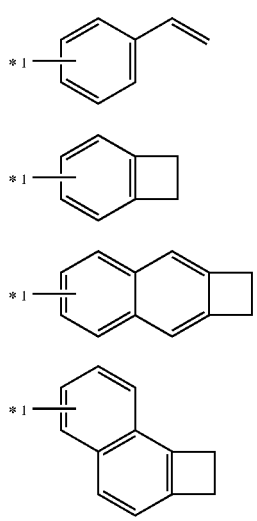

(XL-16)

(XL-17)

(XL-18)

(XL-19)

The cross-linkable group selected from Group of cross-linkable group is preferably a cross-linkable group represented by the formula (XL-1) to the formula (XL-4), the formula (XL-7) to the formula (XL-10) or the formula (XL-16) to the formula (XL-19), more preferably a cross-linkable group represented by the formula (XL-1), the formula (XL-16) to the formula (XL-19), further preferably a cross-linkable group represented by the formula (XL-1) or the formula (XL-17), and particularly preferably a cross-linkable group represented by the formula (XL-17), since the light emitting device of the present invention is more excellent in light emission efficiency.

"The compound having a cross-linkable group" may be a low molecular weight compound or a polymer compound.

The compound having a cross-linkable group, as a low molecular weight compound, is, for example, a low molecular weight compound having at least one cross-linkable group selected from the above-described Group of cross-linkable group. The above-described low molecular weight compound includes, for example, low molecular weight compounds represented by the formula (3-1) to the formula (3-16).

[Chemical Formula 19]

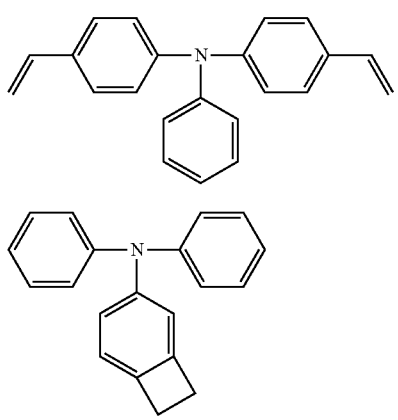

(3-1)

(3-2)

-continued

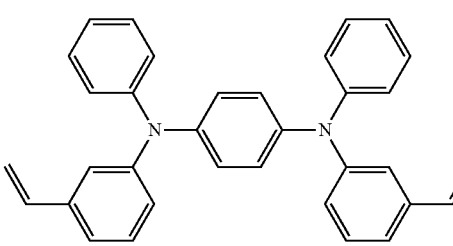

(3-3)

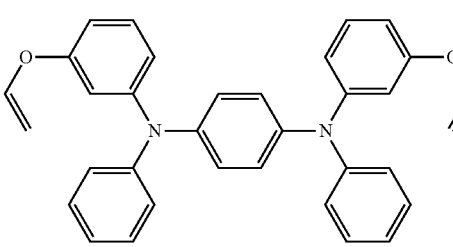

(3-4)

[Chemical Formula 20]

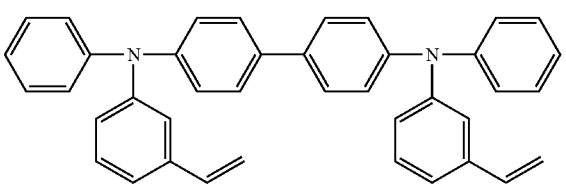

(3-5)

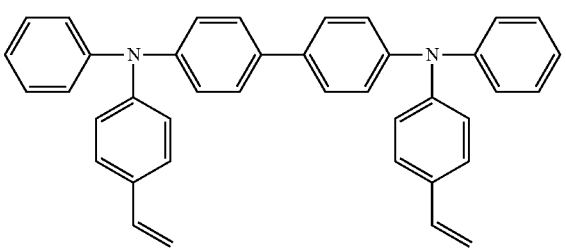

(3-6)

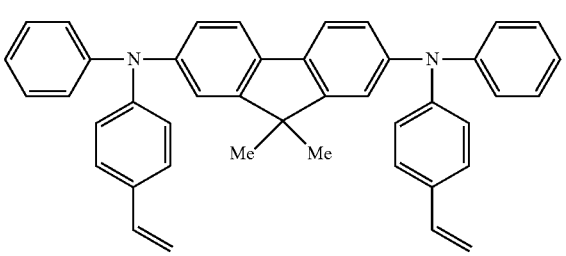

(3-7)

[Chemical Formula 21]

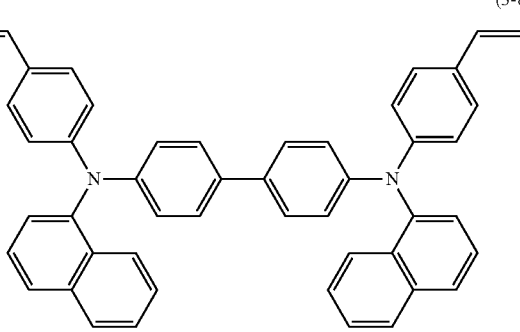

(3-8)

-continued (3-9)

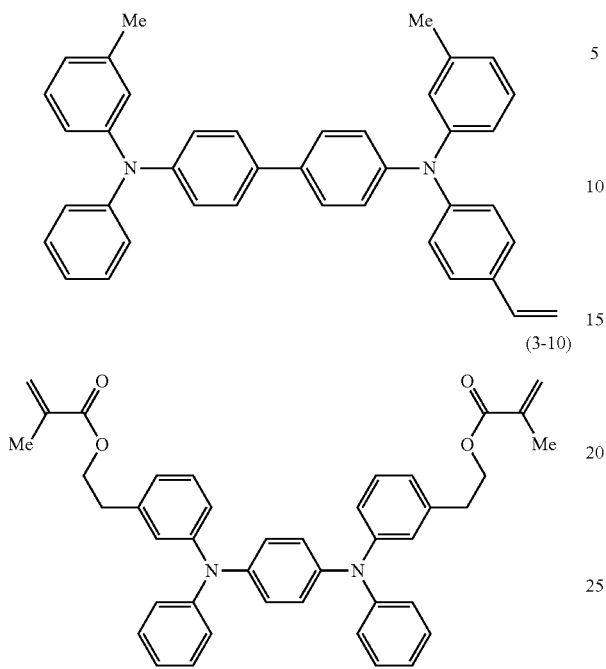

(3-10)

[Chemical Formula 22]

(3-11)

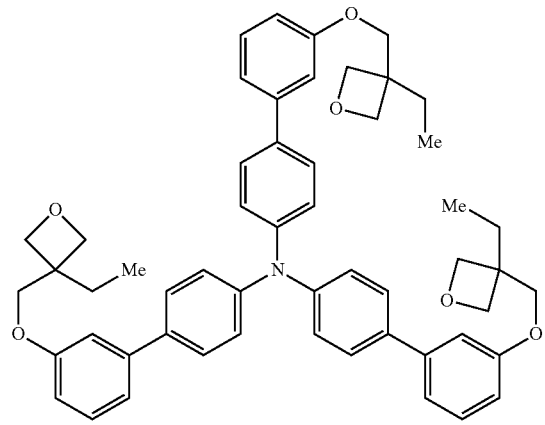

(3-12)

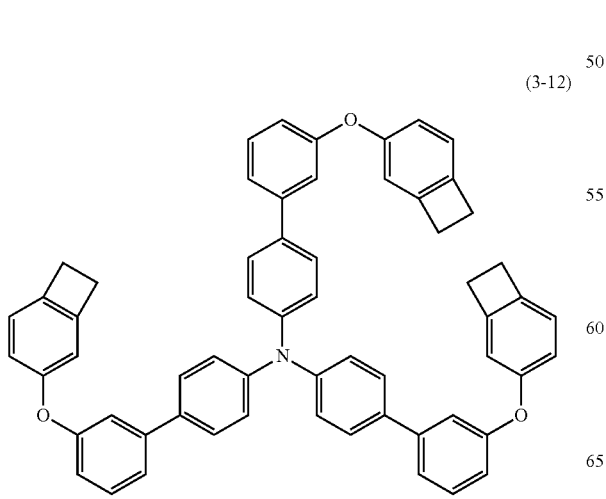

-continued (3-13)

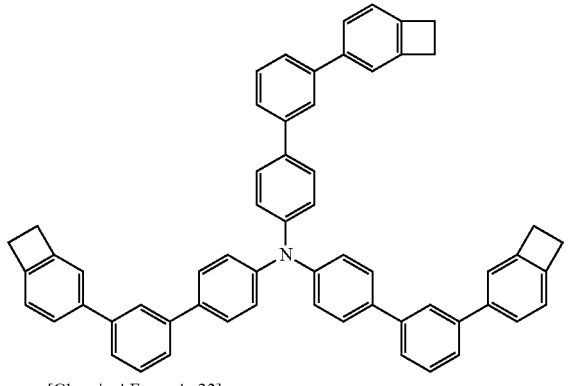

[Chemical Formula 23]

(3-14)

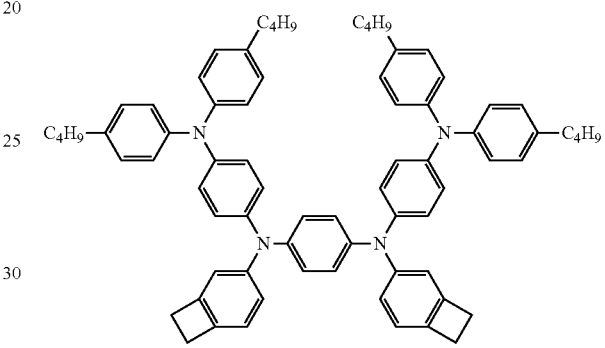

(3-15)

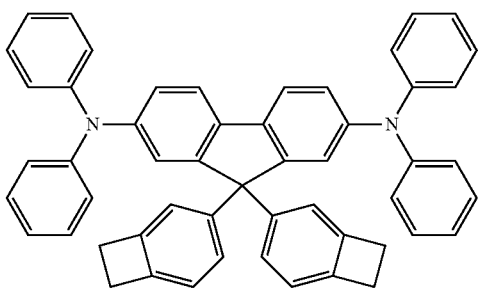

(3-16)

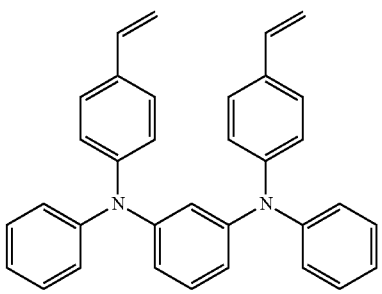

"The compound having a cross-linkable group" is preferably a polymer compound containing a constitutional unit having at least one cross-linkable group selected from the above-described Group of cross-linkable group (hereinafter, referred to also as "cross-linkable group-containing polymer compound of first organic layer").

The constitutional unit having at least one cross-linkable group selected from Group of cross-linkable group, contained in the cross-linkable group-containing polymer compound of first organic layer, is preferably a constitutional unit represented by the above-described formula (1) or the above-described formula (1'), and more preferably a constitutional unit represented by the above-described formula (1).

[Chemical Formula 24]

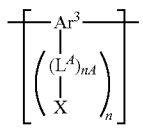
(1)

[Chemical Formula 25]

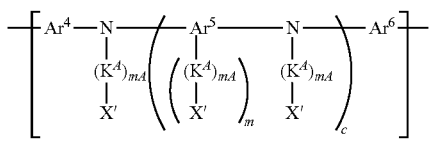
(1')

The constitutional unit having at least one cross-linkable group selected from Group of cross-linkable group may be a constitutional unit represented by the formula (1″-1) to the formula (1″-5).

[Chemical Formula 26]

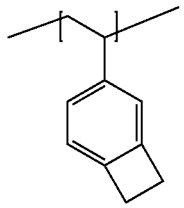
(1″-1)

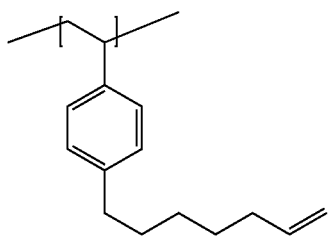
(1″-2)

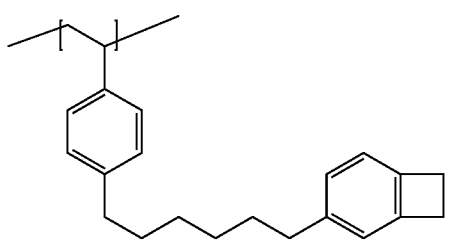
(1″-3)

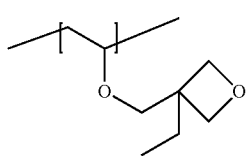
(1″-4)

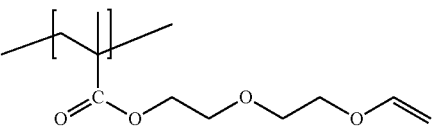
(1″-5)

The cross-linkable group-containing polymer compound of first organic layer may contain two or more constitutional units having at least one cross-linkable group selected from Group of cross-linkable group. In this case, it is preferable that at least two constitutional units having at least one cross-linkable group selected from Group of cross-linkable group are mutually different in its cross-linkable group. The combination of mutually different cross-linkable groups is preferably a combination of at least one selected from cross-linkable groups represented by the formula (XL-1), the formula (XL-2), the formula (XL-5) to the formula (XL-8) or the formula (XL-14) to the formula (XL-16) with at least one selected from cross-linkable groups represented by the formula (XL-3), the formula (XL-4), the formula (XL-13) or the formula (XL-17) to the formula (XL-19), and more preferably a combination of a cross-linkable group represented by the formula (XL-1) with a cross-linkable group represented by the formula (XL-17).

• Constitutional Unit Represented by the Formula (1)

nA is preferably an integer of 0 to 3, more preferably an integer of 0 to 2, and further preferably 0, since the light emitting device is more excellent in light emission efficiency.

n is preferably 2, since the light emitting device is more excellent in light emission efficiency.

$Ar^3$ is preferably an aromatic hydrocarbon group optionally having a substituent, since the light emitting device is more excellent in light emission efficiency.

The number of carbon atoms of the aromatic hydrocarbon group represented by $Ar^3$, not including the number of carbon atoms of the substituent, is usually 6 to 60, preferably 6 to 30, and more preferably 6 to 18.

The examples and preferable ranges of the arylene group portion obtained by removing n substituents of the aromatic hydrocarbon group represented by $Ar^3$ are the same as the examples and preferable ranges of the arylene group represented by $Ar^{Y1}$ described later.

The number of carbon atoms of the hetero ring group represented by $Ar^3$, not including the number of carbon atoms of the substituent, is usually 2 to 60, preferably 3 to 30, and more preferably 4 to 18.

The examples and preferable ranges of the divalent hetero ring group portion obtained by removing n substituents of the hetero ring group represented by $Ar^3$ are the same as the examples and preferable ranges of the divalent hetero ring group represented by $Ar^{Y1}$ described later.

The examples and preferable ranges of the substituent which the group represented by $Ar^3$ optionally has are the same as the examples and preferable ranges of the substituent which the group represented by $Ar^{Y1}$ optionally has described later.

The number of carbon atoms of the alkylene group represented by $L^A$, not including the number of carbon atoms of the substituent, is usually 1 to 20. The number of carbon atoms of the cycloalkylene group represented by $L^A$, not including the number of carbon atoms of the substituent, is usually 3 to 20.

The alkylene group and the cycloalkylene group represented by $L^A$ optionally have a substituent and examples thereof include a methylene group, an ethylene group, a propylene group, a butylene group, a hexylene group, a cyclohexylene group and an octylene group, and groups obtained by substituting a hydrogen atom in these groups with an alkyl group, a cycloalkyl group, an alkoxy group, a cycloalkoxy group, an aryl group, a monovalent hetero ring group, a fluorine atom or the like.

The examples and preferable ranges of the arylene group and the divalent hetero ring group represented by $L^A$ are the same as the examples and preferable ranges of the arylene group and the divalent hetero ring group represented by $Ar^{Y1}$ described later.

$L^A$ is preferably an arylene group or an alkylene group, since production of the cross-linkable group-containing polymer compound of first organic layer is easy. These groups optionally have a substituent.

The substituent which the group represented by $L^A$ optionally has is preferably an alkyl group, a cycloalkyl group, an alkoxy group, a cycloalkoxy group, an aryl group, a monovalent hetero ring group, a substituted amino group, a fluorine atom, a cyano group, or a cross-linkable group selected from Group of cross-linkable group. These groups optionally further have a substituent.

X is preferably a cross-linkable group represented by the formula (XL-1) to the formula (XL-4), the formula (XL-7) to the formula (XL-10) or the formula (XL-16) to the formula (XL-19), more preferably a cross-linkable group represented by the formula (XL-1), the formula (XL-16) to the formula (XL-19), further preferably a cross-linkable group represented by the formula (XL-1) or the formula (XL-17), and particularly preferably a cross-linkable group represented by the formula (XL-17), since the light emitting device is more excellent in light emission efficiency.

The amount of the constitutional unit represented by the formula (1) is preferably 0.5 to 80% by mol, more preferably 3 to 65% by mol, further preferably 5 to 50% by mol, and particularly preferably 6 to 10% by mol, with respect to the total amount of constitutional units contained in the cross-linkable group-containing polymer compound of first organic layer, since the cross-linkable group-containing polymer compound of first organic layer is excellent in stability.

The constitutional unit represented by the formula (1) may be contained singly or in combination of two or more in the cross-linkable group-containing polymer compound of first organic layer.

When the cross-linkable group-containing polymer compound of first organic layer contains two or more constitutional units represented by the formula (1), it is preferable that at least two constitutional units represented by the formula (1) are mutually different in its cross-linkable group represented by X.

• Constitutional Unit Represented by the Formula (1')

mA is preferably an integer of 0 to 3, since the light emitting device is more excellent in light emission efficiency.

m is preferably 1 or 2, since the light emitting device is more excellent in light emission efficiency.

c is preferably 0, since production of the cross-linkable group-containing polymer compound of first organic layer is easy and the light emitting device is more excellent in light emission efficiency.

$Ar^5$ is preferably an aromatic hydrocarbon group optionally having a substituent, since the light emitting device is more excellent in light emission efficiency.

The definitions and examples of the arylene group portion obtained by removing m substituents of the aromatic hydrocarbon group represented by $Ar^5$ are the same as the definitions and examples of the arylene group represented by $Ar^{X2}$ in the formula (X) described later.

The definitions and examples of the divalent hetero ring group portion obtained by removing m substituents of the hetero ring group represented by $Ar^5$ are the same as the definitions and examples of the divalent hetero ring group represented by $Ar^{X2}$ in the formula (X) described later.

The definitions and examples of the divalent group obtained by removing m substituents of the group in which an aromatic hydrocarbon ring and a hetero ring are bonded directly represented by $Ar^5$ are the same as the definitions and examples of the divalent group in which an arylene group and a divalent hetero ring group are bonded directly represented by $Ar^{X2}$ in the formula (X) described later.

$Ar^4$ and $Ar^6$ are each preferably an arylene group optionally having a substituent, since the light emitting device is more excellent in light emission efficiency.

The definitions and examples of the arylene group and the divalent hetero ring group represented by $Ar^4$ and $Ar^6$ are the same as the definitions and examples of the arylene group and the divalent hetero ring group represented by $Ar^{X1}$ and $Ar^{X3}$ in the formula (X) described later.

The definitions and examples of the alkylene group, the cycloalkylene group, the arylene group and the divalent hetero ring group represented by $K^A$ are the same as the definitions and examples of the alkylene group, the cycloalkylene group, the arylene group and the divalent hetero ring group represented by $L^A$, respectively.

$K^A$ is preferably an arylene group or an alkylene group, since production of the cross-linkable group-containing polymer compound of first organic layer is easy. These groups optionally have a substituent.

The examples and preferable ranges of the substituent which the group represented by $K^A$ optionally has are the same as the examples and preferable ranges of the substituent which the group represented by $L^A$ optionally has.

The definitions and examples of the cross-linkable group represented by X' are the same as the definitions and examples of X described above.

The amount of the constitutional unit represented by the formula (1') is preferably 0.5 to 50% by mol, with respect to the total amount of constitutional units contained in the cross-linkable group-containing polymer compound of first organic layer, since the cross-linkable group-containing polymer compound of first organic layer is excellent in stability.

The constitutional unit represented by the formula (1') may be contained singly or in combination of two or more in the cross-linkable group-containing polymer compound of first organic layer.

When the cross-linkable group-containing polymer compound of first organic layer contains two or more constitutional units represented by the formula (1'), it is preferable that at least two constitutional units represented by the formula (1') are mutually different in its cross-linkable group represented by X'.

• Preferable Embodiment of Constitutional Unit Represented by the Formula (1) or (1')

The constitutional unit represented by the formula (1) includes, for example, constitutional units represented by the formula (1-1) to the formula (1-30), and the constitutional unit represented by the formula (1') includes, for example, constitutional units represented by the formula (1'-1) to the formula (1'-9). Of them, constitutional units represented by the formula (1-1) to the formula (1-9) or the formula (1-30)

are preferable, and constitutional units represented by the formula (1-1) to the formula (1-9) are more preferable.
[Chemical Formula 27]
(1-1)
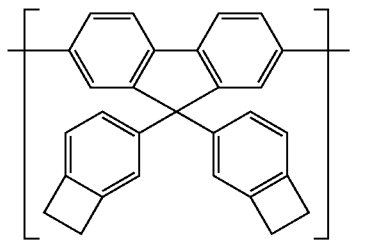
(1-2)
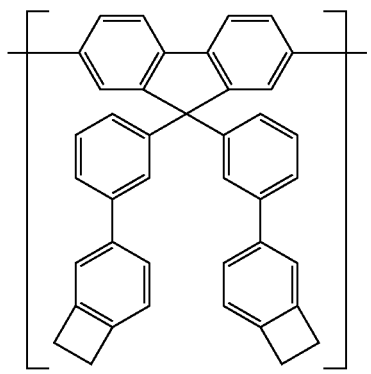
(1-3)
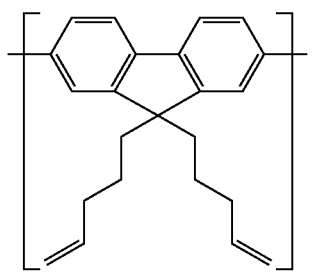
(1-4)
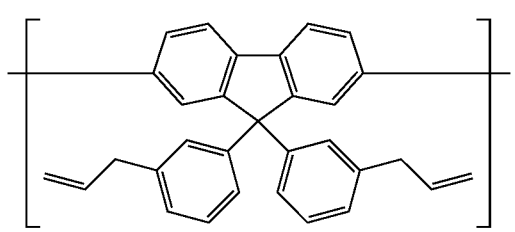
(1-5)
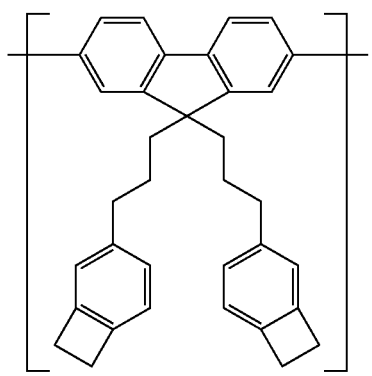
(1-6)
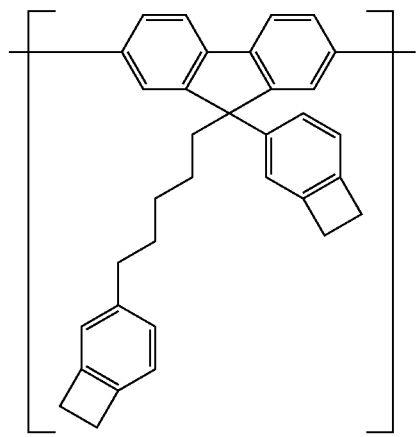
(1-7)
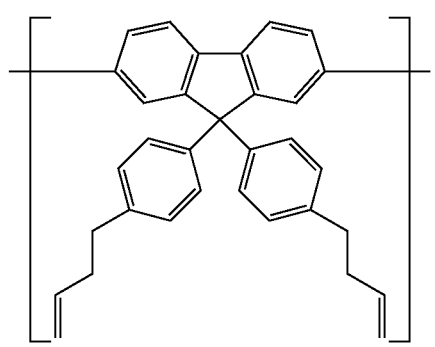
(1-8)
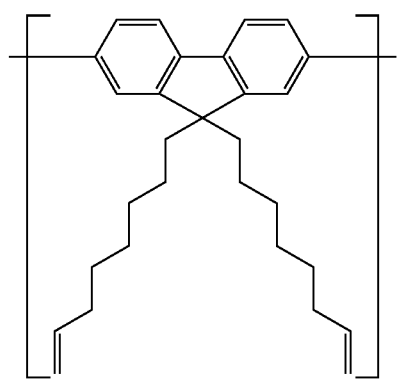
(1-9)
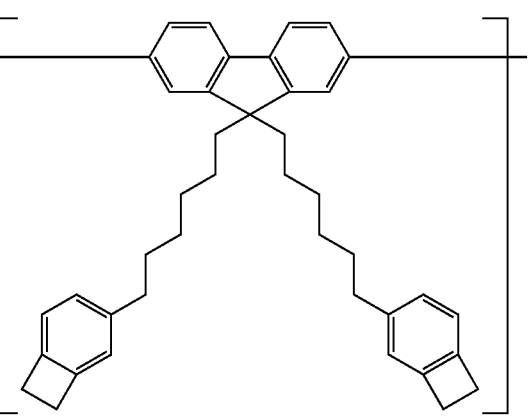

(1-10)
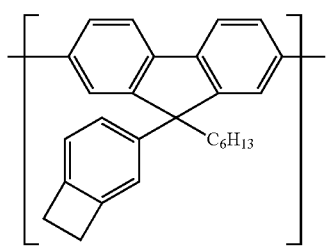
(1-11)
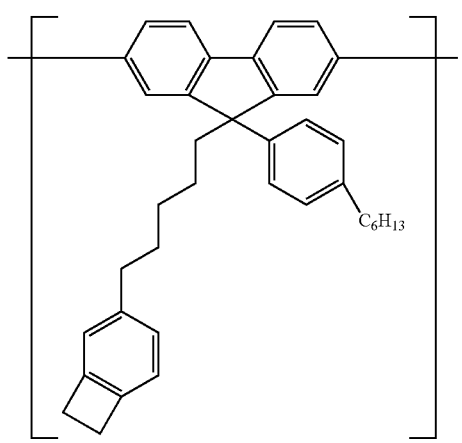
(1-12)
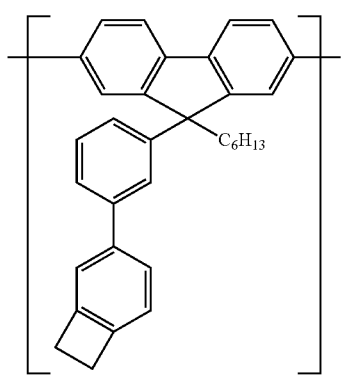
(1-13)
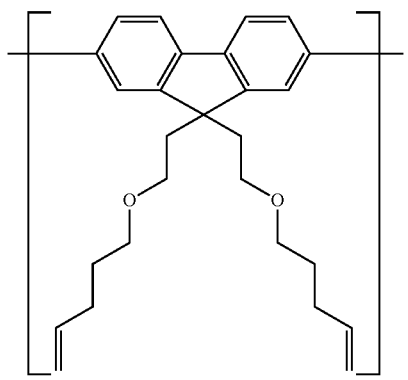
(1-14)
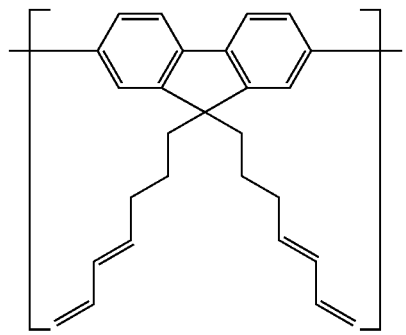
(1-15)
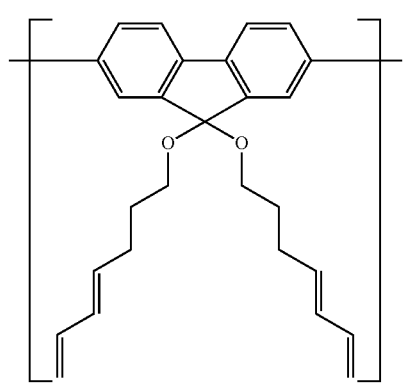
[Chemical Formula 28]
(1-16)
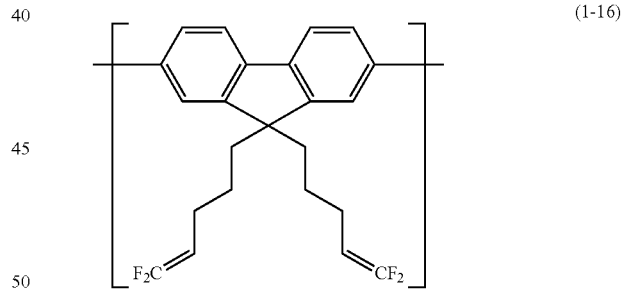
(1-17)
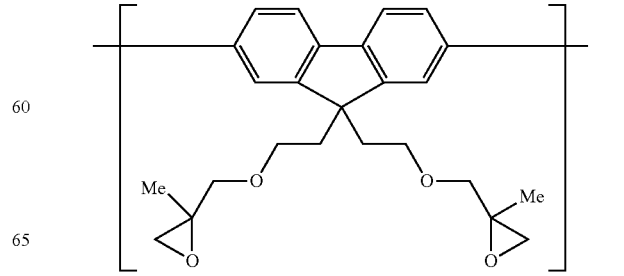

(1-18)
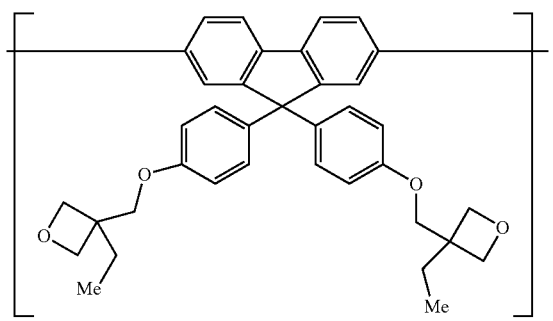
(1-19)
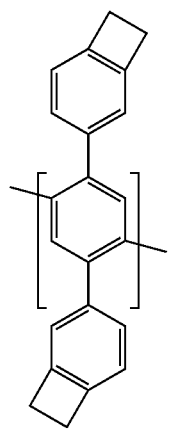
(1-20)
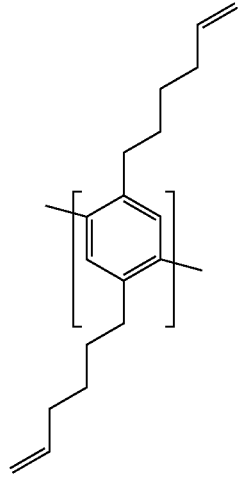
(1-21)
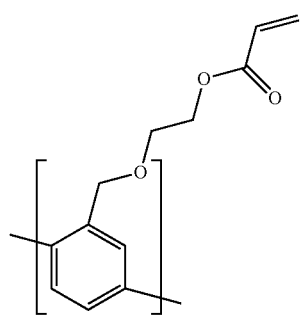
(1-22)
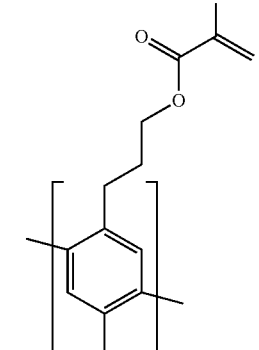
(1-23)
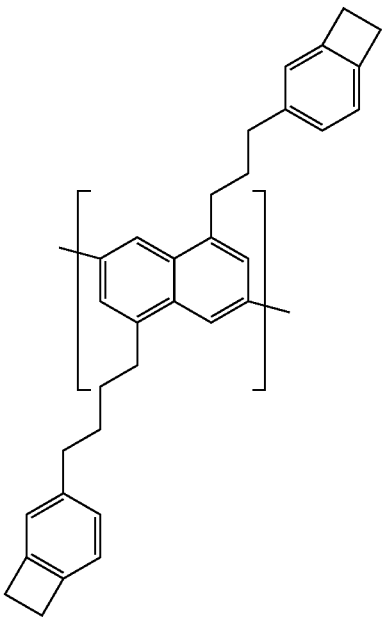

(1-24)
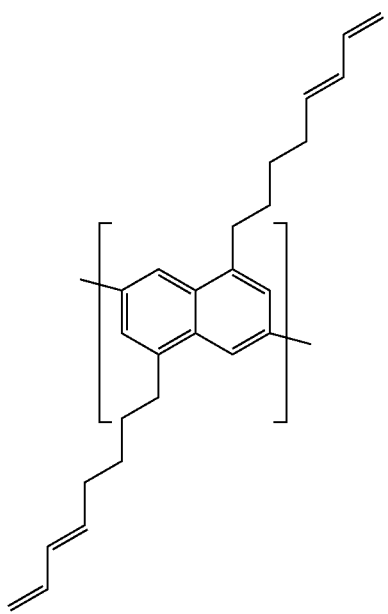
(1-25)
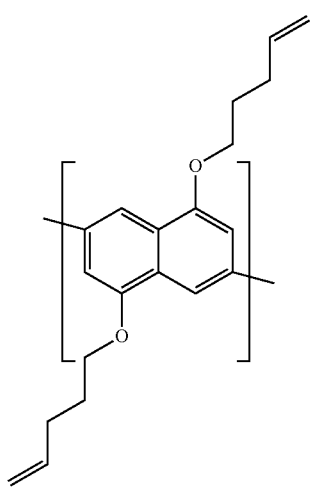
(1-26)
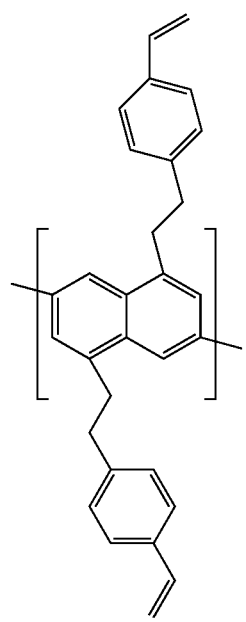
(1-27)
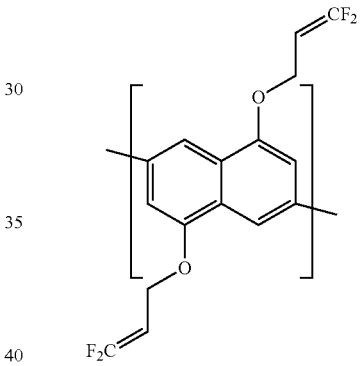
(1-28)
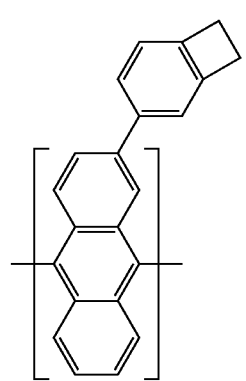
(1-29)
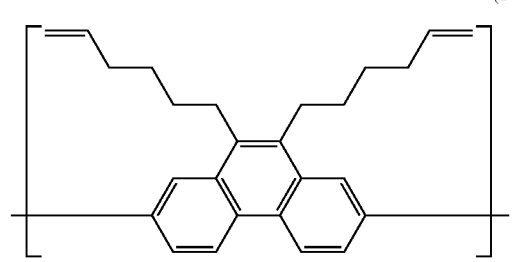

(1-30)
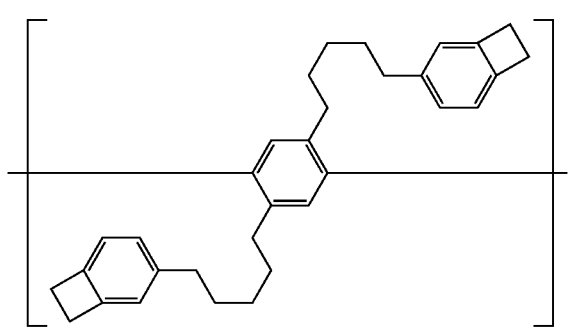
[Chemical Formula 29]
(1'-1)
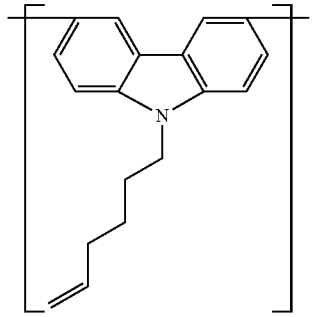
(1'-2)
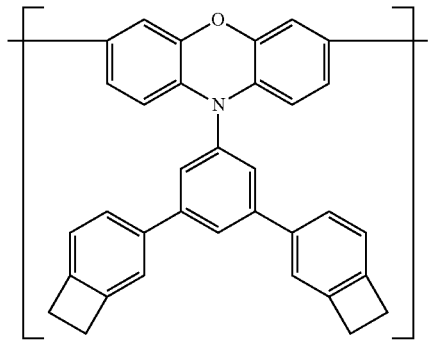
(1'-3)
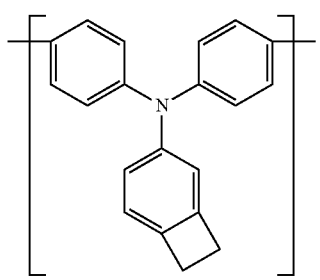
(1'-4)
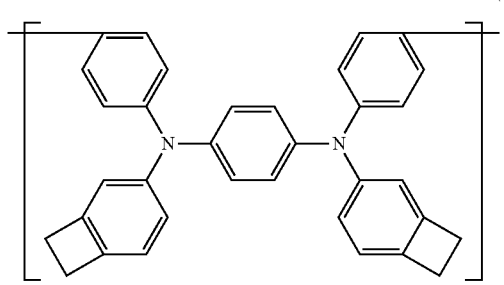
(1'-5)
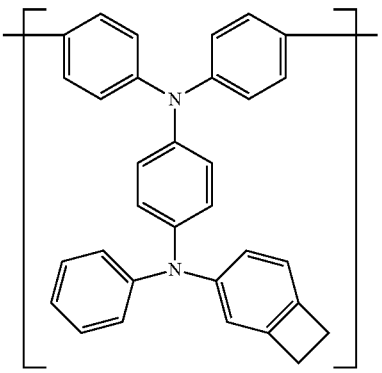
(1'-6)
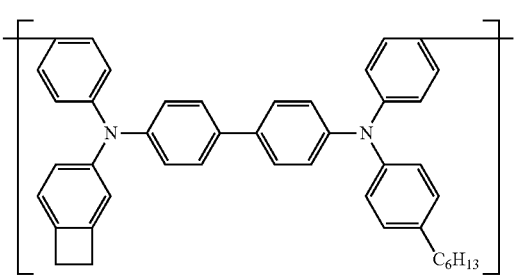
(1'-7)
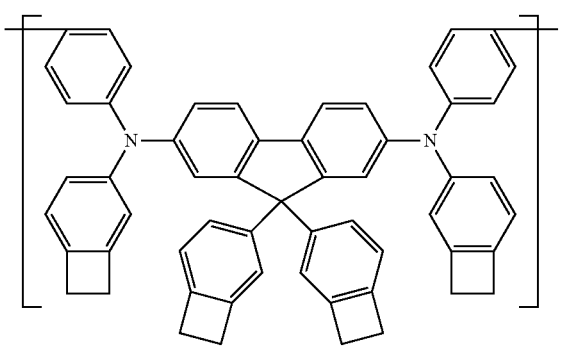
(1'-8)

-continued (1'-9)

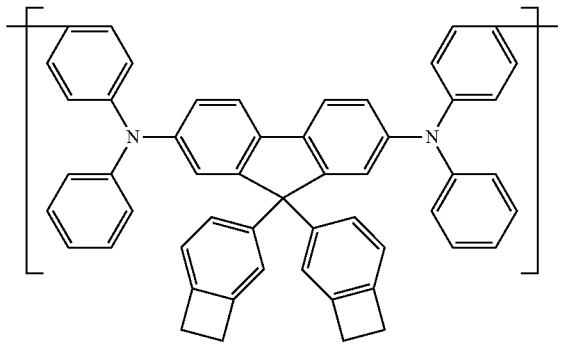

[Other Constitutional Unit]

It is preferable that the cross-linkable group-containing polymer compound of first organic layer further contains the constitutional unit represented by the formula (X), since its hole transportability is excellent.

[Chemical Formula 30]

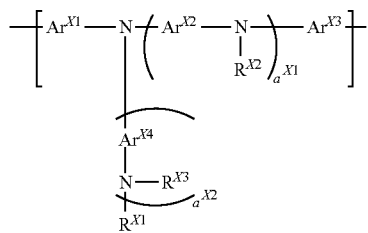

(X)

[in the formula (X), $a^{X1}$ and $a^{X2}$ each independently represent an integer of 0 or more.

$Ar^{X1}$ and $Ar^{X3}$ each independently represent an arylene group or a divalent hetero ring group, and these groups optionally have a substituent.

$Ar^{X2}$ and $Ar^{X4}$ each independently represent an arylene group, a divalent hetero ring group, or a divalent group in which an arylene group and a divalent hetero ring group are bonded directly, and these groups optionally have a substituent. When a plurality of $Ar^{X2}$ and $Ar^{X4}$ are present, they may be the same or different.

$R^{X1}$, $R^{X2}$ and $R^{X3}$ each independently represent a hydrogen atom, an alkyl group, a cycloalkyl group, an aryl group or a monovalent hetero ring group, and these groups other than a hydrogen atom optionally have a substituent. When a plurality of $R^{X2}$ and $R^{X3}$ are present, they may be the same or different at each occurrence.]

$a^{X1}$ is preferably 2 or less, and more preferably 1, since the light emitting device of the present invention is more excellent in light emission efficiency.

$a^{X2}$ is preferably 2 or less, and more preferably 0, since the light emitting device of the present invention is more excellent in light emission efficiency.

$R^{X1}$ to $R^{X3}$ are each preferably an alkyl group, a cycloalkyl group, an aryl group or a monovalent hetero ring group, and more preferably an aryl group. These groups optionally have a substituent.

The arylene group represented by $Ar^{X1}$ and $Ar^{X3}$ is more preferably a group represented by the formula (A-1) or the formula (A-9), and further preferably a group represented by the formula (A-1). These groups optionally have a substituent.

The divalent hetero ring group represented by $Ar^{X1}$ and $Ar^{X3}$ is more preferably a group represented by the formula (AA-1), the formula (AA-2) or the formula (AA-7) to the formula (AA-26). These groups optionally have a substituent.

$Ar^{X1}$ and $Ar^{X3}$ are each preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to the formula (A-11) or the formula (A-19), and further preferably a group represented by the formula (A-9). These groups optionally have a substituent.

The more preferable ranges of the divalent hetero ring group represented by $Ar^{X2}$ and $Ar^{X4}$ are the same as the more preferable range of the divalent hetero ring group represented by $Ar^{X1}$ and $Ar^{X3}$.

The more preferable ranges and further preferable ranges of the arylene group and the divalent hetero ring group in the divalent group in which an arylene group and a divalent hetero ring group are bonded directly represented by $Ar^{X2}$ and $Ar^{X4}$ are the same as the more preferable ranges and further preferable ranges of the arylene group and the divalent hetero ring group represented by $Ar^{X1}$ and $Ar^{X3}$, respectively.

The divalent group in which an arylene group and a divalent hetero ring group are bonded directly represented by $Ar^{X2}$ and $Ar^{X4}$ includes, for example, groups represented by the formula ($Ar^{X5}$-1) to the formula ($Ar^{X5}$-4), and these groups optionally have a substituent.

[Chemical Formula 31]

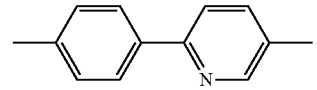
($Ar^{x5}$-1)

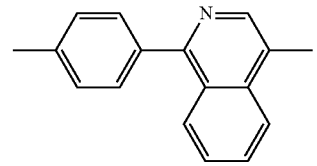
($Ar^{x5}$-2)

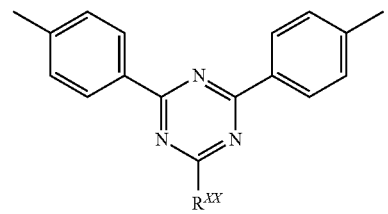
($Ar^{x5}$-3)

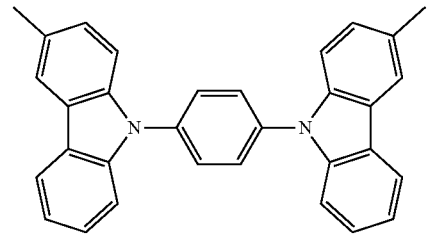
($Ar^{x5}$-4)

[in the formula (Ar$^{X5}$-3), R$^{XX}$ represents a hydrogen atom, an alkyl group, a cycloalkyl group, an aryl group or a monovalent hetero ring group, and these groups other than a hydrogen atom optionally have a substituent.]

Ar$^{X2}$ and Ar$^{X4}$ are each preferably an arylene group optionally having a substituent.

The substituent which the group represented by Ar$^{X1}$ to Ar$^{X4}$ and R$^{X1}$ to R$^{X3}$ optionally has is preferably an alkyl group, a cycloalkyl group or an aryl group, and more preferably an alkyl group. These groups optionally further have a substituent.

The constitutional unit represented by the formula (X) is preferably a constitutional unit represented by the formula (X-1) to the formula (X-7), and more preferably a constitutional unit represented by the formula (X-4).

[Chemical Formula 32]

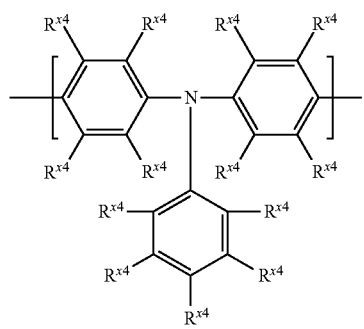
(X-1)

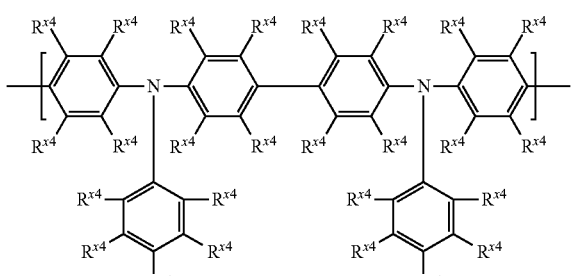
(X-2)

[Chemical Formula 33]

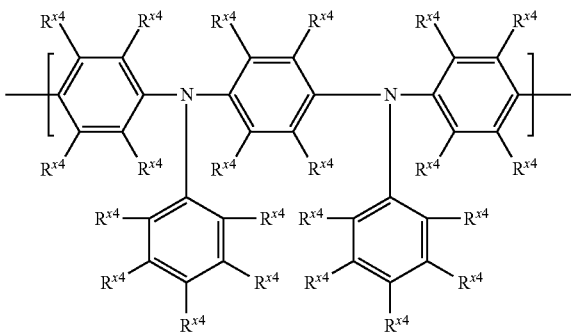
(X-3)

[Chemical Formula 34]

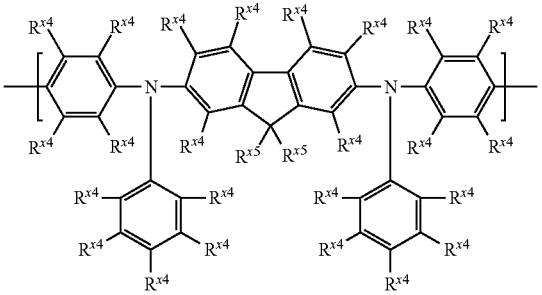
(X-4)

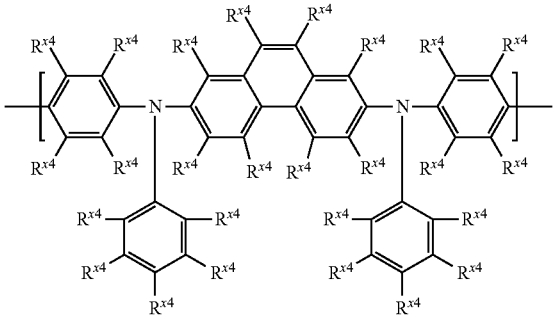
(X-5)

[Chemical Formula 35]

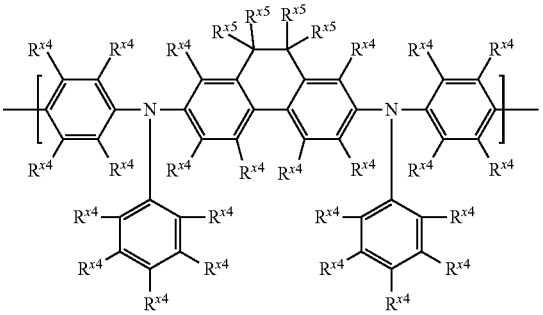
(X-6)

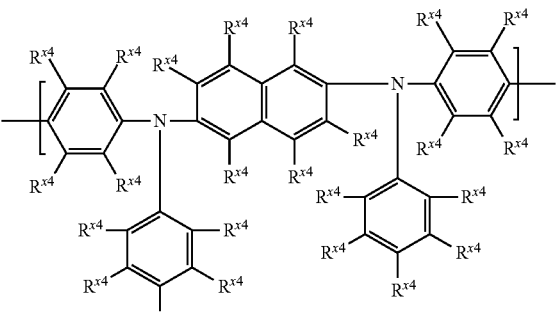
(X-7)

[in the formulae (X-1) to (X-7), R$^{X4}$ and R$^{X5}$ each independently represent a hydrogen atom, an alkyl group, a cycloalkyl group, an alkoxy group, a cycloalkoxy group, an aryl group, an aryloxy group, a halogen atom, a monovalent hetero ring group or a cyano group, and these groups other than a hydrogen atom optionally have a substituent. A plurality of R$^{X4}$ may be the same or different. A plurality of $R^{X5}$ may be the same or different, and adjacent $R^{X5}$ may be combined together to form a ring together with carbon atoms to which they are attached.]

The amount of the constitutional unit represented by the formula (X) is preferably 0.1 to 90% by mol, more preferably 1 to 70% by mol, further preferably 10 to 50% by mol, and particularly preferably 30 to 45% by mol, with respect to the total amount of constitutional units contained in the cross-linkable group-containing polymer compound of first organic layer, since its hole transportability is excellent.

The constitutional unit represented by the formula (X) includes, for example, constitutional units represented by the formula (X1-1) to the formula (X1-19), and constitutional units represented by the formula (X1-6) to the formula (X1-14) are preferable.

[Chemical Formula 36]

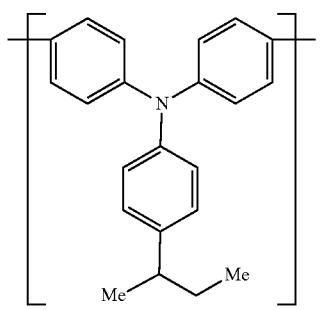
(X1-1)

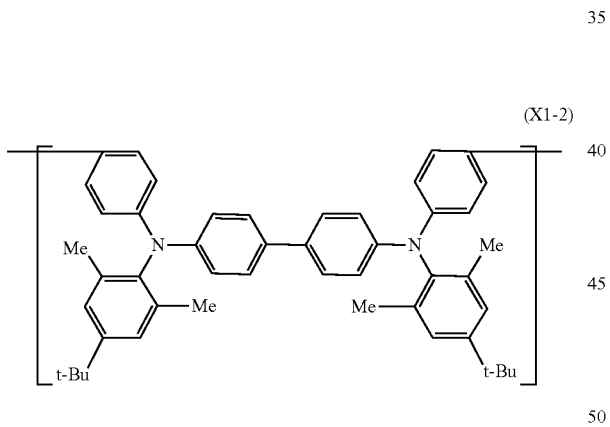
(X1-2)

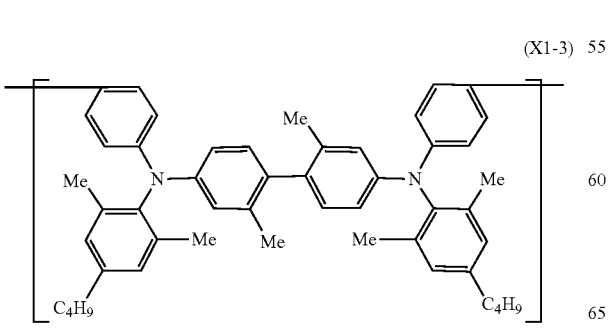
(X1-3)

[Chemical Formula 37]

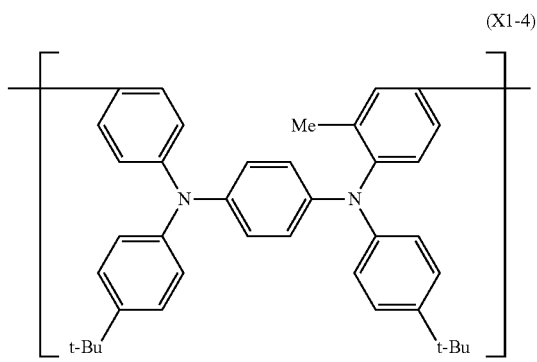
(X1-4)

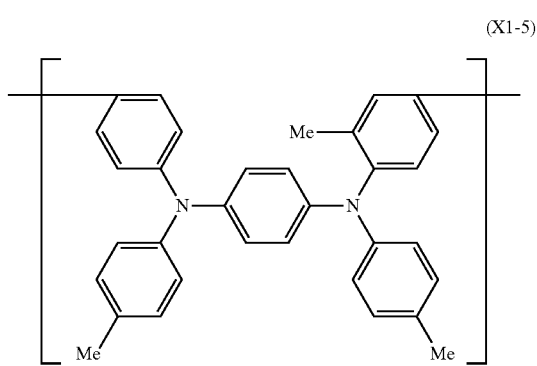
(X1-5)

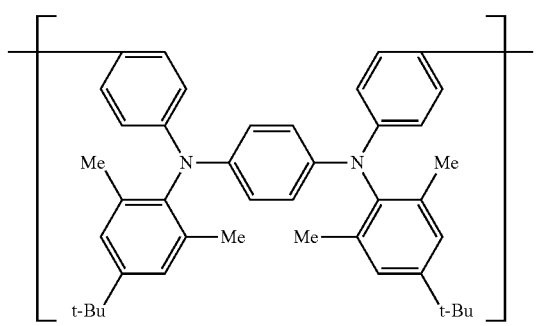
(X1-6)

[Chemical Formula 38]

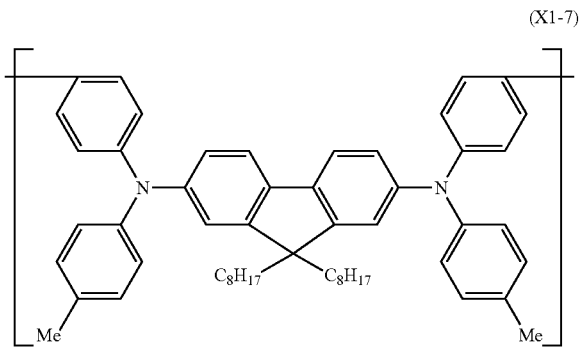
(X1-7)

-continued
(X1-8)
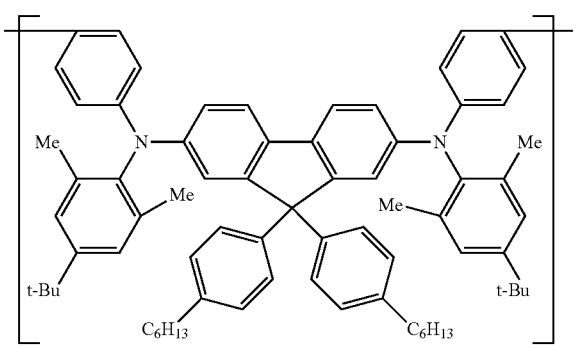
[Chemical Formula 39]
(X1-9)
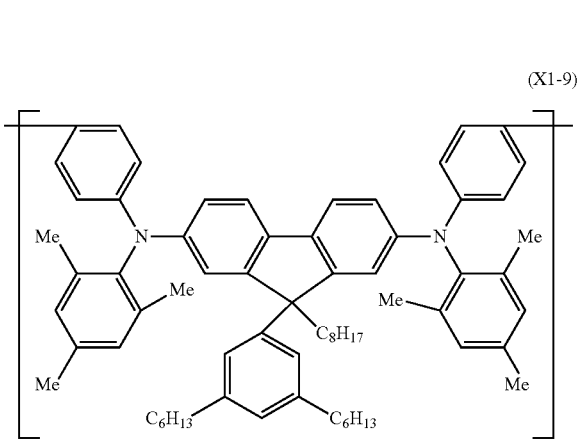
(X1-10)
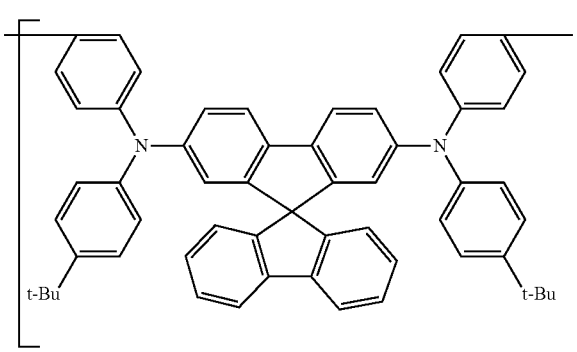
[Chemical Formula 40]
(X1-11)
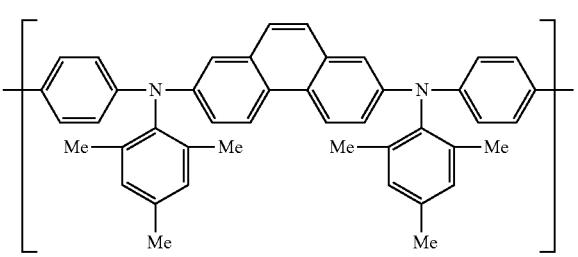
(X1-12)
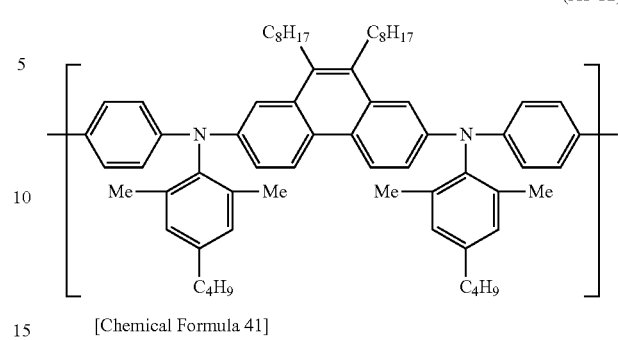
[Chemical Formula 41]
(X1-13)
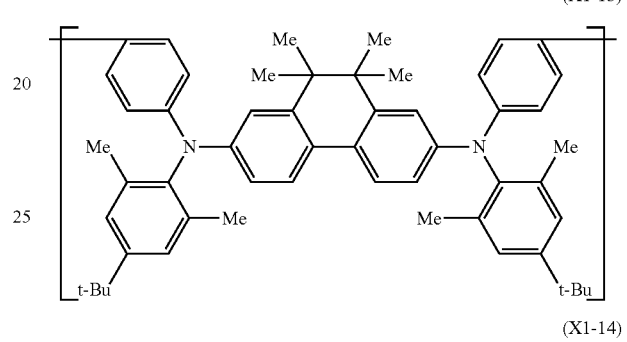
(X1-14)
[Chemical Formula 42]
(X1-15)
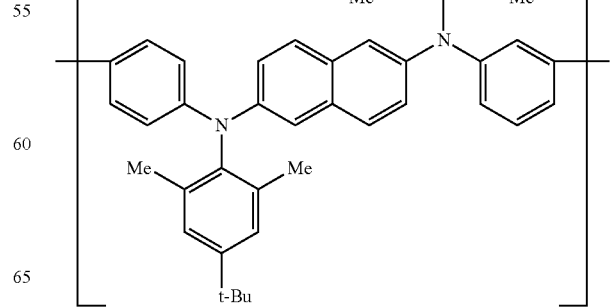

(X1-16)

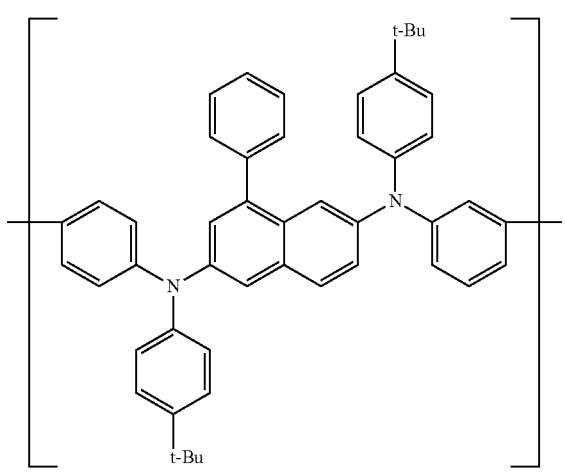

[Chemical Formula 43]

(X1-17)

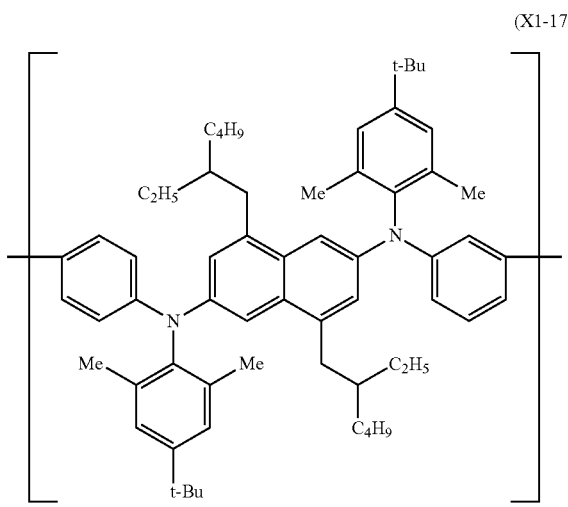

(X1-18)

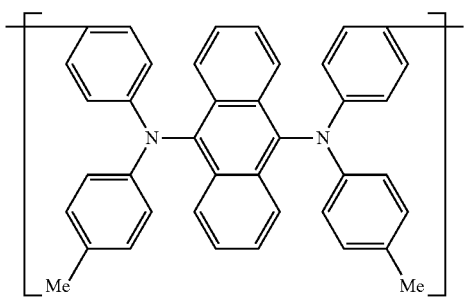

(X1-19)

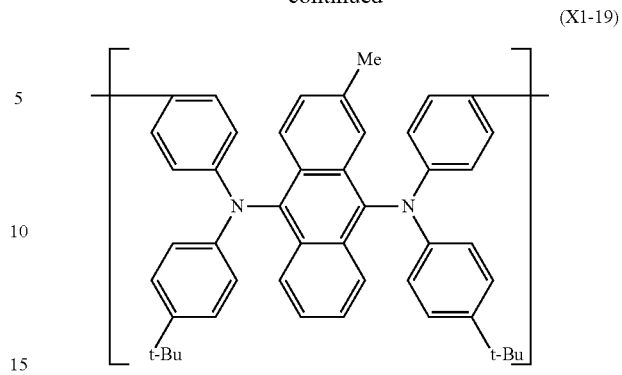

In the cross-linkable group-containing polymer compound of first organic layer, the constitutional unit represented by the formula (X) may be contained singly or in combination of two or more.

It is preferable that the cross-linkable group-containing polymer compound of first organic layer further contains the constitutional unit represented by the formula (Y), since the light emitting device of the present invention is more excellent in light emission efficiency.

It is preferable that the cross-linkable group-containing polymer compound of first organic layer further contains the constitutional unit represented by the formula (X) and the constitutional unit represented by the formula (Y), since hole transportability is excellent and the light emitting device of the present invention is more excellent in light emission efficiency.

$$-\!\!\!+\!\!Ar^{Y1}\!\!\!+\!\!(Y)$$ [Chemical Formula 44]

[in the formula (Y), $Ar^{Y1}$ represents an arylene group, a divalent hetero ring group, or a divalent group in which an arylene group and a divalent hetero ring group are bonded directly, and these groups optionally have a substituent.]

The arylene group represented by $Ar^{Y1}$ is preferably a group represented by the formula (A-1), the formula (A-6), the formula (A-7), the formula (A-9) to the formula (A-11), the formula (A-13) or the formula (A-19), more preferably a group represented by the formula (A-1), the formula (A-7), the formula (A-9) or the formula (A-19), and further preferably a group represented by the formula (A-9). These groups optionally have a substituent.

The divalent hetero ring group represented by $Ar^{Y1}$ is preferably a group represented by the formula (AA-4), the formula (AA-10), the formula (AA-13), the formula (AA-15), the formula (AA-18) or the formula (AA-20), and more preferably a group represented by the formula (AA-4), the formula (AA-10), the formula (AA-18) or the formula (AA-20). These groups optionally have a substituent.

The more preferable ranges and further preferable ranges of the arylene group and the divalent hetero ring group in the divalent group in which an arylene group and a divalent hetero ring group are bonded directly represented by $Ar^{Y1}$ are the same as the more preferable ranges and further preferable ranges of the arylene group and the divalent hetero ring group represented by $Ar^{y1}$ described above, respectively.

The divalent group in which an arylene group and a divalent hetero ring group are bonded directly represented by $Ar^{Y1}$ includes those that are the same as the divalent group in which an arylene group and a divalent hetero ring group are bonded directly represented by $Ar^{X2}$ and $Ar^{X4}$ in the formula (X).

The substituent which the group represented by $Ar^{Y1}$ optionally has is preferably an alkyl group, a cycloalkyl group or an aryl group, and more preferably an aryl group, and these groups optionally further have a substituent.

The constitutional unit represented by the formula (Y) includes, for example, constitutional units represented by the formula (Y-1) to the formula (Y-7), and a constitutional unit represented by the formula (Y-2) is preferable from the standpoint of the light emission efficiency of the light emitting device.

[Chemical Formula 45]

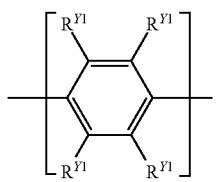

(Y-1)

[in the formula (Y-1), $R^{Y1}$ represents a hydrogen atom, an alkyl group, a cycloalkyl group, an alkoxy group, a cycloalkoxy group, an aryl group or a monovalent hetero ring group, and these groups other than a hydrogen atom optionally have a substituent. A plurality of $R^{Y1}$ may be the same or different, and adjacent $R^{Y1}$ may be combined together to form a ring together with carbon atoms to which they are attached.]

[Chemical Formula 46]

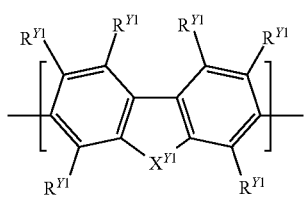

(Y-2)

[in the formula (Y-2), $R^{Y1}$ represents the same meaning as described above.

$X^{Y1}$ represents a group represented by —C($R^{Y2}$)$_2$—, —C($R^{Y2}$)=C($R^{Y2}$)— or C($R^{Y2}$)$_2$—C($R^{Y2}$)$_2$—.

$R^{Y2}$ represents a hydrogen atom, an alkyl group, a cycloalkyl group, an alkoxy group, a cycloalkoxy group, an aryl group or a monovalent hetero ring group, and these groups other than a hydrogen atom optionally have a substituent.

A plurality of $R^{Y2}$ may be the same or different, and $R^{Y2}$ may be combined together to form a ring together with carbon atoms to which they are attached.]

$R^{Y2}$ is preferably an alkyl group, a cycloalkyl group or an aryl group, and more preferably an aryl group. These groups optionally have a substituent.

In $X^{Y1}$, it is preferable for the combination of two $R^{Y2}$ in the group represented by —C($R^{Y2}$)$_2$— that both are alkyl groups or cycloalkyl groups, both are aryl groups, both are monovalent hetero ring groups, or one is an alkyl group or a cycloalkyl group and the other is an aryl group or a monovalent hetero ring group. It is preferable for the combination of two $R^{Y2}$ in the group represented by —C($R^{Y2}$)$_2$— that one is an alkyl group or a cycloalkyl group and the other is an aryl group. These groups optionally have a substituent. Two $R^{Y2}$ may be combined together to form a ring together with atoms to which they are attached. When $R^{Y2}$ forms a ring, the group represented by —C($R^{Y2}$)$_2$— is preferably a group represented by the formula (Y-A1) to the formula (Y-A5). These groups optionally have a substituent.

[Chemical Formula 47]

(Y-A1)

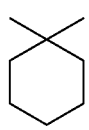

(Y-A2)

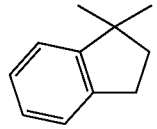

(Y-A3)

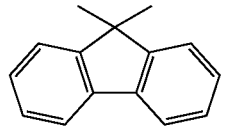

(Y-A4)

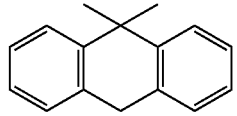

(Y-A5)

In $X^{Y1}$, it is preferable for the combination of two $R^{Y2}$ in the group represented by —C($R^{Y2}$)=C($R^{Y2}$)— that both are alkyl groups or cycloalkyl groups, or one is an alkyl group or a cycloalkyl group and the other is an aryl group. These groups optionally have a substituent.

In $X^{Y1}$, four $R^{Y2}$ in the group represented by —C($R^{Y2}$)$_2$—C($R^{Y2}$)$_2$— are preferably alkyl groups or cycloalkyl groups optionally having a substituent. A plurality of $R^{Y2}$ may be combined together to form a ring together with atoms to which they are attached. When $R^{Y2}$ forms a ring, the group represented by —C($R^{Y2}$)$_2$—C($R^{Y2}$)$_2$— is preferably a group represented by the formula (Y-B1) to the formula (Y-B5). These groups optionally have a substituent.

[Chemical Formula 48]

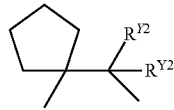

(Y-B1)

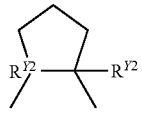

(Y-B2)

-continued

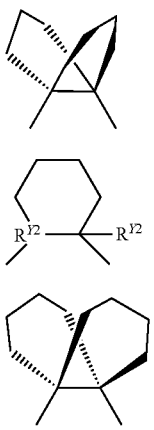

(Y-B3)

(Y-B4)

(Y-B5)

[in the formula (Y-B1), the formula (Y-B2) and the formula (Y-B4), $R^{Y2}$ represents the same meaning as described above.]

[Chemical Formula 49]

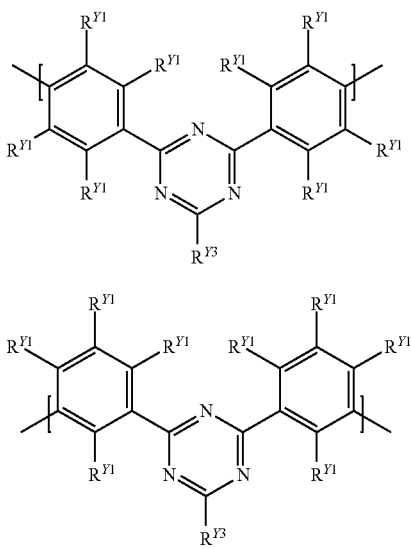

(Y-3)

(Y-4)

[in the formula (Y-3) and the formula (Y-4), $R^{Y1}$ represents the same meaning as described above.

$R^{Y3}$ represents a hydrogen atom, an alkyl group, a cycloalkyl group, an alkoxy group, a cycloalkoxy group, an aryl group or a monovalent hetero ring group, and these groups other than a hydrogen atom optionally have a substituent.]

[Chemical Formula 50]

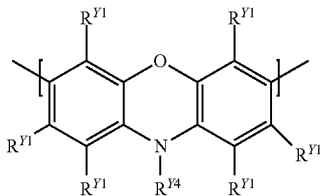

(Y-5)

-continued

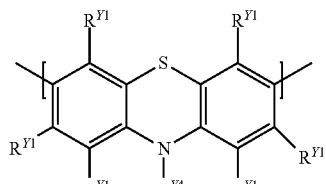

(Y-6)

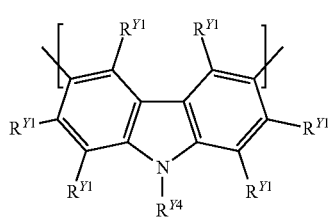

(Y-7)

[in the formula (Y-5) to the formula (Y-7), $R^{Y1}$ represents the same meaning as described above.

$R^{Y4}$ represents a hydrogen atom, an alkyl group, a cycloalkyl group, an alkoxy group, a cycloalkoxy group, an aryl group or a monovalent hetero ring group, and these groups other than a hydrogen atom optionally have a substituent.]

The constitutional unit represented by the formula (Y) includes, for example, constitutional units represented by the formula (Y-11) to the formula (Y-55).

[Chemical Formula 51]

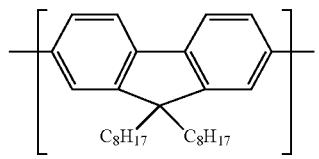

(Y-11)

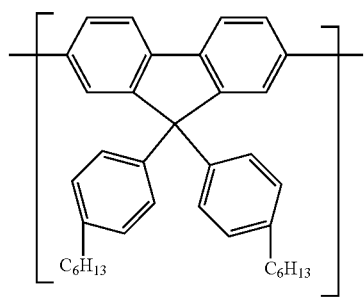

(Y-12)

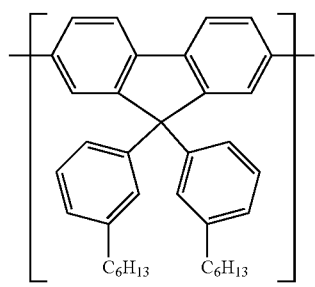

(Y-13)

-continued
[Chemical Formula 52]
(Y-14)
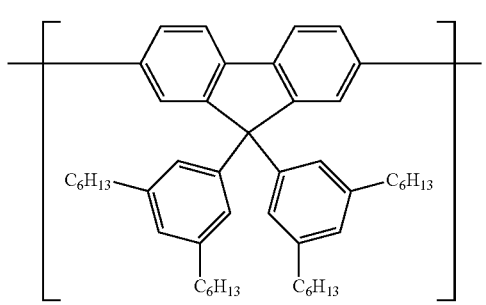
(Y-15)
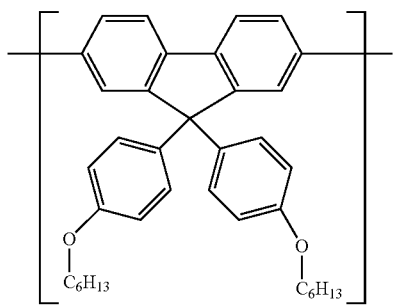
(Y-16)
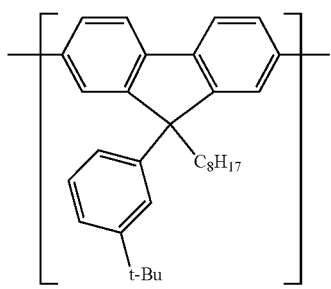
[Chemical Formula 53]
(Y-17)
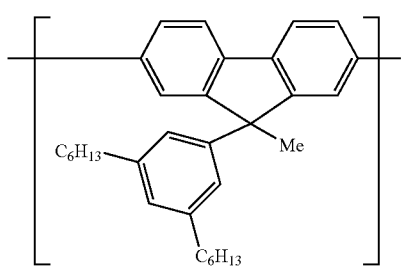
(Y-18)
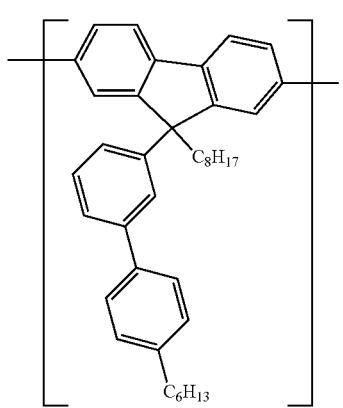
-continued
(Y-19)
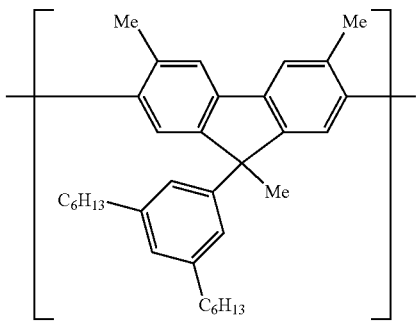
[Chemical Formula 54]
(Y-20)
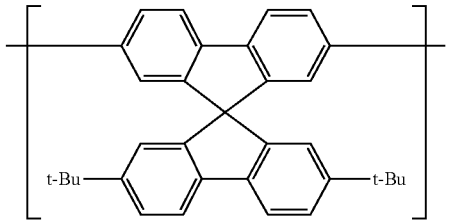
(Y-21)
(Y-22)
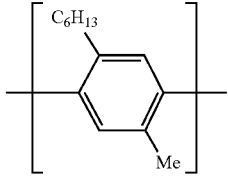
(Y-23)
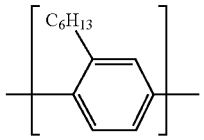
[Chemical Formula 55]
(Y-24)
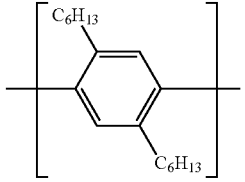
(Y-25)
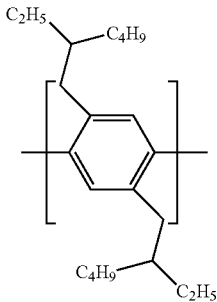

(Y-26)
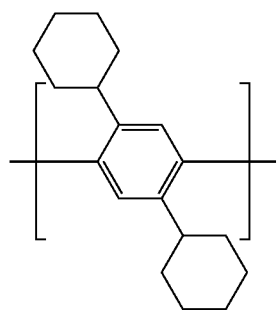
(Y-27)
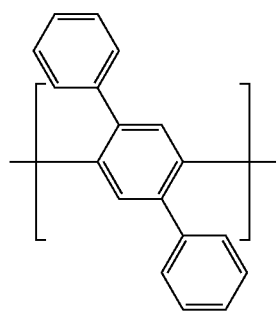
[Chemical Formula 56]
(Y-28)
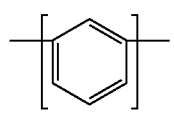
(Y-29)
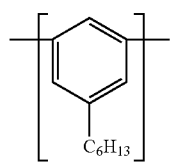
(Y-30)
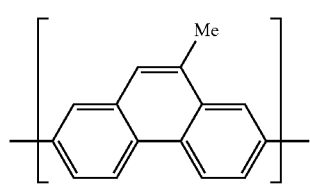
(Y-31)
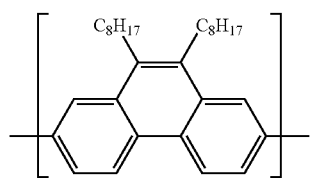
[Chemical Formula 57]
(Y-32)
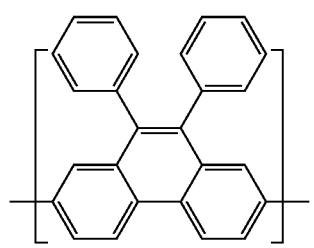
(Y-33)
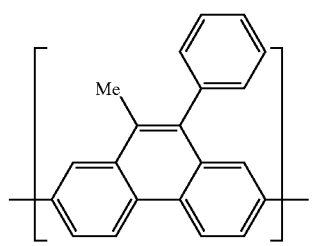
(Y-34)
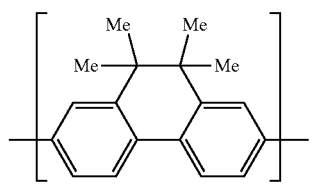
(Y-35)
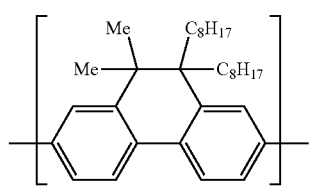
[Chemical Formula 58]
(Y-36)
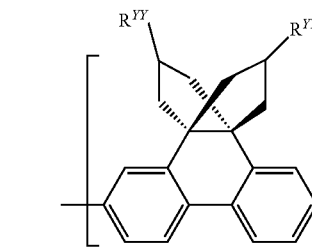
$R^{YY}$ = 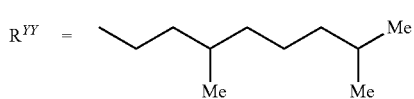
(Y-37)
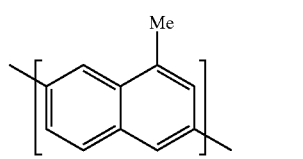
(Y-38)
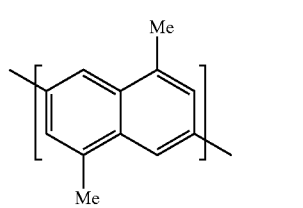
(Y-39)
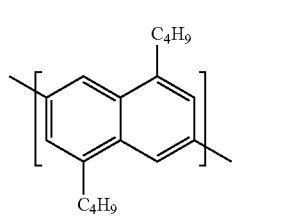

-continued

[Chemical Formula 59]

(Y-40)

(Y-41)

(Y-42)

(Y-43)

-continued (Y-44)

[Chemical Formula 60]

(Y-45)

(Y-46)

(Y-47)

[Chemical Formula 61]

(Y-48)
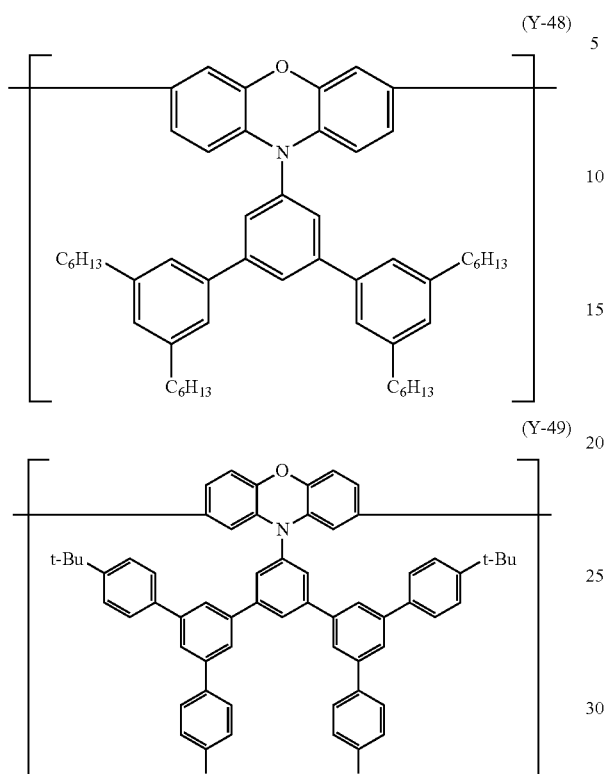

(Y-49)

[Chemical Formula 62]

(Y-50)
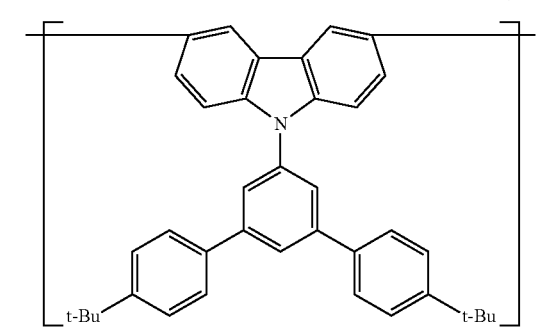

(Y-51)
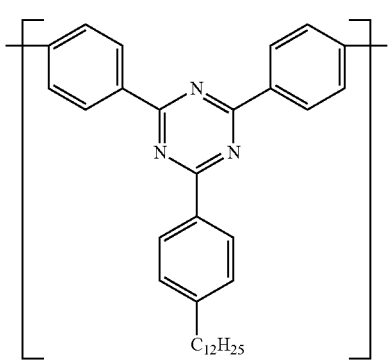

(Y-52)
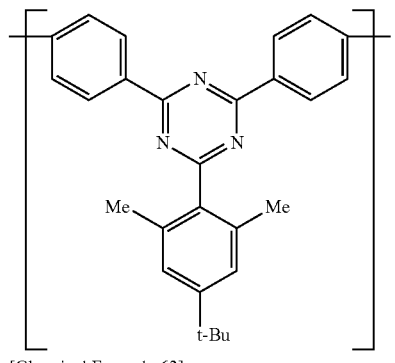

[Chemical Formula 63]

(Y-53)
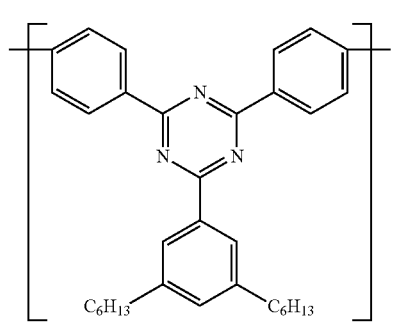

(Y-54)
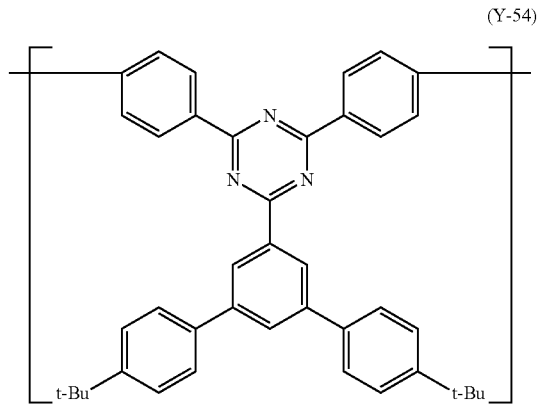

(Y-55)
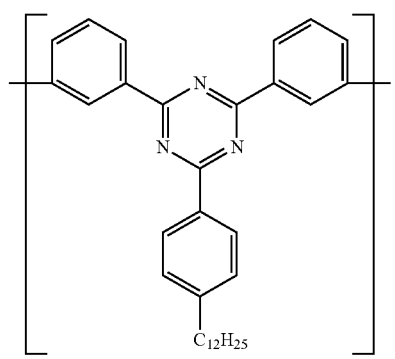

The amount of the constitutional unit in which the cross-linkable group-containing polymer compound of first organic layer contains the constitutional unit represented by the formula (Y) and $Ar^{Y1}$ is an arylene group is preferably 0.5 to 90% by mol, more preferably 30 to 60% by mol, and further preferably 40 to 55% by mol, with respect to the total amount of constitutional units contained in the cross-linkable group-containing polymer compound of first organic layer, since the light emitting device is more excellent in light emission efficiency.

The amount of the constitutional unit represented by the formula (Y) in which $Ar^{Y1}$ is a divalent hetero ring group, or a divalent group in which an arylene group and a divalent hetero ring group are bonded directly is preferably 0.5 to 40% by mol, and more preferably 3 to 30% by mol, with respect to the total amount of constitutional units contained in the cross-linkable group-containing polymer compound of first organic layer, since the cross-linkable group-containing polymer compound of first organic layer is excellent in charge transportability.

The constitutional unit represented by the formula (Y) may be contained singly or in combination of two or more in the cross-linkable group-containing polymer compound of first organic layer.

The cross-linkable group-containing polymer compound of first organic layer includes, for example, polymer compounds P-1 to P-8 shown in the following Table 1. In the table, "other constitutional unit" denotes a constitutional unit other than constitutional units represented by the formula (1), the formula (1'), the formula (1"), the formula (X) and the formula (Y).

TABLE 1

| Polymer compound | Constitutional unit and its molar ratio | | | | |
|---|---|---|---|---|---|
| | Formula (1) p' | Formula (1') q' | Formula (X) r' | Formula (Y) s' | other t' |
| P-1 | 0.1 to 99.9 | 0.1 to 99.9 | 0 | 0 | 0 to 30 |
| P-2 | 0.1 to 99.9 | 0 | 0.1 to 99.9 | 0 | 0 to 30 |
| P-3 | 0.1 to 99.9 | 0 | 0 | 0.1 to 99.9 | 0 to 30 |
| P-4 | 0 | 0.1 to 99.9 | 0.1 to 99.9 | 0 | 0 to 30 |
| P-5 | 0 | 0.1 to 99.9 | 0 | 0.1 to 99.9 | 0 to 30 |
| P-6 | 0.1 to 99.8 | 0.1 to 99.8 | 0.1 to 99.8 | 0 | 0 to 30 |
| P-7 | 0.1 to 99.8 | 0.1 to 99.8 | 0 | 0.1 to 99.8 | 0 to 30 |
| P-8 | 0.1 to 99.7 | 0.1 to 99.7 | 0.1 to 99.7 | 0.1 to 99.7 | 0 to 30 |

[in the table, p', q', r', s' and t' represent the molar ratio of each constitutional unit. p'+q'+r'+s'+t'=100 and 70≤p'+q'+r'+s'≤100.]

The cross-linkable group-containing polymer compound of first organic layer may be any of a block copolymer, a random copolymer, an alternating copolymer and a graft copolymer, and may also be another form, and a copolymer obtained by copolymerizing multiple kinds of raw material monomers is preferred.

The polystyrene-equivalent number-average molecular weight of the cross-linkable group-containing polymer compound of first organic layer is preferably $5 \times 10^3$ to $1 \times 10^6$, more preferably $1 \times 10^4$ to $5 \times 10^5$, and more preferably $1.5 \times 10^4$ to $1 \times 10^5$.

[Production Method of Cross-Linkable Group-Containing Polymer Compound of First Organic Layer]

The cross-linkable group-containing polymer compound of first organic layer can be produced using known polymerization methods described in Chemical Reviews (Chem. Rev.), vol. 109, pp. 897-1091 (2009) and the like, and methods of polymerizing by the coupling reaction using a transition metal catalyst such as the Suzuki reaction, the Yamamoto reaction, the Buchwald reaction, the Stille reaction, the Negishi reaction, the Kumada reaction and the like are exemplified.

In the above-described polymerization method, the method of charging monomers includes a method of charging the entire amount of monomers into the reaction system at once, a method in which a part of the monomers is charged and reacted, and then the remaining monomers are charged in a batch, continuously or dividedly, a method of charging monomers continuously or dividedly, and the like.

The transition metal catalyst includes palladium catalysts, nickel catalysts or the like.

The post treatment of the polymerization reaction is performed using known methods, for example, a method of removing water-soluble impurities by liquid separation, a method in which the reaction liquid after the polymerization reaction is added to a lower alcohol such as methanol and the like, and the deposited precipitate is filtrated before drying, and the like, singly or in combination. When the purity of the cross-linkable group-containing polymer compound of first organic layer is low, it can be purified by usual methods such as, for example, recrystallization, reprecipitation, continuous extraction with a Soxhlet extractor, column chromatography and the like.

<Phosphorescent Transition Metal Complex>

The phosphorescent transition metal complex contained in the first organic layer in a light emitting device according to one embodiment of the present invention will be explained.

"The phosphorescent transition metal complex" usually means a compound that exhibits a phosphorescent property at room temperature (25° C.), and is preferably a metal complex that exhibits light emission from the triplet excited state at room temperature. The metal complex exhibiting light emission from the triplet excited state has the central metal atom and a ligand.

The central metal atom includes, for example, a metal atom having an atomic number of 40 or more, which has a spin-orbit interaction when formed into a complex and can cause an intersystem crossing between a singlet state and a triplet state. The metal atom includes, for example, a ruthenium atom, a rhodium atom, a palladium atom, an iridium atom and a platinum atom. It is preferably an iridium atom or a platinum atom, and more preferably an iridium atom, since the light emitting device is more excellent in light emission efficiency.

The ligand includes, for example, a ligand that forms at least one bond selected from the group consisting of a coordination bond and a covalent bond with the central metal atom. Examples of the bond between the central metal atom and the ligand include a metal-nitrogen bond, a metal-carbon bond, a metal-oxygen bond, a metal-phosphorus bond, a metal-sulfur bond and a metal-halogen bond. The ligand includes a neutral or anionic monodentate ligand and a neutral or anionic polydentate ligand. The polydentate ligand usually means a bidentate or more and hexadentate or less ligand.

The phosphorescent transition metal complex is preferably the metal complex represented by the formula (2), since the light emitting device is more excellent in light emission efficiency.

[Chemical Formula 64]

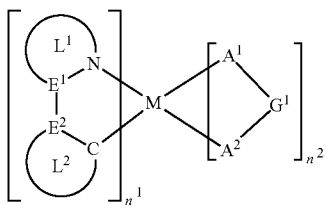

(2)

[in the formula (2), M represent the same meaning as described above.

$n^1$ represents an integer of 1 or more, $n^2$ represents an integer of 0 or more. $n^1+n^2$ is 3 when M is a ruthenium atom, a rhodium atom or an iridium atom, while $n^1+n^2$ is 2 when M is a palladium atom or a platinum atom.

$E^1$ and $E^2$ each independently represent a carbon atom or a nitrogen atom. However, at least one of $E^1$ and $E^2$ is a carbon atom. When a plurality of $E^1$ and $E^2$ are present, they may be the same or different at each occurrence.

Ring $L^1$ represents an aromatic hetero ring, and this ring optionally has a substituent. When a plurality of the above-described substituents are present, the plurality of the substituents may be combined together to form a ring together with atoms to which they are attached. When a plurality of Ring $L^1$ are present, they may be the same or different.

Ring $L^2$ represents an aromatic hydrocarbon ring or an aromatic hetero ring, and these rings optionally have a substituent. When a plurality of the above-described substituents are present, the plurality of the substituents may be combined together to form a ring together with atoms to which they are attached. When a plurality of Ring $L^2$ are present, they may be the same or different.

The substituent which Ring $L^1$ optionally has and the substituent which Ring $L^2$ optionally has may be combined together to form a ring together with atoms to which they are attached.

$A^1$-$G^1$-$A^2$ represents an anionic bidentate ligand. $A^1$ and $A^2$ each independently represent a carbon atom, an oxygen atom or a nitrogen atom, these atoms may be ring-constituent atoms. $G^1$ represents a single bond or an atomic group constituting a bidentate ligand together with $A^1$ and $A^2$. When a plurality of $A^1$-$G^1$-$A^2$ are present, they may be the same or different.]

M is preferably an iridium atom or a platinum atom, and more preferably an iridium atom, since the light emitting device is more excellent in current luminance efficiency. The current luminance efficiency means luminance (cd/A) per unit current.

When M is a ruthenium atom, a rhodium atom or an iridium atom, $n^1$ is preferably 2 or 3, and more preferably 3.

When M is a palladium atom or a platinum atom, $n^1$ is preferably 2.

$E^1$ and $E^2$ are each preferably a carbon atom.

The number of carbon atoms of the aromatic hetero ring represented by Ring $L^1$, not including the number of carbon atoms of the substituent, is usually 2 to 60, preferably 3 to 30, and more preferably 4 to 15. Ring $L^1$ is preferably a 5-membered aromatic hetero ring or a 6-membered aromatic hetero ring. Ring $L^1$ is more preferably a 5-membered aromatic hetero ring having 2 or more and 4 or less nitrogen atoms as the constituent atom or a 6-membered aromatic hetero ring having 1 or more and 4 or less nitrogen atoms as the constituent atom. These rings optionally have a substituent. When Ring $L^1$ is a 6-membered aromatic hetero ring, $E^1$ is preferably a carbon atom.

Ring $L^1$ includes, for example, a diazole ring, a triazole ring, a tetrazole ring, a pyridine ring, a diazabenzene ring, a triazine ring, an azanaphthalene ring and a diazanaphthalene ring, and is preferably a pyridine ring, a diazabenzene ring, an azanaphthalene ring, a diazanaphthalene ring, a triazole ring or a diazole ring, more preferably a pyridine ring, a diazabenzene ring, an azanaphthalene ring, a diazanaphthalene ring, and further preferably a pyridine ring, a quinoline ring or an isoquinoline ring, and these rings optionally have a substituent.

The number of carbon atoms of the aromatic hydrocarbon ring represented by Ring $L^2$, not including the number of carbon atoms of the substituent, is usually 6 to 60, preferably 6 to 30, and more preferably 6 to 18. The aromatic hydrocarbon ring represented by Ring $L^2$ includes a benzene ring, a naphthalene ring, an indene ring, a fluorene ring, a phenanthrene ring and a dihydrophenanthrene ring, and rings obtained by condensing 2 or more and 5 or less these rings, and preferable is a benzene ring, a naphthalene ring, a fluorene ring, a phenanthrene ring or a dihydrophenanthrene ring, more preferable is a benzene ring, a fluorene ring or a dihydrophenanthrene ring, and further preferable is a benzene ring, since the light emitting device is more excellent in external quantum efficiency. These rings optionally have a substituent.

The number of carbon atoms of the aromatic hetero ring represented by Ring $L^2$, not including the number of carbon atoms of the substituent, is usually 2 to 60. The aromatic hetero ring represented by Ring $L^2$ includes a pyrrole ring, a diazole ring, a furan ring, a thiophene ring, a pyridine ring and a diazabenzene ring, and rings obtained by condensing 1 or more and 5 or less aromatic rings to these rings. These rings optionally have a substituent.

Ring $L^2$ is preferably a benzene ring, a fluorene ring, a dihydrophenanthrene ring, a pyridine ring, a diazabenzene ring, a carbazole ring, a dibenzofuran ring or a dibenzothiophene ring, more preferably a benzene ring, a pyridine ring or a diazabenzene ring, and further preferably a benzene ring, since the light emitting device is further excellent in external quantum efficiency. These rings optionally have a substituent.

The substituent which Ring $L^1$ and Ring $L^2$ optionally have is preferably an alkyl group, a cycloalkyl group, an alkoxy group, a cycloalkoxy group, an aryl group, an aryloxy group, a monovalent hetero ring group, a substituted amino group or a halogen atom, more preferably an alkyl group, a cycloalkyl group, an aryl group, a monovalent hetero ring group or a substituted amino group, further preferably an alkyl group, an aryl group or a monovalent hetero ring group, and particularly preferably an aryl group or a monovalent hetero ring group. These groups optionally further have a substituent.

In the metal complex represented by the formula (2), at least one of Ring $L^1$ and Ring $L^2$ has preferably a substituent, since the light emitting device is more excellent in current luminance efficiency.

The aryl group as the substituent which Ring $L^1$ and Ring $L^2$ optionally have is preferably a phenyl group, a naphthyl group, a phenthrenyl group, a dihydrophenthrenyl group or a fluorenyl group. The aryl group as the substituent which Ring $L^1$ and Ring $L^2$ optionally have is preferably a phenyl group or a fluorenyl group, and further preferably a phenyl group. These groups optionally have a substituent.

The monovalent hetero ring group as the substituent which Ring L¹ and Ring L² optionally have is preferably a pyridyl group, a pyrimidinyl group, a triazinyl group, a quinolinyl group, an isoquinolinyl group, a dibenzofuranyl group, a dibenzothienyl group, a carbazolyl group, a azacarbazolyl group, a diazacarbazolyl group, a phenoxazinyl group or a phenothiazinyl group, more preferably a pyridyl group, a pyrimidinyl group, a triazinyl group, a dibenzofuranyl group, a dibenzothienyl group or a carbazolyl group, further preferably a pyridyl group, a pyrimidinyl group or a triazinyl group, and particularly preferably a triazinyl group. These groups optionally have a substituent.

The substituent which the substituent which Ring L¹ and Ring L² optionally have optionally further has is preferably an alkyl group, a cycloalkyl group, an aryl group, a monovalent hetero ring group or a substituted amino group, more preferably an alkyl group, a cycloalkyl group or an aryl group, and further preferably an alkyl group. These groups optionally further have a substituent.

The aryl group, the monovalent hetero ring group or the substituted amino group as the substituent which Ring L¹ and Ring L² optionally have is, for example, preferably a group represented by the formula (D-A1) to the formula (D-A5) or the formula (D-B1) to the formula (D-B3), more preferably a group represented by the formula (D-A1), the formula (D-A3) to the formula (D-A5) or the formula (D-B1), further preferably a group represented by the formula (D-A1), the formula (D-A3) or the formula (D-A5), and particularly preferably a group represented by the formula (D-A1) or the formula (D-A3), since the light emitting device is more excellent in external quantum efficiency.

[Chemical Formula 65]

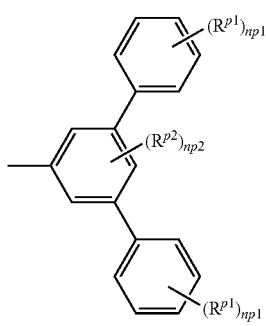

(D-A1)

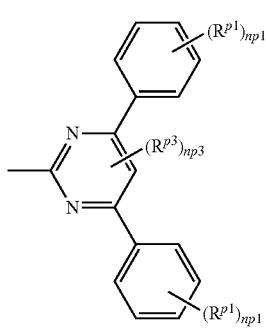

(D-A2)

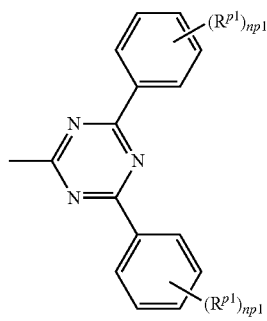

(D-A3)

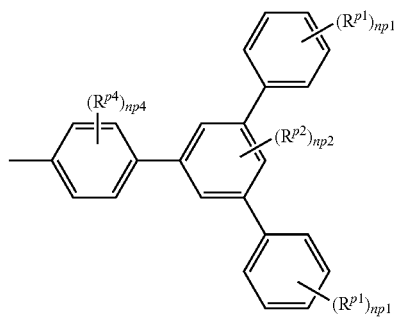

(D-A4)

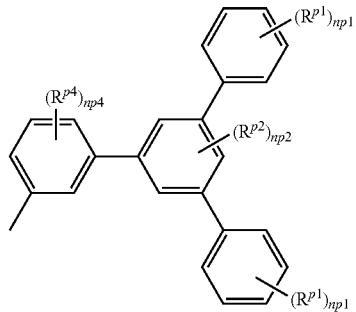

(D-A5)

[Chemical Formula 66]

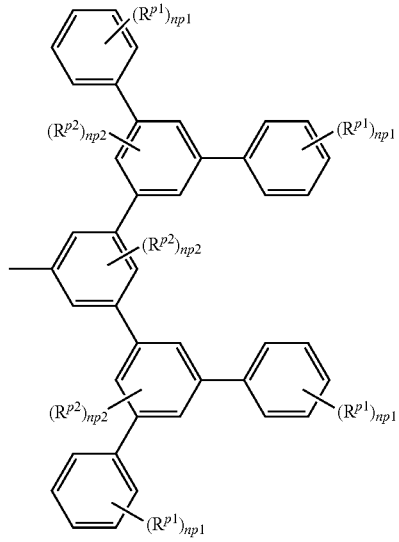

(D-B1)

-continued (D-B2)

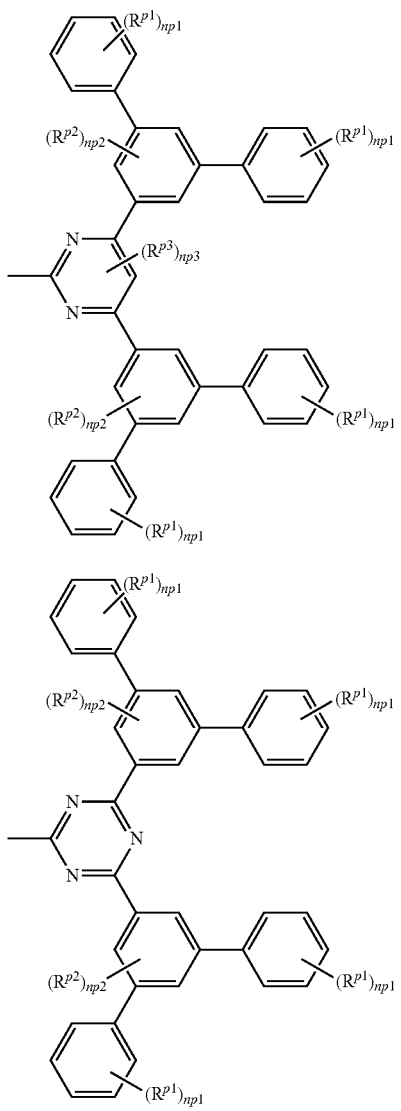

(D-B3)

[wherein, $R^{p1}$ to $R^{p4}$ each independently represent an alkyl group, a cycloalkyl group, an alkoxy group, a cycloalkoxy group or a halogen atom. When a plurality of $R^{p1}$, $R^{p2}$ and $R^{p4}$ are present, they may be the same or different at each occurrence.

np1 represents an integer of 0 to 5, np2 represents an integer of 0 to 3, np3 represents 0 or 1, and np4 represents an integer of 0 to 4. When a plurality of np1 and np2 are present, they may be the same or different at each occurrence.]

When a plurality of substituents which Ring $L^1$ optionally has are present, it is preferable that they are not combined together to form a ring together with atoms to which they are attached. When a plurality of substituents which Ring $L^2$ optionally has are present, it is preferable that they are not combined together to form a ring together with atoms to which they are attached. It is preferable that the substituent which Ring $L^1$ optionally has and the substituent which Ring $L^2$ optionally has are not combined together to form a ring together with atoms to which they are attached.

[Anionic Bidentate Ligand]

The anionic bidentate ligand represented by $A^1$-$G^1$-$A^2$ includes, for example, ligands represented by the formula (a-101) to the formula (a-109). However, the anionic bidentate ligand represented by $A^1$-$G^1$-$A^2$ is different from a ligand of which number is defined by the suffix $n^1$.

[Chemical Formula 67]

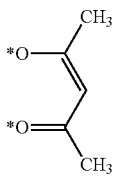
(a-101)

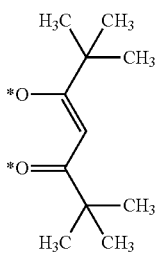
(a-102)

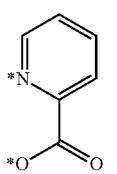
(a-103)

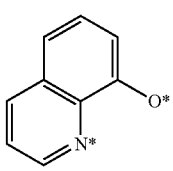
(a-104)

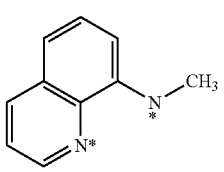
(a-105)

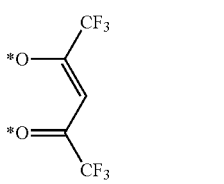
(a-106)

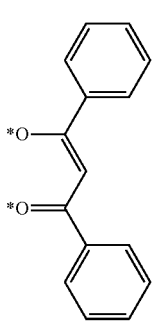
(a-107)

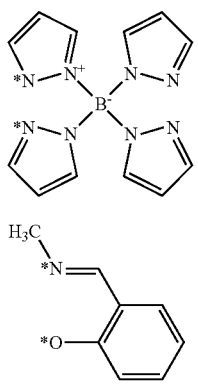

(a-108)

(a-109)

[in the formula (a-101) to the formula (a-109), an atom marked with * represents a coordination atom.]

The metal complex represented by the formula (2) is preferably a metal complex represented by the above-described formula (1-A), since the light emitting device is more excellent in light emission efficiency.

[Chemical Formula 68]

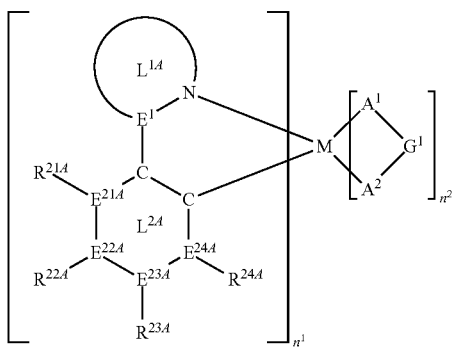

(1-A)

Ring $L^{1A}$ is preferably a pyridine ring, a quinoline ring or an isoquinoline ring, since the light emitting device is more excellent in light emission efficiency. These rings optionally have a substituent.

The examples and preferable ranges of the substituent which Ring $L^{1A}$ optionally has are the same as the examples and preferable ranges of the substituent which Ring $L^1$ and Ring $L^2$ optionally have.

When a plurality of substituents which Ring $L^{1A}$ optionally has are present, it is preferable that they are not combined together to form a ring together with atoms to which they are attached.

Ring $L^{2A}$ is preferably a benzene ring.

$E^{21A}$ to $E^{24A}$ are each preferably a carbon atom.

$R^{21A}$ to $R^{24A}$ are each preferably a hydrogen atom, an alkyl group or an aryl group, since the light emitting device is more excellent in external quantum efficiency. These groups other than a hydrogen atom optionally have a substituent.

$R^{21A}$ and $R^{24A}$ are each further preferably a hydrogen atom. $R^{22A}$ is further preferably a hydrogen atom or an aryl group optionally having a substituent. $R^{23A}$ is further preferably a hydrogen atom or an alkyl group optionally having a substituent.

In the metal complex represented by the formula (1-A), it is preferable that at least one of Ring $L^{1A}$ has a substituent, or at least one of $R^{21A}$ to $R^{24A}$ is an alkyl group, a cycloalkyl group, an alkoxy group, a cycloalkoxy group, an aryl group, an aryloxy group, a monovalent hetero ring group, a substituted amino group or a halogen atom, since the light emitting device is more excellent in light emission efficiency.

When at least one of $R^{21A}$ to $R^{24A}$ is an alkyl group, a cycloalkyl group, an alkoxy group, a cycloalkoxy group, an aryl group, an aryloxy group, a monovalent hetero ring group, a substituted amino group or a halogen atom, it is preferable that at least one of $R^{22A}$ and $R^{23A}$ is an alkyl group, a cycloalkyl group, an alkoxy group, a cycloalkoxy group, an aryl group, an aryloxy group, a monovalent hetero ring group, a substituted amino group or a halogen atom, and it is more preferably an alkyl group, a cycloalkyl group, an aryl group, a monovalent hetero ring group or a substituted amino group, since the light emitting device is more excellent in external quantum efficiency. These groups optionally have a substituent.

The examples and preferable ranges of the aryl group, the monovalent hetero ring group and the substituted amino group represented by $R^{21A}$ to $R^{24A}$ are the same as the examples and preferable ranges of the aryl group, the monovalent hetero ring group and the substituted amino group as the substituent which Ring $L^1$ and Ring $L^2$ optionally have, respectively.

The examples and preferable ranges of the substituent which $R^{21A}$ to $R^{24A}$ optionally have are the same as the examples and preferable ranges of the substituent which the substituent which Ring $L^1$ and Ring $L^2$ optionally have optionally further has.

It is preferable that $R^{21A}$ and $R^{22A}$, $R^{22A}$ and $R^{23A}$, $R^{23A}$ and $R^{24A}$, and a substituent which Ring $L^{1A}$ optionally has and $R^{21A}$ are not combined together to form a ring together with atoms to which they are attached.

The metal complex represented by the formula (1-A) is preferably a metal complex represented by the above-described formula (1-B1) to the above-described formula (1-B5), more preferably a metal complex represented by the above-described formula (1-B1) to the above-described formula (1-B3), and further preferably a metal complex represented by the above-described formula (1-B3), since the light emitting device is more excellent in light emission efficiency.

[Chemical Formula 69]

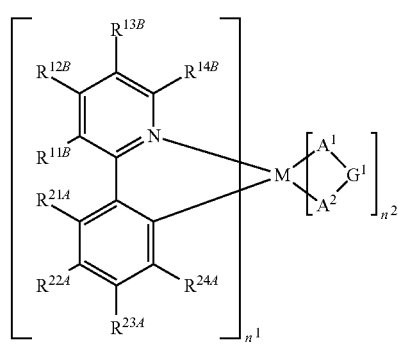

(1-B1)

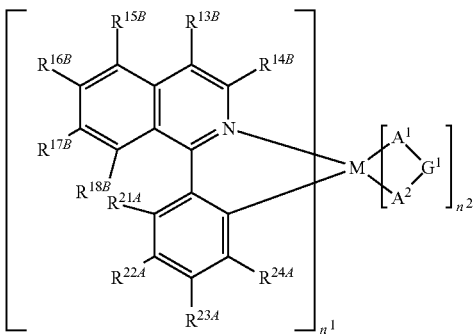
(1-B2)

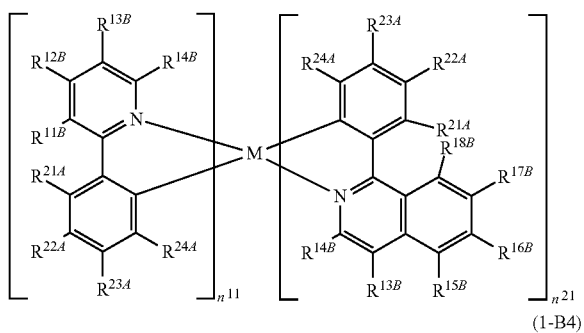
(1-B3)

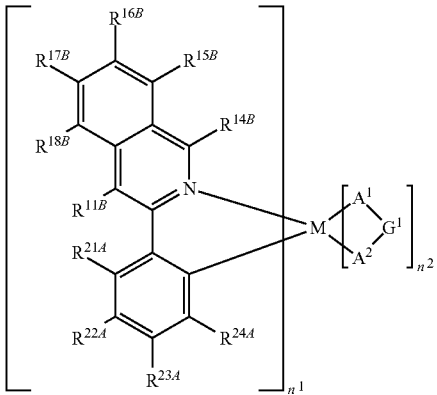
(1-B4)

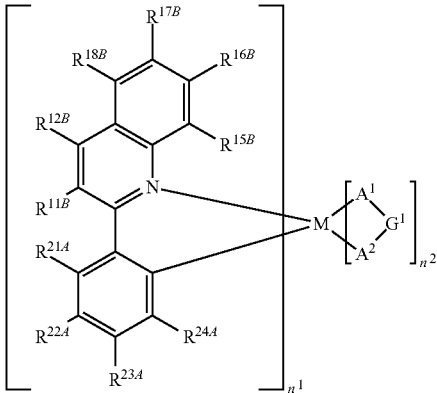
(1-B5)

[Metal complexes represented by the formula (1-B1) to the formula (1-B5)]

$R^{11B}$ to $R^{18B}$ are each preferably a hydrogen atom, an alkyl group, a cycloalkyl group, an aryl group, a monovalent hetero ring group or a substituted amino group, and more preferably a hydrogen atom, an alkyl group, an aryl group or a monovalent hetero ring group, since the light emitting device is more excellent in light emission efficiency, and these groups other than a hydrogen atom optionally have a substituent.

$R^{11B}$ and $R^{14B}$ to $R^{18B}$ are each preferably a hydrogen atom or an alkyl group, and more preferably a hydrogen atom, since synthesis of the metal complex is easy. These groups other than a hydrogen atom optionally have a substituent.

$R^{12B}$ is preferably a hydrogen atom, since the light emitting device is further excellent in light emission efficiency.

$R^{13B}$ is preferably a hydrogen atom, an aryl group or a monovalent hetero ring group, since the light emitting device is further excellent in light emission efficiency, and these groups other than a hydrogen atom optionally have a substituent.

The examples and preferable ranges of the aryl group, the monovalent hetero ring group and the substituted amino group represented by $R^{11B}$ to $R^{18B}$ are the same as the examples and preferable ranges of the aryl group, the monovalent hetero ring group and the substituted amino group as the substituent which Ring $L^1$ and Ring $L^2$ optionally have, respectively.

The examples and preferable ranges of the substituent which $R^{11B}$ to $R^{19B}$ optionally have are the same as the examples and preferable ranges of the substituent which the substituent which Ring $L^1$ and Ring $L^2$ optionally have optionally further has.

In the formula (1-B1) to the formula (1-B5), at least one of $R^{11B}$ to $R^{14B}$, $R^{11B}$ to $R^{18B}$ and $R^{21A}$ to $R^{24A}$ is preferably an alkyl group, a cycloalkyl group, an alkoxy group, a cycloalkoxy group, an aryl group, an aryloxy group, a monovalent hetero ring group, a substituted amino group or a halogen atom, at least one of $R^{12B}$, $R^{13B}$, $R^{22A}$ and $R^{23A}$ is more preferably an alkyl group, a cycloalkyl group, an alkoxy group, a cycloalkoxy group, an aryl group, an aryloxy group, a monovalent hetero ring group, a substituted amino group or a halogen atom, and at least one of $R^{13B}$, $R^{22A}$ and $R^{21A}$ is further preferably an alkyl group, a cycloalkyl group, an aryl group, a monovalent hetero ring group or a substituted amino group, since the light emitting device is more excellent in light emission efficiency. These groups optionally have a substituent.

In the formula (1-B1) to the formula (1-B5), it is preferable that $R^{11B}$ and $R^{12B}$, $R^{12B}$ and $R^{13B}$, $R^{13B}$ and $R^{14B}$, $R^{11B}$ and $R^{21A}$, $R^{11B}$ and $R^{15B}$, $R^{15B}$ and $R^{16B}$, $R^{16B}$ and $R^{17B}$, $R^{17B}$ and $R^{18B}$, R1B and $R^{21A}$, $R^{11B}$ and $R^{18B}$, $R^{14B}$ and $R^{15B}$, and $R^{12B}$ and $R^{18B}$ are not combined together to form a ring together with atoms to which they are attached.

The phosphorescent transition metal complex includes, for example, metal complexes represented by the following formulae.

[Chemical Formula 70]

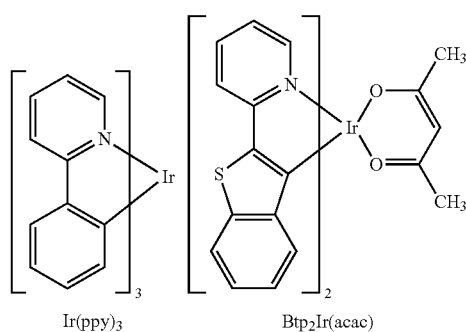

Ir(ppy)$_3$      Btp$_2$Ir(acac)

-continued
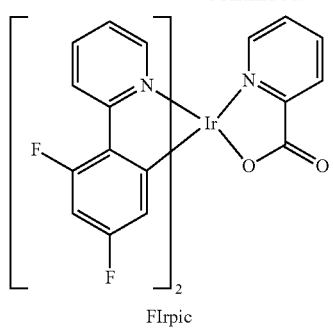
FIrpic
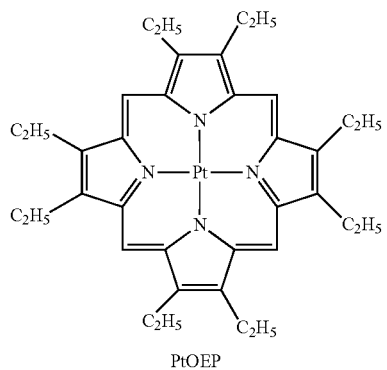
PtOEP
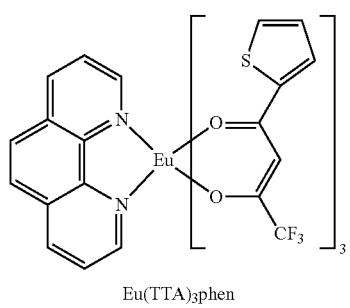
Eu(TTA)₃phen
[Chemical Formula 71]
COM-1
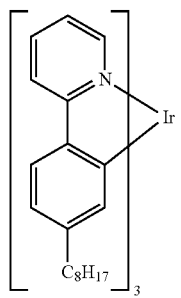
COM-2
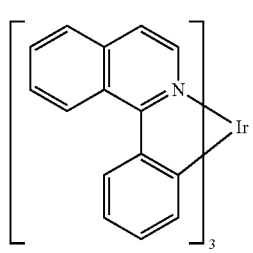
-continued
COM-3
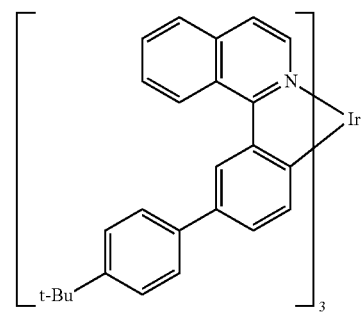
COM-4
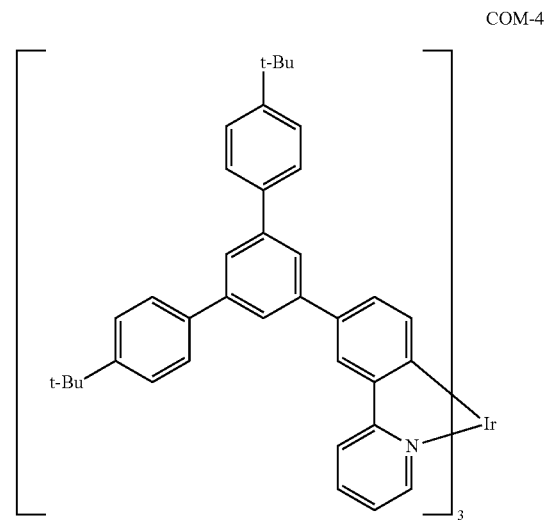
COM-5
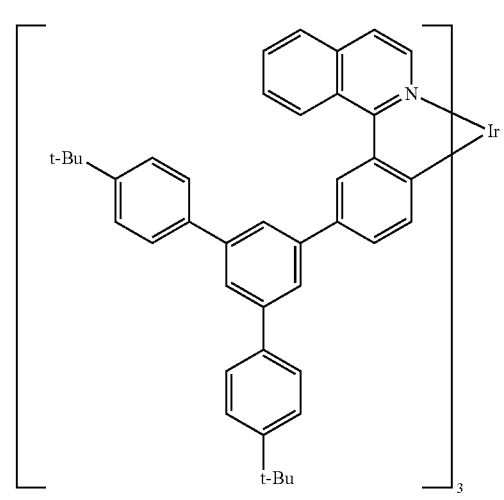

[Chemical Formula 72]
COM-6
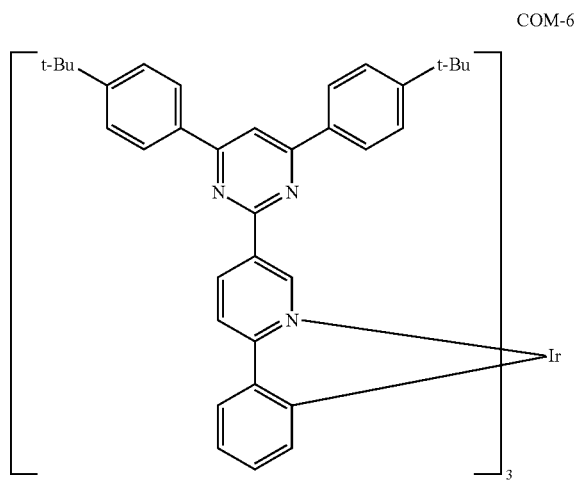
COM-7
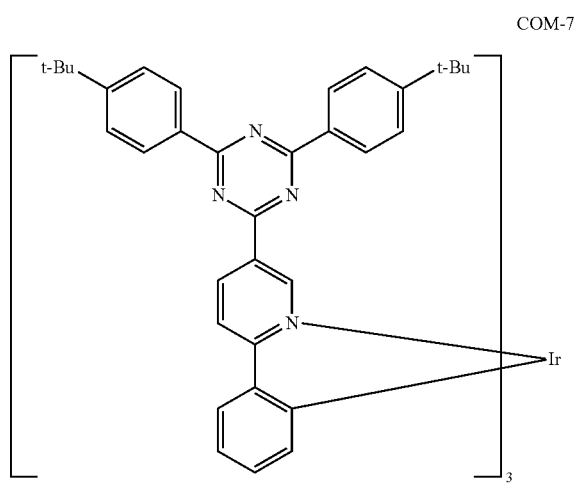
COM-8
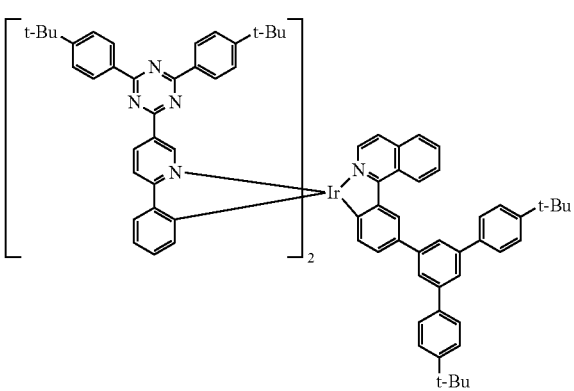
[Chemical Formula 73]
COM-9
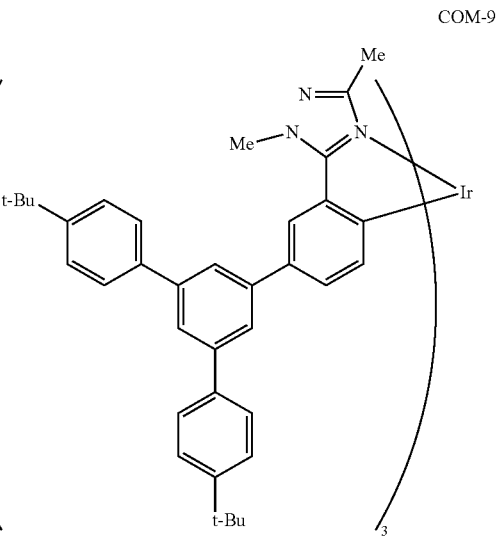
COM-10
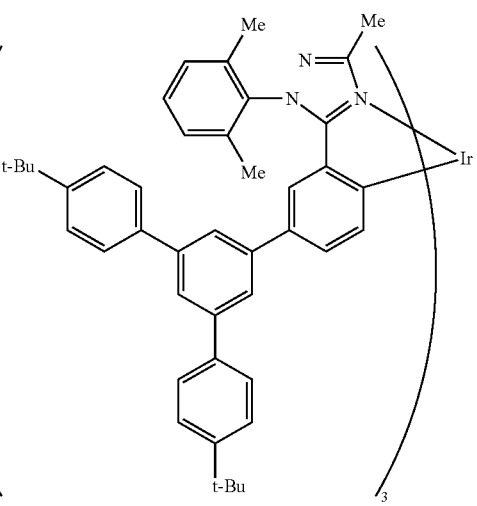
COM-11
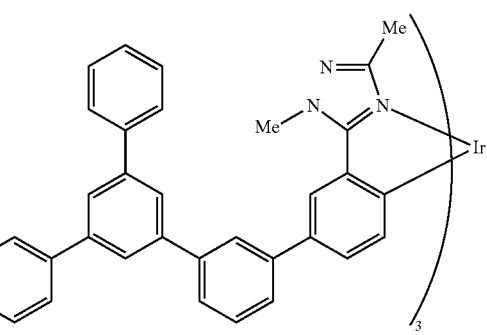

-continued
COM-12
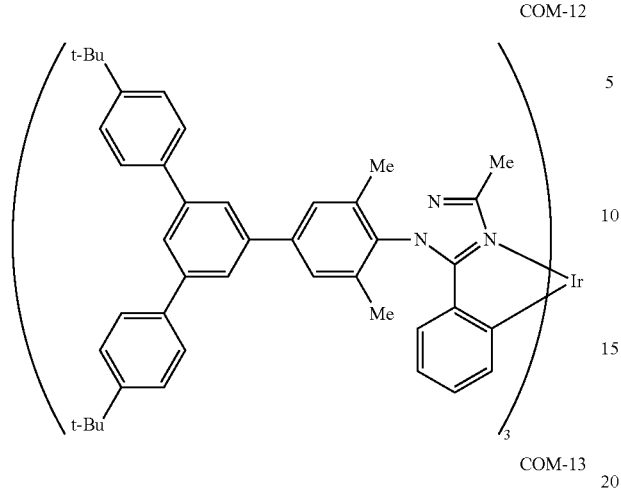
COM-13
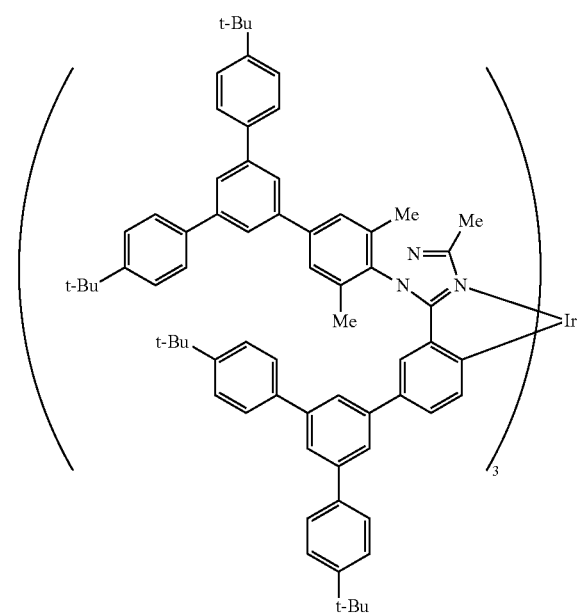
[Chemical Formula 74]
COM-14
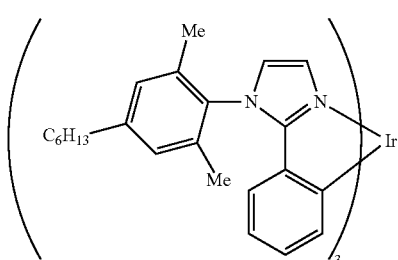
COM-15
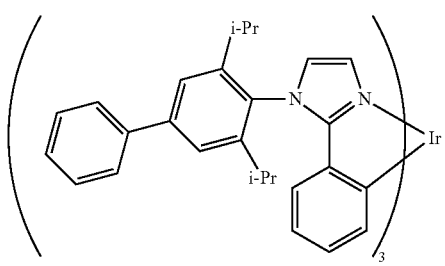
-continued
COM-16
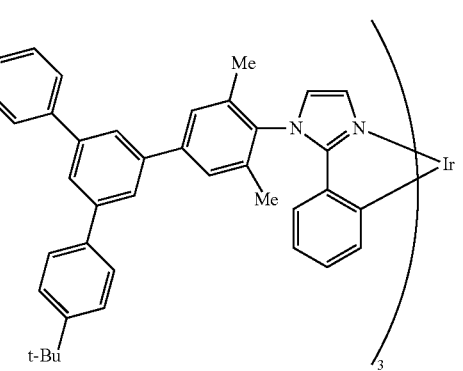
COM-17
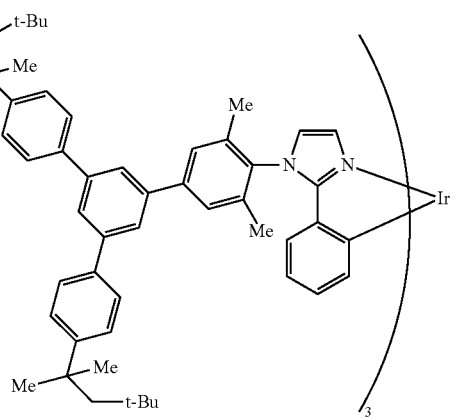
COM-18
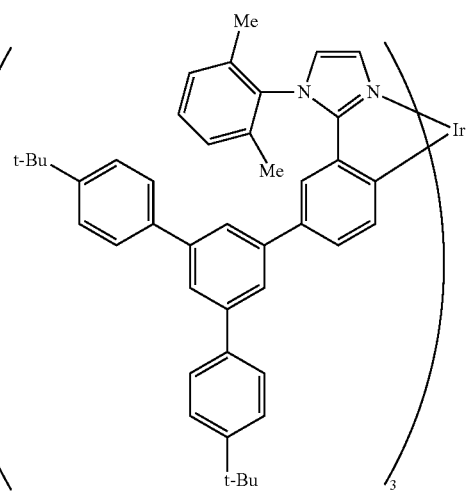

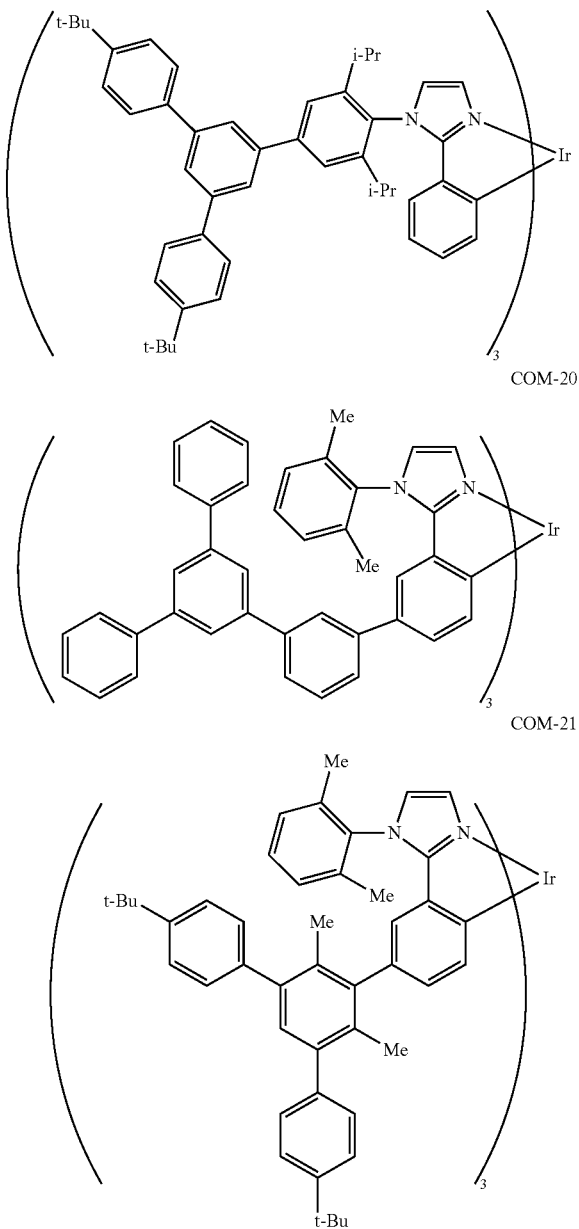

COM-19

COM-20

COM-21

The phosphorescent transition metal complex is available from Aldrich, Luminescence Technology Corp., American Dye Source and the like. The phosphorescent transition metal complex can also be produced by known methods described in literatures such as "Journal of the American Chemical Society, Vol. 107, 1431-1432 (1985)", "Journal of the American Chemical Society, Vol. 106, 6647-6653 (1984)", Japanese Translation of PCT International Application Publication (JP-T) No. 2004-530254, JP-A No. 2008-179617, JP-A No. 2011-105701, JP-T No. 2007-504272, International Publication WO2006/121811, JP-A No. 2013-147450, JP-A No. 2014-224101 and the like.

[Host Material]

When the first organic layer according to one embodiment of the present invention further contains a host material having at least one function selected from the group consisting of hole injectability, hole transportability, electron injectability and electron transportability, the light emitting device is particularly excellent in light emission efficiency. In the first organic layer according to one embodiment of the present invention, the host materials may be contained singly or in combination.

The content of the phosphorescent transition metal complex contained in the first organic layer is usually 0.05 to 80 parts by mass, preferably 0.1 to 50 parts by mass, more preferably 0.5 to 40 parts by mass, and further preferably 1 to 10 parts by weight, when the sum of the host material and the metal complex of the first organic layer is taken as 100 parts by mass.

It is preferable that the lowest excited triplet state of the host material has energy level ($T_1$) equivalent to or higher than $T_1$ of the above-described phosphorescent transition metal complex, since the light emitting device is excellent in light emission efficiency.

It is preferable that the host material is one showing solubility in a solvent which is capable of dissolving the above-described phosphorescent transition metal complex, since the light emitting device can be fabricated by a solution application process.

The host material is classified into low molecular weight compounds and polymer compounds.

The low molecular weight compound used for the host material includes compounds having a carbazole skeleton, compounds having a triarylamine skeleton, compounds having a phenanthroline skeleton, compounds having a triaryltriazine skeleton, compounds having an azole skeleton, compounds having a benzothiophene skeleton, compounds having a benzofuran skeleton, compounds having a fluorene skeleton, compounds having a spirofluorene skeleton, and the like. Examples of the low molecular weight compound used in the host material are compounds represented by the following formulae.

[Chemical Formula 75]

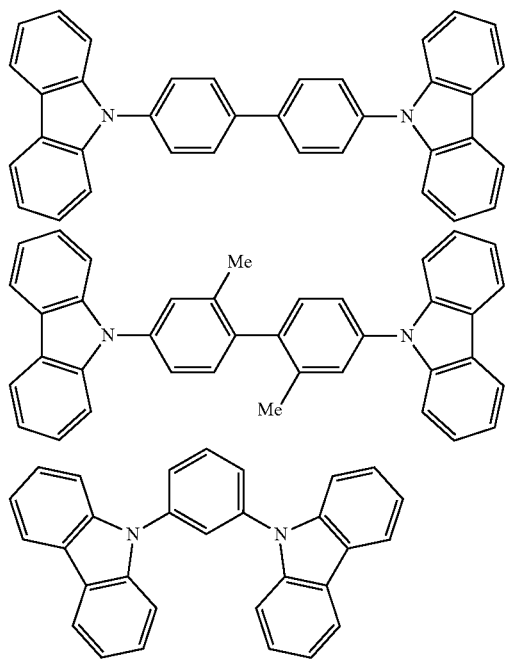

-continued

[Chemical Formula 76]

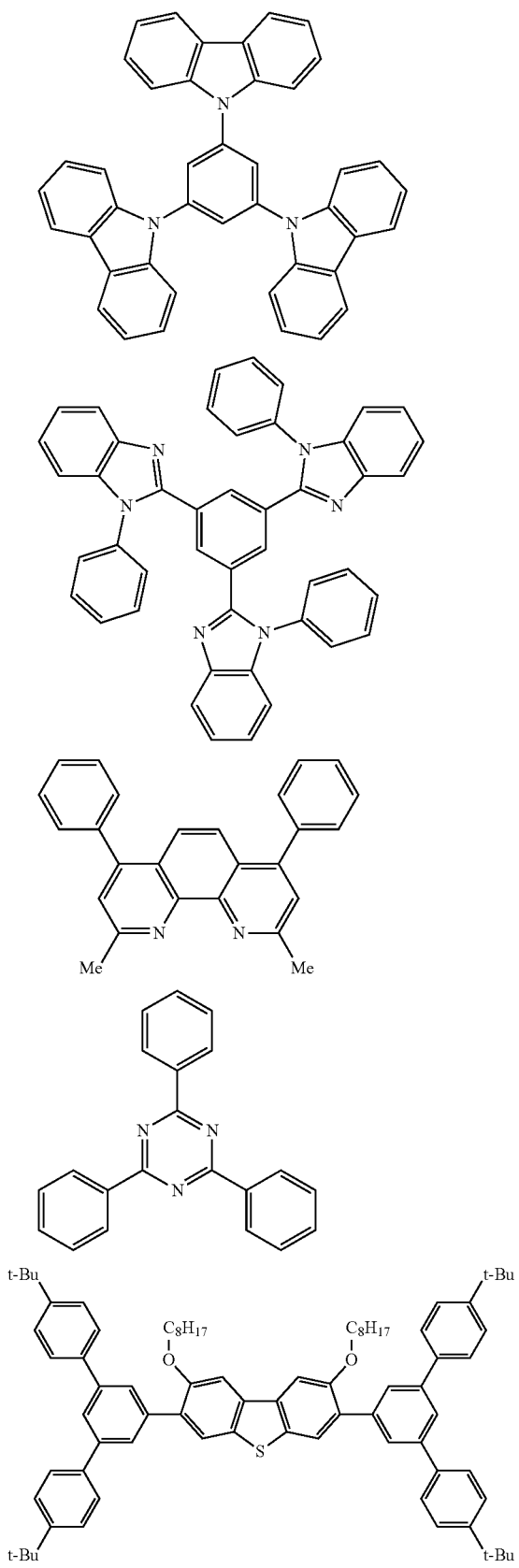

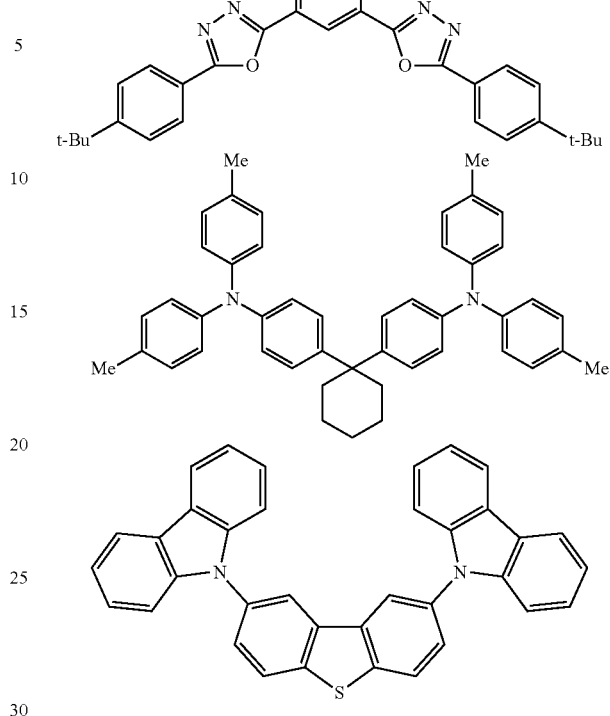

The polymer compound used as the host material (hereinafter, referred to as "polymer host") is preferably a polymer compound containing a constitutional unit represented by the above-described formula (Y).

The definition, examples and preferable ranges of the constitutional unit represented by the formula (Y) which the polymer host may contain are the same as the definition, examples and preferable ranges of the constitutional unit represented by the formula (Y) which the above-described cross-linkable group-containing polymer compound of first organic layer may contain.

The content of the constitutional unit represented by the formula (Y) in which $Ar^{Y1}$ is an arylene group is preferably 0.5 to 90% by mol, more preferably 30 to 87% by mol, and further preferably 50 to 85% by mol, with respect to the total amount of constitutional units contained in the polymer host, since the light emitting device according to the present embodiment is more excellent in light emission efficiency.

The content of the constitutional unit represented by the formula (Y) in which $Ar^{Y1}$ is a divalent hetero ring group, or a divalent group in which an arylene group and a divalent hetero ring group are bonded directly is preferably 0.5 to 40% by mol, more preferably 3 to 30% by mol, and further preferably 5 to 20% by mol, with respect to the total amount of constitutional units contained in the polymer host, since the light emitting device according to the present embodiment is excellent in charge transportability.

The constitutional unit represented by the formula (Y) may be contained singly or in combination of two or more in the polymer host.

It is preferable that the polymer host further contains a constitutional unit represented by the formula (X), since its hole transportability is excellent.

The definitions, examples, preferable ranges, contents and the like of the constitutional unit represented by the formula (X) which the polymer host may contain are the same as the definitions, examples, preferable ranges, contents and the like of the constitutional unit represented by the formula (X) which the above-described cross-linkable group-containing polymer compound of first organic layer may contain.

In the polymer host, the constitutional unit represented by the formula (X) may be contained singly or in combination of two or more.

The polymer host includes, for example, a polymer compound P-9 to a compound P-14 in Table 2.

TABLE 2

| Polymer compound | Constitutional unit and its molar ratio | | | | |
|---|---|---|---|---|---|
| | Formula (Y) | | | Formula (X) | |
| | Formulae (Y-1) to (Y-3) p | Formulae (Y-4) to (Y-7) q | Formulae (Y-8) to (Y-10) r | Formulae (X-1) to (X-7) s | other t |
| P-9 | 0.1 to 99.9 | 0.1 to 99.9 | 0 | 0 | 0 to 30 |
| P-10 | 0.1 to 99.9 | 0 | 0.1 to 99.9 | 0 | 0 to 30 |
| P-11 | 0.1 to 99.8 | 0.1 to 99.8 | 0 | 0.1 to 99.8 | 0 to 30 |
| P-12 | 0.1 to 99.8 | 0.1 to 99.8 | 0.1 to 99.8 | 0 | 0 to 30 |
| P-13 | 0.1 to 99.8 | 0 | 0.1 to 99.8 | 0.1 to 99.8 | 0 to 30 |
| P-14 | 0.1 to 99.7 | 0.1 to 99.7 | 0.1 to 99.7 | 0.1 to 99.7 | 0 to 30 |

[in the table, p, q, r, s and t represent the molar ratio of each constitutional unit. p+q+r+s+t=100 and 100≥p+q+r+s≥70. Other constitutional unit denotes a constitutional unit other than the constitutional unit represented by the formula (Y) and the constitutional unit represented by the formula (X).]

The polymer host may be any of a block copolymer, a random copolymer, an alternating copolymer and a graft copolymer, and may also be another form, and a copolymer obtained by copolymerizing multiple kinds of raw material monomers is preferred.

[Production Method of Polymer Host]

The polymer host in the first organic layer can be produced by the same method as the production method of the cross-linkable group-containing polymer compound of first organic layer described above.

[First Composition]

The first organic layer may be a layer containing a composition comprising a compound having a cross-linkable group, a phosphorescent transition metal complex, and at least one selected from the group consisting of a host material, a hole transporting material, a hole injection material, an electron transporting material, an electron injection material, a phosphorescent compound and an antioxidant described above (hereinafter, referred to also as "first composition"). The ratio of the compound having a cross-linkable group contained in the first composition is 2 to 10% by mass, with respect to the total mass of the first composition.

[Hole Transporting Material]

The hole transporting material is classified into low molecular weight compounds and polymer compounds, and polymer compounds are preferable. The hole transporting material may have a cross-linkable group.

The polymer compound includes, for example, polyvinylcarbazole and derivatives thereof; and polyarylnene having an aromatic amine structure in the side chain or main chain and derivatives thereof. The polymer compound may be a compound to which an electron accepting site is bonded. The electron accepting site includes, for example, fullerene, tetrafluorotetracyanoquinodimethane, tetracyanoethylene, trinitrofluorenone and the like. The electron accepting site is preferably fullerene.

In the first composition, the compounding amount of the hole transporting material is usually 1 to 400 parts by mass, and preferably 5 to 150 parts by mass, when the sum of the compound having a cross-linkable group and the phosphorescent transition metal complex is taken as 100 parts by mass.

The hole transporting material may be used singly or in combination of two or more.

[Electron Transporting Material]

The electron transporting material is classified into low molecular weight compounds and polymer compounds. The electron transporting material may have a cross-linkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylenes, polyfluorenes, and derivatives thereof. The polymer compound may be doped with a metal.

In the first composition, the compounding amount of the electron transporting material is usually 1 to 400 parts by mass, and preferably 5 to 150 parts by mass, when the sum of the compound having a cross-linkable group and the phosphorescent transition metal complex is taken as 100 parts by mass.

The electron transporting material may be used singly or in combination of two or more.

[Hole Injection Material and Electron Injection Material]

The hole injection material and the electron injection material are each classified into low molecular weight compounds and polymer compounds. The hole injection material and the electron injection material may have a cross-linkable group.

The low molecular weight compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes electrically conductive polymers such as, for example, polyaniline, polythiophene, polypyrrole, polyphenylenevinylene, polythienylenevinylene, polyquinoline and polyquinoxaline, and derivatives thereof; a polymer containing an aromatic amine structure in the main chain or side chain, and the like.

In the first composition, the compounding amounts of the hole injection material and the electron injection material are each usually 1 to 400 parts by mass, and preferably 5 to 150 parts by mass when the sum of the compound having a cross-linkable group and the phosphorescent transition metal complex is taken as 100 parts by mass.

The electron injection material and the hole injection material each may be used singly or in combination of two or more.

[Ion Doping]

When the hole injection material or the electron injection material contains an electrically conductive polymer, the electric conductivity of the electrically conductive polymer is preferably 1×10⁻⁵ S/cm to 1×10³ S/cm. For adjusting the electric conductivity of the electrically conductive polymer within such a range, the electrically conductive polymer can be doped with an appropriate amount of ions.

The kind of the ion to be doped is an anion for the hole injection material and a cation for the electron injection material. The anion includes, for example, a polystyrene-sulfonic ion, an alkylbenzenesulfonic ion and a camphor sulfonic ion. The cation includes, for example, a lithium ion, a sodium ion, a potassium ion and a tetrabutylammonium ion.

The ions to be doped may be used singly or in combination of two or more.

[Phosphorescent Compound]

The phosphorescent compound is classified into low molecular weight compounds and polymer compounds. The phosphorescent compound may have a cross-linkable group.

The low molecular weight compound includes, for example, naphthalene and derivatives thereof, anthracene and derivatives thereof, and perylene and derivatives thereof.

The polymer compound includes polymer compounds containing, for example, a phenylene group, a naphthalenediyl group, an anthracenediyl group, a fluorenediyl group, a phenanthrenediyl group, a dihydro-phenanthrenediyl group, a group represented by the formula (X) described above, a carbazolediyl group, a phenoxazinediyl group, a phenothiazinediyl group, a pyrenediyl group and the like.

In the first composition, the compounding amount of the phosphorescent compound is usually 0.1 to 400 parts by mass, and preferably 5 to 150 parts by mass when the sum of the compound having a cross-linkable group and the phosphorescent transition metal complex is taken as 100 parts by mass.

The phosphorescent compound may be used singly or in combination of two or more.

[Antioxidant]

The antioxidant may be a compound which is soluble in the same solvent as for the compound having a cross-linkable group and the phosphorescent transition metal complex and does not inhibit light emission and charge transportation. For example, the antioxidant includes phenol type antioxidants and phosphorus-based antioxidants.

In the first composition, the compounding amount of the antioxidant is usually 0.001 to 10 parts by mass, when the sum of the compound having a cross-linkable group and the phosphorescent transition metal complex is taken as 100 parts by mass.

The antioxidant may be used singly or in combination of two or more.

[First Ink]

The composition containing the compound having a cross-linkable group, the phosphorescent transition metal complex and a solvent (hereinafter, referred to also as "first ink") can be suitably used for application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method, a nozzle coat method and the like.

The viscosity of the ink may be adjusted according to the type of the application method, and when applied to printing methods in which a solution passes through a discharge device such as an inkjet printing method and the like, the viscosity is preferably 1 to 20 mPa·s at 25° C. since clogging and flight deflection during discharge scarcely occur.

The solvent contained in the first ink is preferably a solvent capable of dissolving or uniformly dispersing solid components in the ink. The solvent includes, for example, chlorine-based solvents such as 1,2-dichloroethane, 1,1,2-trichloroethane, chlorobenzene, o-dichlorobenzene and the like; ether solvents such as tetrahydrofuran, dioxane, anisole, 4-methylanisole and the like; aromatic hydrocarbon solvents such as toluene, xylene, mesitylene, ethylbenzene, n-hexylbenzene, cyclohexylbenzene and the like; aliphatic hydrocarbon solvents such as cyclohexane, methylcyclohexane, n-pentane, n-hexane, n-heptane, n-octane, n-nonane, n-decane, n-dodecane, bicyclohexyl and the like; ketone solvents such as acetone, methyl ethyl ketone, cyclohexanone, acetophenone and the like; ester solvents such as ethyl acetate, butyl acetate, ethylcellosolve acetate, methyl benzoate, phenyl acetate and the like; polyhydric alcohol solvents such as ethylene glycol, glycerin, 1,2-hexanediol and the like; alcohol solvents such as isopropyl alcohol, cyclohexanol and the like; sulfoxide solvents such as dimethyl sulfoxide and the like; and amide solvents such as N-methyl-2-pyrrolidone, N,N-dimethylformamide and the like. The solvent may be used singly or in combination of two or more.

In the first ink, the compounding amount of the solvent is usually 1000 to 100000 parts by mass, and preferably 2000 to 20000 parts by mass, when the sum of the compound having crosslinkability, the phosphorescent transition metal complex and the host material is taken as 100 parts by mass.

[Second Organic Layer]

The second organic layer of the present invention is a layer containing a crosslinked body of the compound having a cross-linkable group which is the same as the above-described compound having a cross-linkable group contained in the above-described first organic layer (hereinafter, referred to also as "crosslinked body of compound of second organic layer").

The crosslinked body of compound of second organic layer is obtained by bringing a compound having a cross-linkable group which is the same as the above-described compound having a cross-linkable group into crosslinked state by the above-described methods, conditions and the like.

[Second Composition]

The second organic layer may be a layer containing a composition comprising the crosslinked body of compound of second organic layer, and at least one material selected from the group consisting of a hole transporting material (different from the crosslinked body of compound of second organic layer), a hole injection material, an electron transporting material, an electron injection material, a light emitting material and an antioxidant (hereinafter, referred to also as "second composition").

The examples and preferable ranges of the hole transporting material, the electron transporting material, the hole injection material, the electron injection material and the light emitting material contained in the second composition are the same as the examples and preferable ranges of the hole transporting material, the electron transporting material, the hole injection material, the electron injection material and the light emitting material contained in the first composition. In the second composition, the compounding amounts of the hole transporting material, the electron transporting material, the hole injection material, the electron injection material and the light emitting material are each usually 1 to 400 parts by mass, and preferably 5 to 150 parts by mass, when the amount of the crosslinked body of compound of second organic layer is taken as 100 parts by mass.

The examples and preferable ranges of the antioxidant contained in the second composition are the same as the examples and preferable ranges of the antioxidant contained in the first composition. In the second composition, the compounding amount of the antioxidant is usually 0.001 to 10 parts by mass, when the amount of the crosslinked body of compound of second organic layer is taken as 100 parts by mass.

The method for determining whether the component contained in the second organic layer before cross-linking and the compound having a cross-linkable group contained in the first organic layer are identical includes the following method. First, the second organic layer is formed on an anode by a wet method, and the second organic layer before the crosslinking reaction is dissolved and separated in a solvent such as toluene, xylene, chloroform, tetrahydrofuran or the like without performing the crosslinking reaction. The separated second organic layer before the crosslinking reaction is analyzed by nuclear magnetic resonance spectroscopy or mass spectrometry, to identify that it is the same compound as the compound having a cross-linkable group contained in the first organic layer.

[Second Ink]

The composition containing the compound of second organic layer and a solvent (hereinafter, referred to also as "second ink") can be suitably used for the wet methods explained in the section of the first ink. The preferable range of the viscosity of the second ink is the same as the preferable range of the viscosity of the first ink. The examples and preferable ranges of the solvent contained in the second ink are the same as the examples and preferable ranges of the solvent contained in the first ink.

In the second ink, the compounding amount of the solvent is usually 1000 to 100000 parts by mass, and preferably 2000 to 20000 parts by mass, when the amount of the compound of second organic layer is taken as 100 parts by mass.

<Layer Constitution of Light Emitting Device>

A light emitting device according to one embodiment of the present invention contains an anode, a cathode, a first organic layer and a second organic layer. In one example, a light emitting device 10 shown in FIG. 1 has a structure in which a cathode 1, a first organic layer 2, a second organic layer 3 and an anode 4 are laminated in this order. A light emitting device according to one embodiment of the present invention may have other layers than the anode, the cathode, the first organic layer and the second organic layer.

In a light emitting device according to one embodiment of the present invention, the first organic layer is usually a light emitting layer (hereinafter, referred to as "first light emitting layer").

In a light emitting device according to one embodiment of the present invention, the second organic layer is usually a hole transporting layer, a second light emitting layer or an electron transporting layer. The second organic layer is preferably a hole transporting layer or a second light emitting layer. The second organic layer is preferably a hole transporting layer.

In a light emitting device according to one embodiment of the present invention, it is preferable that the first organic layer and the second organic layer are adjacent, since the light emitting device is more excellent in light emission efficiency.

In a light emitting device according to one embodiment of the present invention, it is preferable that the second organic layer is a layer disposed between an anode and a first organic layer, since the light emitting device is more excellent in light emission efficiency. It is preferable that the second organic layer is a hole transporting layer or a second light emitting layer disposed between an anode and a first organic layer. It is further preferable that the second organic layer is a hole transporting layer disposed between an anode and a first organic layer.

In the first organic layer of a light emitting device according to one embodiment of the present invention, the compound having a cross-linkable group and the phosphorescent transition metal complex each may be contained singly or in combination of two or more. In the second organic layer of a light emitting device according to one embodiment of the present invention, the crosslinked body of compound of second organic layer may be contained singly or in combination of two or more.

In a light emitting device according to one embodiment of the present invention, when the second organic layer is a hole transporting layer disposed between an anode and a first organic layer, it is preferable that a hole injection layer is further provided between an anode and a second organic layer, since the light emitting device is more excellent in light emission efficiency. When the second organic layer is a hole transporting layer disposed between an anode and a first organic layer, it is preferable that at least one of an electron injection layer and an electron transporting layer is further provided between a cathode and a first organic layer, since the light emitting device is more excellent in light emission efficiency.

In a light emitting device according to one embodiment of the present invention, when the second organic layer is a second light emitting layer disposed between an anode and a first organic layer, it is preferable that at least one of a hole injection layer and a hole transporting layer is further provided between an anode and a second organic layer, since the light emitting device is more excellent in light emission efficiency. When the second organic layer is a second light emitting layer disposed between an anode and a first organic layer, it is preferable that at least one of an electron injection layer and an electron transporting layer is further provided between a cathode and a first organic layer, since the light emitting device is more excellent in light emission efficiency.

In a light emitting device according to one embodiment of the present invention, when the second organic layer is a second light emitting layer disposed between a cathode and a first organic layer, it is preferable that at least one of a hole injection layer and a hole transporting layer is further provided between an anode and a first organic layer, since the light emitting device is more excellent in light emission efficiency. When the second organic layer is a second light emitting layer disposed between a cathode and a first organic layer, it is preferable that at least one of an electron injection layer and an electron transporting layer is further provided between a cathode and a second organic layer, since the light emitting device is more excellent in light emission efficiency.

In a light emitting device according to one embodiment of the present invention, when the second organic layer is an electron transporting layer disposed between a cathode and a first organic layer, it is preferable that at least one of a hole injection layer and a hole transporting layer is further provided between an anode and a first organic layer, since the light emitting device is more excellent in light emission efficiency. When the second organic layer is an electron transporting layer disposed between a cathode and a first organic layer, it is preferable that an electron injection layer is further provided between a cathode and a second organic layer, since the light emitting device of the present invention is more excellent in light emission efficiency.

The specific layer constitution of the light emitting device in some embodiments of the present invention includes, for example, layer constitutions represented by (D1) to (D15). The light emitting devices according to some embodiments of the present invention usually have a substrate, and an anode may be first laminated on the substrate, or a cathode may be first laminated on the substrate.

(D1) anode/second light emitting layer (second organic layer)/first light emitting layer (first organic layer)/cathode (D2) anode/hole transporting layer (second organic layer)/first light emitting layer (first organic layer)/cathode (D3) anode/hole injection layer/second light emitting layer (second organic layer)/first light emitting layer (first organic layer)/cathode (D4) anode/hole injection layer/second light emitting layer (second organic layer)/first light emitting layer (first organic layer)/electron transporting layer/cathode (D5) anode/hole injection layer/second light emitting layer (second organic layer)/first light emitting layer (first organic layer)/electron injection layer/cathode (D6) anode/hole injection layer/second light emitting layer (second organic layer)/first light emitting layer (first organic layer)/electron transporting layer/electron injection layer/cathode (D7) anode/hole injection layer/hole transporting layer (second organic layer)/first light emitting layer (first organic layer)/cathode (D8) anode/hole injection layer/hole transporting layer (second organic layer)/first light emitting layer (first organic layer)/electron transporting layer/cathode (D9) anode/hole injection layer/hole transporting layer (second organic layer)/first light emitting layer (first organic layer)/electron injection layer/cathode (D10) anode/hole injection layer/hole transporting layer (second organic layer)/first light emitting layer (first organic layer)/electron transporting layer/electron injection layer/cathode (D11) anode/hole injection layer/hole transporting layer/second light emitting layer (second organic layer)/first light emitting layer (first organic layer)/electron transporting layer/electron injection layer/cathode (D12) anode/hole injection layer/hole transporting layer (second organic layer)/first light emitting layer (first organic layer)/second light emitting layer/electron transporting layer/electron injection layer/cathode (D13) anode/hole injection layer/hole transporting layer/first light emitting layer (first organic layer)/second light emitting layer (second organic layer)/electron transporting layer/electron injection layer/cathode (D14) anode/hole injection layer/hole transporting layer/first light emitting layer (first organic layer)/electron transporting layer (second organic layer)/electron injection layer/cathode (D15) anode/hole injection layer/hole transporting layer (second organic layer)/second light emitting layer/first light emitting layer (first organic layer)/electron transporting layer/electron injection layer/cathode In (D1) to (D15), "/" means that layers before and after are laminated adjacent to each other. Specifically, "second light emitting layer (second organic layer)/first light emitting layer (first organic layer)" means that a second light emitting layer (second organic layer) and a first light emitting layer (first organic layer) are laminated adjacent to each other.

In the light emitting device according to one embodiment of the present invention, two or more layers of the anode, the hole injection layer, the hole transporting layer, the second light emitting layer, the electron transporting layer, the electron injection layer and the cathode may be provided, respectively, as necessary.

When a plurality of anodes, hole injection layers, hole transporting layers, second light emitting layers, electron transporting layers, electron injection layers and cathodes are present, they may be the same or different at each occurrence.

The thicknesses of the anode, the hole injection layer, the hole transporting layer, the first light emitting layer, the second light emitting layer, the electron transporting layer, the electron injection layer and the cathode are each usually 1 nm to 1 µm, preferably 2 nm to 500 nm, and further preferably 5 nm to 150 nm.

In the light emitting device of the present invention, the order, the number and the thickness of layers to be laminated may be adjusted in consideration of the light emission efficiency, driving voltage and device life of the light emitting device.

[Second Light Emitting Layer]

The second light emitting layer is usually a layer containing a second organic layer and a light emitting material, and preferably a layer containing a light emitting material. When the second light emitting layer is a layer containing a light emitting material, the light emitting material contained in the second light emitting layer includes, for example, light emitting materials which the second composition may contain described above. The light emitting material contained in the second light emitting layer may be contained singly or in combination of two or more.

When the light emitting device according to one embodiment of the present invention has a second light emitting layer and when a hole transporting layer described later and an electron transporting layer described later are not a second organic layer, it is preferable that the second light emitting layer is a second organic layer.

[Hole Transporting Layer]

The hole transporting layer is usually a layer containing a second organic layer or a hole transporting material. The hole transporting layer is preferably a second organic layer. When the hole transporting layer is a layer containing a hole transporting material, the hole transporting material includes, for example, hole transporting materials which the first composition may contain described above. The hole transporting material contained in the hole transporting layer may be contained singly or in combination of two or more.

When the light emitting device according to one embodiment of the present invention has a hole transporting layer and when a second light emitting layer described above and an electron transporting layer described later are not a second organic layer, it is preferable that the hole transporting layer is a second organic layer.

[Electron Transporting Layer]

The electron transporting layer is usually a layer containing a second organic layer or an electron transporting material. The electron transporting layer is preferably a layer containing an electron transporting material. When the electron transporting layer is a layer containing an electron transporting material, the electron transporting material contained in the electron transporting layer includes, for example, electron transporting materials which the first composition may contain described above. The electron transporting material contained in the electron transporting layer may be contained singly or in combination of two or more.

When the light emitting device according to one embodiment of the present invention has an electron transporting layer and when a second light emitting layer described above and a hole transporting layer described above are not a second organic layer, it is preferable that the electron transporting layer is a second organic layer.

[Hole Injection Layer and Electron Injection Layer]

The hole injection layer is a layer containing a hole injection material. The hole injection material contained in the hole injection layer includes, for example, hole injection materials which the first composition may contain described above. The hole injection material contained in the hole injection layer may be contained singly or in combination of two or more.

The electron injection layer is a layer containing an electron injection material. The electron injection material contained in the electron injection layer includes, for example, electron injection materials which the first composition may contain described above. The electron injection material contained in the electron injection layer may be contained singly or in combination of two or more.

[Substrate/Electrode]

The substrate in the light emitting device may advantageously be a substrate on which an electrode can be formed and which does not change chemically in forming an organic layer. The substrate in the light emitting device is, for example, a substrate made of a material such as glass, plastic, silicon and the like. When an opaque substrate is used, it is preferable that the electrode farthest from the substrate is transparent or semi-transparent.

The material of the anode includes, for example, electrically conductive metal oxides and semi-transparent metals. The material of the anode preferably includes indium oxide, zinc oxide, tin oxide; electrically conductive compounds such as indium-tin-oxide (ITO), indium-zinc-oxide and the like; argentine-palladium-copper (APC) complex; gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of one or more of them and one or more of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

In the light emitting device according to one embodiment of the present invention, at least one of the anode and the cathode is usually transparent or semi-transparent, and it is preferable that the anode is transparent or semi-transparent.

The method for forming the anode and the cathode includes, for example, a vacuum vapor deposition method, a sputtering method, an ion plating method, a plating method and a lamination method.

[Production Method of Light Emitting Device]

The method for forming each of the first light emitting layer, the second light emitting layer, the hole transporting layer, the electron transporting layer, the hole injection layer, the electron injection layer and the like in the light emitting device according to one embodiment of the present invention includes, for example, a method of vacuum vapor deposition from a powder and a method of forming a film from a solution or melted state, when a low molecular weight compound is used. When a polymer compound is used, for example, a method of forming a film from a solution or melted state is mentioned.

The first light emitting layer, the second light emitting layer, the hole transporting layer, the electron transporting layer, the hole injection layer and the electron injection layer can be formed by application methods such as a spin coat method, an inkjet printing method and the like using the first ink, the second ink, and inks containing the light emitting material, the hole transporting material, the electron transporting material, the hole injection material and the electron injection material described above, respectively.

The light emitting device production method according to one embodiment of the present invention is a method for producing a light emitting device comprising a cathode, a first organic layer containing a compound having a cross-linkable group and a phosphorescent transition metal complex, a second organic layer containing a crosslinked body of the same compound as the above-described compound having a cross-linkable group, and an anode in this order, wherein the ratio of the above-described compound having a cross-linkable group contained in the above-described first organic layer is 2 to 10% by mass with respect to the total mass of the above-described first organic layer, in which the above-described first organic layer and the above-described second organic layer are formed by an application method.

[Application of Light Emitting Device]

The light emitting device of the present invention is useful, for example, for display and illumination.

EXAMPLES

The present invention will be illustrated further in detail by examples below, but the present is not limited to these examples.

In the examples, the polystyrene-equivalent number-average molecular weight (Mn) and the polystyrene-equivalent weight-average molecular weight (Mw) of a polymer compound were determined by size exclusion chromatography (SEC) using tetrahydrofuran as the mobile phase. Each measurement conditions of SEC are as described below.

The polymer compound to be measured was dissolved at a concentration of about 0.05% by mass in tetrahydrofuran, and 10 µL of the solution was injected into SEC. The mobile phase was flowed at a flow rate of 2.0 ml/min. As the column, PLgel MIXED-B (manufactured by Polymer Laboratories, Ltd.) was used. As the detector, an UV-VIS detector (manufactured by Shimadzu Corp., trade name: SPD-10Avp) was used.

<Synthesis Example P-1> Synthesis of Polymer Compound P-1 to P-2

A polymer compound P-1 was synthesized according to a method described in JP-A No. 2011-105701.

A polymer compound P-2 was synthesized according to a method described in International Publication WO2009/157430.

[Chemical Formula 77]

P-1-1
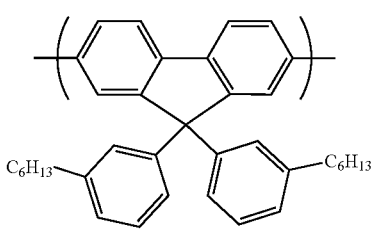

P-1-2
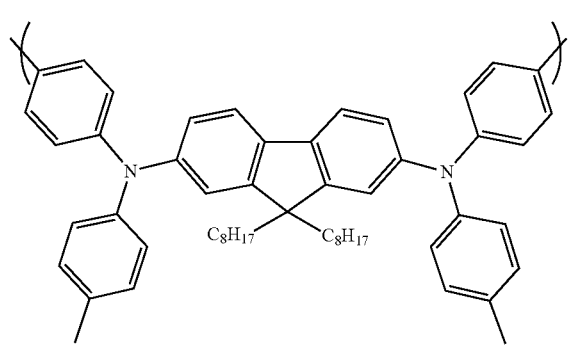

P-1-3
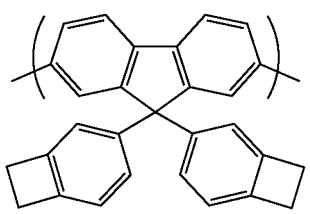

(P-1-1):(P-1-2):(P-1-3) = 50:42.5:7.5

[Chemical Formula 78]

P-2-1
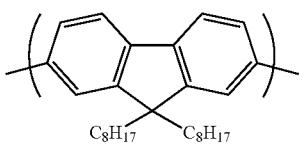

P-2-2
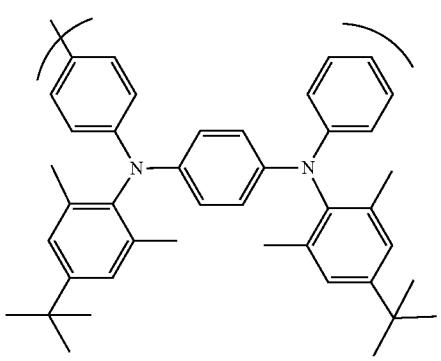

P-2-3
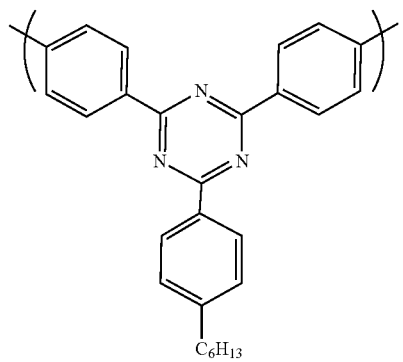

(P-2-1):(P-2-2):(P-2-3) = 85:5:20

<Synthesis Example M1> Synthesis of Metal Complex M1

A metal complex M1 was synthesized according to a method described in JP-A No. 2011-105701.

[Chemical Formula 79]

M1
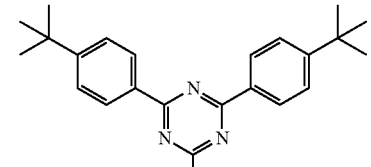
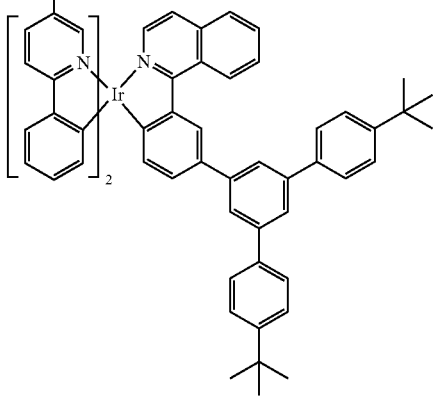

<Comparative Example 1> Fabrication and Evaluation of Light Emitting Device CD1

(Formation of Anode and Hole Injection Layer)

An ITO film was attached with a thickness of 45 nm to a glass substrate by a sputtering method, to form an anode. On the above-described anode, a solution of poly(ethylenedioxythiophene)/polystyrenesulfonic acid (manufactured by H. C. Starck, trade name: CLEVIOS P AI4083) was spin-coated to form a film with a thickness of 65 nm, and the film was heated on a hot plate at 200° C. for 10 minutes under an air atmosphere, to form a hole injection layer.

(Formation of Second Organic Layer)

The polymer compound P-1 was dissolved in xylene to prepare a 0.6% by mass xylene solution (hereinafter, referred to as "composition P"). The composition P was spin-coated on the hole injection layer, to form a film with a thickness of 20 nm, and the film was heated on a hot plate at 180° C. for 60 minutes under a nitrogen gas atmosphere, to form a second organic layer. By this heating, the polymer compound P-1 became a crosslinked body.
(Formation of First Organic Layer)

A 1.6%, by mass xylene solution of a mixture of the polymer compound P-2 (92.5 parts by mass) and the metal complex M1 (7.5 parts by mass) was prepared (hereinafter, referred to as "composition M"). The composition M was spin-coated on the second organic layer, to form a film with a thickness of 80 nm, and the film was heated at 130° C. for 10 minutes under a nitrogen gas atmosphere, to form a first organic layer.
(Formation of Cathode)

The substrate carrying the first organic layer formed thereon was placed in a vapor deposition machine, and the internal pressure was reduced to $1.0 \times 10^{-4}$ Pa or less, then, as the cathode, barium was vapor-deposited with a thickness of about 2 nm on the first organic layer, then, aluminum was vapor-deposited with a thickness of about 80 nm on this. After vapor deposition, sealing was performed using a glass substrate, to fabricate a light emitting device D1.
(Evaluation of Light Emitting Device)

Voltage was applied to the light emitting device CD1, to observe red EL light emission having a peak at 615 nm. The maximum light emission efficiency of the light emitting device CD1 is taken as 100%.

<Comparative Example 2> Fabrication and Evaluation of Light Emitting Device CD2

A 1.6%, by mass xylene solution of the polymer compound P-1 (hereinafter, referred to as "composition N") was prepared, and the light emitting device CD2 was fabricated in the same manner as in Comparative Example 1, except that the composition M and the composition N (composition M/composition N=80% by mass/20% by mass) were used instead of the composition M in (Formation of first organic layer) in Comparative Example 1. In the light emitting device CD2, the polymer compound P-1 contained in the first organic layer was a non-crosslinked body.

Voltage was applied to the light emitting device CD2, to observe red EL light emission having a peak at 615 nm. When the maximum light emission efficiency of the light emitting device CD1 was taken as 100%, the maximum light emission efficiency of the light emitting device CD2 was 89's.

<Example 1> Fabrication and Evaluation of Light Emitting Device D1

The light emitting device D1 was fabricated in the same manner as in Comparative Example 1, except that the composition M and the composition N (composition M/composition N=98% by mass/2% by mass) were used instead of the composition M in (Formation of first organic layer) in Comparative Example 1. In the light emitting device D1, the polymer compound P-1 contained in the first organic layer was a non-crosslinked body.

Voltage was applied to the light emitting device D1, to observe red EL light emission having a peak at 615 nm. When the maximum light emission efficiency of the light emitting device CD1 was taken as 100%, the maximum light emission efficiency of the light emitting device D1 was 109%.

<Example 2> Fabrication and Evaluation of Light Emitting Device D2

The light emitting device D2 was fabricated in the same manner as in Comparative Example 1, except that the composition M and the composition N (composition M/composition N=94% by mass/6% by mass) were used instead of the composition M in (Formation of first organic layer) in Comparative Example 1. In the light emitting device D2, the polymer compound P-1 contained in the first organic layer was a non-crosslinked body.

Voltage was applied to the light emitting device D2, to observe red EL light emission having a peak at 615 nm. When the maximum light emission efficiency of the light emitting device CD1 was taken as 100%, the maximum light emission efficiency of the light emitting device D2 was 106%.

<Example 3> Fabrication and Evaluation of Light Emitting Device D3

The light emitting device D3 was fabricated in the same manner as in Comparative Example 1, except that the composition M and the composition N (composition M/composition N=92% by mass/8% by mass) were used instead of the composition M in (Formation of first organic layer) in Comparative Example 1. In the light emitting device D3, the polymer compound P-1 contained in the first organic layer was a non-crosslinked body.

Voltage was applied to the light emitting device D3, to observe red EL light emission having a peak at 615 nm. When the maximum light emission efficiency of the light emitting device CD1 was taken as 100%, the maximum light emission efficiency of the light emitting device D3 was 106%.

<Example 4> Fabrication and Evaluation of Light Emitting Device D4

The light emitting device D3 was fabricated in the same manner as in Comparative Example 1, except that the composition M and the composition N (composition M/composition N=90% by mass/10% by mass) were used instead of the composition M in (Formation of first organic layer) in Comparative Example 1. In the light emitting device D4, the polymer compound P-1 contained in the first organic layer was a non-crosslinked body.

Voltage was applied to the light emitting device D4, to observe red EL light emission having a peak at 615 nm. When the maximum light emission efficiency of the light emitting device CD1 was taken as 100%, the maximum light emission efficiency of the light emitting device D4 was 105%.

Table 3 shows the maximum light emission efficiency of the light emitting devices D1 to D4 and CD2 in terms of the relative value when the maximum light emission efficiency of the light emitting device CD1 is taken as 100%.

TABLE 3

| | Light emitting device | First organic layer | Maximum light emission efficiency (relative value with respect to light emitting device CD1) |
|---|---|---|---|
| Comparative Example 1 | CD1 | Composition M = 100% by mass | 100% |
| Comparative Example 2 | CD2 | Composition M/composition N = 80% by mass/20% by mass | 89% |
| Example 1 | D1 | Composition M/composition N = 98% by mass/2% by mass | 109% |
| Example 2 | D2 | Composition M/composition N = 96% by mass/4% by mass | 106% |
| Example 3 | D3 | Composition M/composition N = 92% by mass/8% by mass | 106% |
| Example 4 | D4 | Composition M/composition N = 90% by mass/10% by mass | 105% |

INDUSTRIAL APPLICABILITY

According to the present invention, it is possible to provide a light emitting device excellent in light emission efficiency.

EXPLANATION OF MARKS

1: cathode
2: first organic layer
3: second organic layer
4: anode
10: light emitting device

The invention claimed is:

1. A light emitting device comprising a cathode, a first organic layer containing a compound having a cross-linkable group and a phosphorescent transition metal complex, a second organic layer containing a crosslinked body of the same compound as said compound having a cross-linkable group, and an anode in this order, wherein the ratio of said compound having a cross-linkable group contained in said first organic layer is 2 to 10% by mass with respect to the total mass of said first organic layer.

2. The light emitting device according to claim 1, wherein said compound having a cross-linkable group is a compound having at least one cross-linkable group selected from Group of cross-linkable group consisting of the formula (XL-1) to the formula (XL-19):

[Chemical Formula 1]

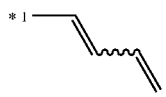
(XL-1)

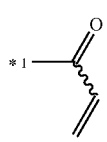
(XL-2)

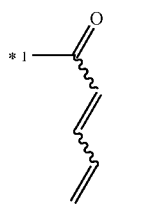
(XL-3)

(XL-4)

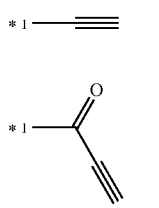
(XL-5)

(XL-6)

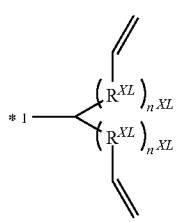
(XL-7)

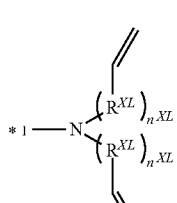
(XL-8)

(XL-9)

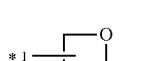
(XL-10)

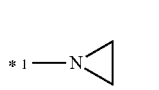
(XL-11)

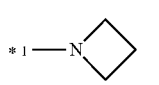
(XL-12)

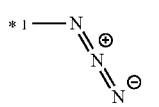
(XL-13)

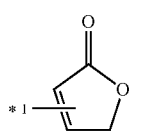
(XL-14)

-continued

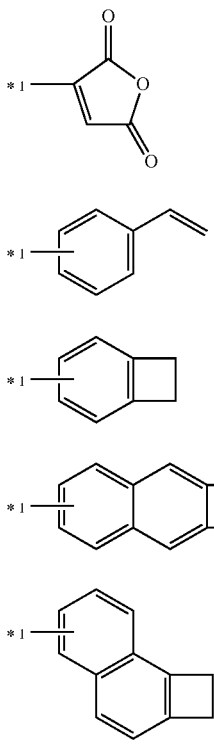

(XI-15)

(XL-16)

(XL-17)

(XL-18)

(XL-19)

in the formula (XL-1) to the formula (XL-19), $R^{XL}$ represents a methylene group, an oxygen atom or a sulfur atom, and $n^{XL}$ represents an integer of 0 to 5, when a plurality of $R^{XL}$ are present, they may be the same or different, when a plurality of $n^{XL}$ are present, they may be the same or different,

*1 represents a binding position, these cross-linkable groups optionally have a substituent, and when a plurality of said substituents are present, the plurality of the substituents may be combined together to form a ring together with carbon atoms to which they are attached.

3. The light emitting device according to claim 2, wherein said compound having a cross-linkable group is a polymer compound having a constitutional unit represented by the formula (1) or the formula (1'):

[Chemical Formula 2]

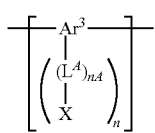

(1)

in the formula (1), nA represents an integer of 0 to 5, and n represents 1 or 2, when a plurality of nA are present, they may be the same or different, $Ar^3$ represents an aromatic hydrocarbon group or a hetero ring group, and these groups optionally have a substituent, $L^A$ represents an alkylene group, a cycloalkylene group, an arylene group, a divalent hetero ring group, a group represented by —NR'—, an oxygen atom or a sulfur atom, and these groups other than an oxygen atom and a sulfur atom optionally have a substituent, R' represents a hydrogen atom, an alkyl group, a cycloalkyl group, an aryl group or a monovalent hetero ring group, and these groups other than a hydrogen atom optionally have a substituent, when a plurality of $L^A$ are present, they may be the same or different, X represents a cross-linkable group selected from said Group of cross-linkable group, when a plurality of X are present, they may be the same or different,

[Chemical Formula 3]

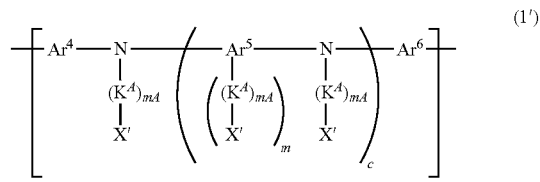

(1')

in the formula (1'), mA represents an integer of 0 to 5, m represents an integer of 1 to 4, and c represents an integer of 0 or 1, when a plurality of mA are present, they may be the same or different, $Ar^5$ represents an aromatic hydrocarbon group, a hetero ring group, or a group in which an aromatic hydrocarbon ring and a hetero ring are bonded directly, and these groups optionally have a substituent, $Ar^4$ and $Ar^6$ each independently represent an arylene group or a divalent hetero ring group, and these groups optionally have a substituent, $Ar^4$, $Ar^5$ and $Ar^6$ each may be bonded directly or via an oxygen atom or a sulfur atom to a group other than said groups, bonded to a nitrogen atom to which said groups are attached, to form a ring, $K^A$ represents an alkylene group, a cycloalkylene group, an arylene group, a divalent hetero ring group, a group represented by —NR"—, an oxygen atom or a sulfur atom, and these groups other than an oxygen atom and a sulfur atom optionally have a substituent, R" represents a hydrogen atom, an alkyl group, a cycloalkyl group, an aryl group or a monovalent hetero ring group, and these groups other than a hydrogen atom optionally have a substituent, when a plurality of $K^A$ are present, they may be the same or different, X' represents a cross-linkable group selected from said Group of cross-linkable group, a hydrogen atom, an alkyl group, a cycloalkyl group, an aryl group or a monovalent hetero ring group, and these groups other than a hydrogen atom optionally have a substituent, and at least one X' is a cross-linkable group selected from said Group of cross-linkable group.

4. The light emitting device according to claim 1, wherein said phosphorescent transition metal complex is a metal complex represented by the formula (1-A):

[Chemical Formula 4]

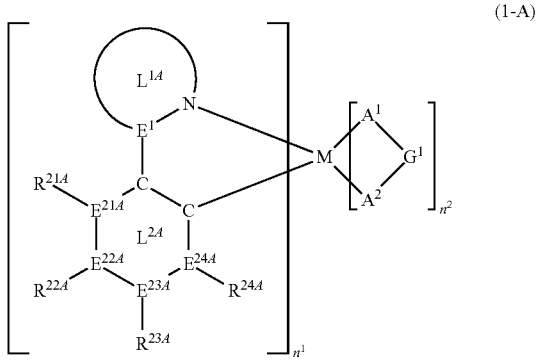

(1-A)

in the formula (1-A), M represents a ruthenium atom, a rhodium atom, a palladium atom, an iridium atom or a platinum atom,
- $n^1$ represents an integer of 1 or more, and $n^2$ represents an integer of 0 or more, $n^1+n^2$ is 3 when M is a ruthenium atom, a rhodium atom or an iridium atom, while $n^1+n^2$ is 2 when M is a palladium atom or a platinum atom,
- $E^1$ represents a carbon atom or a nitrogen atom, when a plurality of $E^1$ are present, they may be the same or different,
- Ring $L^{1A}$ represents a pyridine ring, a diazabenzene ring, an azanaphthalene ring, a diazanaphthalene ring, a triazole ring or a diazole ring, and these rings optionally have a substituent, when a plurality of said substituents are present, the plurality of the substituents may be combined together to form a ring together with atoms to which they are attached, when a plurality of Ring $L^{1A}$ are present, they may be the same or different,
- $E^{21A}$, $E^{22A}$, $E^{23A}$ and $E^{24A}$ each independently represent a nitrogen atom or a carbon atom, Ring $L^{2A}$ represents a benzene ring, a pyridine ring or a diazabenzene ring, when $E^{21A}$ is a nitrogen atom, $R^{21A}$ is not present, when $E^{22A}$ is a nitrogen atom, $R^{22A}$ is not present, when $E^{23A}$ is a nitrogen atom, $R^{23A}$ is not present, when $E^{24A}$ is a nitrogen atom, $R^{24A}$ is not present, when a plurality of $E^{21A}$, $E^{22A}$, $E^{23A}$ and $E^{24A}$ are present, they may be the same or different at each occurrence,
- $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and these groups other than a hydrogen atom optionally have a substituent, when a plurality of $R^{21A}$, $R^{22A}$, $R^{23A}$ and $R^{24A}$ are present, they may be the same or different at each occurrence, $R^{21A}$ and $R^{22A}$, $R^{22A}$ and $R^{23A}$, $R^{23A}$ and $R^{24A}$, and a substituent which Ring L1A optionally has and $R^{21A}$ each may be combined together to form a ring,
- $A^1$-$G^1$-$A^2$ represents an anionic bidentate ligand, $A^1$ and $A^2$ each independently represent a carbon atom, an oxygen atom or a nitrogen atom, these atoms may be ring-constituent atoms, $G^1$ represents a single bond or an atomic group constituting a bidentate ligand together with $A^1$ and $A^2$, and when a plurality of $A^1$-$G^1$-$A^2$ are present, they may be the same or different.

5. The light emitting device according to claim 4, wherein said metal complex represented by the formula (1-A) is a metal complex represented by the formula (1-B1), the formula (1-B2), the formula (1-B3), the formula (1-B4) or the formula (1-B5):

[Chemical Formula 5]

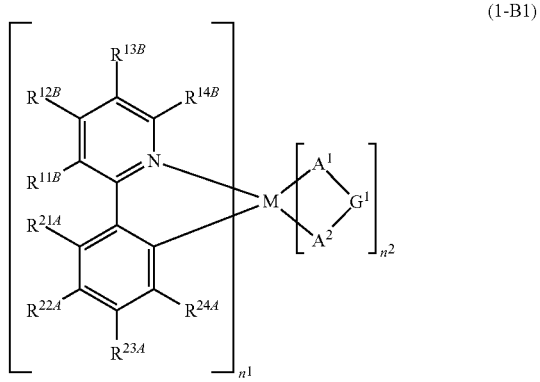

(1-B1)

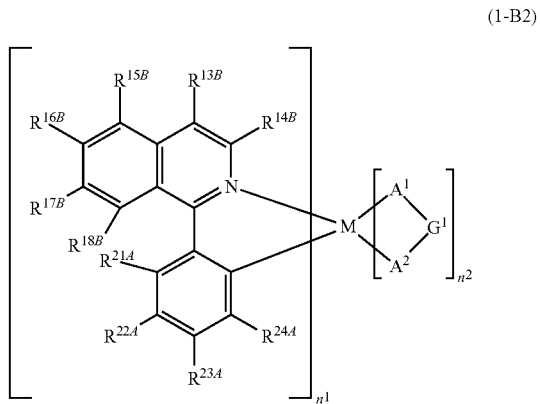

(1-B2)

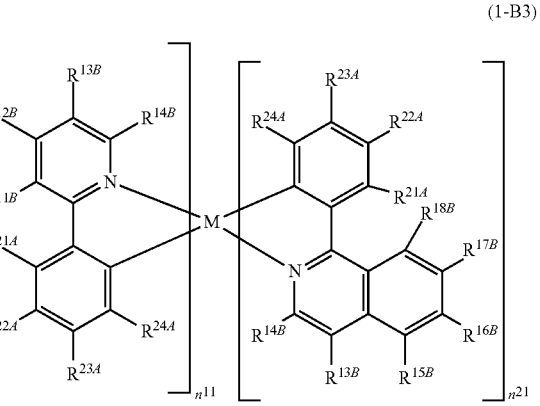

(1-B3)

-continued

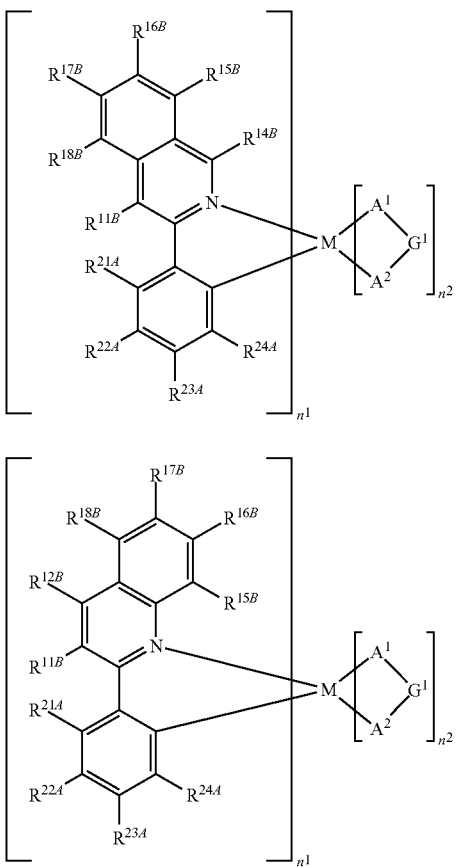

(1-B4)

(1-B5)

in the formula (1-B1) to the formula (1-B5), M, $n^1$, $n^2$, $R^{21A}$, $R^{22A}$, $R^{23A}$, $R^{24A}$ and $A^1$-$G^1$-$A^2$ represent the same meaning as described above, $n^{11}$ and $n^{12}$ each independently represent 1 or 2, $n^{11}+n^{12}$ is 3 when M is a ruthenium atom, a rhodium atom or an iridium atom, while $n^{11}+n^{12}$ is 2 when M is a palladium atom or a platinum atom, $R^{11B}$, $R^{12B}$, $R^{13B}$, $R^{14B}$, $R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent hetero ring group, a substituted amino group or a halogen atom, and these groups other than a hydrogen atom optionally have a substituent, when a plurality of $R^{11B}$, $R^{12B}$, $R^{13B}$, $R^{14B}$, $R^{15B}$, $R^{16B}$, $R^{17B}$ and $R^{18B}$ are present, they may be the same or different at each occurrence, in the formula (1-B1), $R^{11B}$ and $R^{12B}$, $R^{12B}$ and $R^{13B}$, $R^{13B}$ and $R^{14B}$, and $R^{11B}$ and $R^{21A}$ each may be combined together to form a ring, in the formula (1-B2), $R^{13B}$ and $R^{14B}$, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21A}$ each may be combined together to form a ring, in the formula (1-B3), $R^{11B}$ and $R^{12B}$, $R^{12B}$ and $R^{13B}$, $R^{13B}$ and $R^{14B}$, $R^{11B}$ and $R^{21A}$, $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21A}$ each may be combined together to form a ring, in the formula (1-B4), $R^{11B}$ and $R^{18B}$, $R^{14B}$ and $R^{15B}$, $R^{15B}$ and $R^{16B}$, $R^{16B}$ and $R^{17B}$, $R^{17B}$ and $R^{18B}$, and $R^{11B}$ and $R^{21A}$ each may be combined together to form a ring, and in the formula (1-B5), $R^{11B}$ and $R^{12B}$, $R^{12B}$ and $R^{18B}$, $R^{15B}$ and $R^{16B}$, $R^{16B}$ and $R^{17B}$, $R^{17B}$ and $R^{18B}$, and $R^{11B}$ and $R^{21A}$ each may be combined together to form a ring.

6. The light emitting device according to claim 1, wherein said first organic layer and said second organic layer are adjacent.

7. A method for producing a light emitting device comprising a cathode, a first organic layer containing a compound having a cross-linkable group and a phosphorescent transition metal complex, a second organic layer containing a crosslinked body of the same compound as said compound having a cross-linkable group, and an anode in this order, wherein the ratio of said compound having a cross-linkable group contained in said first organic layer is 2 to 10% by mass with respect to the total mass of said first organic layer, wherein said first organic layer and said second organic layer are formed by an application method.

* * * * *